United States Patent
Snaith et al.

(10) Patent No.: US 11,469,338 B2
(45) Date of Patent: Oct. 11, 2022

(54) OPTOELECTRONIC DEVICE

(71) Applicant: OXFORD UNIVERSITY INNOVATION LIMITED, Oxford (GB)

(72) Inventors: Henry James Snaith, Oxford (GB); Edward James William Crossland, Oxford (GB); Andrew Hey, Oxford (GB); James Ball, Oxford (GB); Michael Lee, Oxford (GB); Pablo Docampo, Oxford (GB)

(73) Assignee: OXFORD UNIVERSITY INNOVATION LIMITED, Oxford (GB)

( * ) Notice: Subject to any disclaimer, the term of this patent is extended or adjusted under 35 U.S.C. 154(b) by 0 days.

(21) Appl. No.: 16/910,645

(22) Filed: Jun. 24, 2020

(65) Prior Publication Data
US 2020/0365748 A1    Nov. 19, 2020

Related U.S. Application Data

(63) Continuation of application No. 16/013,451, filed on Jun. 20, 2018, which is a continuation of application (Continued)

(30) Foreign Application Priority Data

Sep. 18, 2012 (GB) ...................................... 1216605
May 24, 2013 (GB) ...................................... 1309409

(51) Int. Cl.
*H01L 31/036* (2006.01)
*C23C 14/06* (2006.01)
(Continued)

(52) U.S. Cl.
CPC ............ *H01L 31/036* (2013.01); *C23C 14/06* (2013.01); *H01L 31/022466* (2013.01);
(Continued)

(58) Field of Classification Search
CPC ............... Y02E 10/542; H01L 31/0687; H01L 31/06875
See application file for complete search history.

(56) References Cited

U.S. PATENT DOCUMENTS 5,550,391 A    8/1996  Yamaguchi
5,721,634 A    2/1998  Rosker
(Continued)

FOREIGN PATENT DOCUMENTS

CN    1280394    1/2001
CN    1908072    2/2007
(Continued)

OTHER PUBLICATIONS

In Chung et al., "All-solid-state dye-sensitized solar cells with high efficiency", Nature, May 2012, vol. 485, pp. 486-490.
(Continued)

*Primary Examiner* — Daniel P Malley, Jr.
(74) *Attorney, Agent, or Firm* — King & Spalding LLP

(57) ABSTRACT

The invention provides an optoelectronic device comprising a photoactive region, which photoactive region comprises: an n-type region comprising at least one n-type layer; a p-type region comprising at least one p-type layer; and, disposed between the n-type region and the p-type region: a layer of a perovskite semiconductor without open porosity. The perovskite semiconductor is generally light-absorbing. In some embodiments, disposed between the n-type region and the p-type region is: (i) a first layer which comprises a scaffold material, which is typically porous, and a perovskite semiconductor, which is typically disposed in pores of the
(Continued)

(a)

(b)

scaffold material; and (ii) a capping layer disposed on said first layer, which capping layer is said layer of a perovskite semiconductor without open porosity, wherein the perovskite semiconductor in the capping layer is in contact with the perovskite semiconductor in the first layer. The layer of the perovskite semiconductor without open porosity (which may be said capping layer) typically forms a planar heterojunction with the n-type region or the p-type region. The invention also provides processes for producing such optoelectronic devices which typically involve solution deposition or vapour deposition of the perovskite. In one embodiment, the process is a low temperature process; for instance, the entire process may be performed at a temperature or temperatures not exceeding 150° C.

26 Claims, 22 Drawing Sheets

Related U.S. Application Data

No. 14/427,930, filed as application No. PCT/GB2013/052425 on Sep. 17, 2013, now Pat. No. 10,069,025.

(51) Int. Cl.
| | |
|---|---|
| *H01L 51/42* | (2006.01) |
| *H01L 31/0224* | (2006.01) |
| *H01L 31/0352* | (2006.01) |
| *H01L 31/0725* | (2012.01) |
| *H01L 31/18* | (2006.01) |
| *H01L 51/00* | (2006.01) |

(52) U.S. Cl.
CPC .. *H01L 31/035272* (2013.01); *H01L 31/0725* (2013.01); *H01L 31/1864* (2013.01); *H01L 31/1884* (2013.01); *H01L 51/0032* (2013.01); *H01L 51/422* (2013.01); *H01L 51/4226* (2013.01); *H01L 51/0026* (2013.01); *H01L 51/0037* (2013.01); *Y02E 10/549* (2013.01)

(56) References Cited

U.S. PATENT DOCUMENTS

| | | | |
|---|---|---|---|
| 5,871,579 A | 2/1999 | Liang et al. | |
| 5,882,548 A | 3/1999 | Liang | |
| 6,097,040 A | 8/2000 | Morimoto et al. | |
| 6,133,063 A | 10/2000 | Speier et al. | |
| 6,150,536 A | 11/2000 | Chondroudis et al. | |
| 6,180,956 B1 | 1/2001 | Chondroudis et al. | |
| 6,281,429 B1 | 8/2001 | Takada et al. | |
| 6,376,765 B1 | 4/2002 | Wariishi et al. | |
| 6,384,321 B1 | 5/2002 | Mikoshiba et al. | |
| 6,429,318 B1 | 8/2002 | Mitzi | |
| 7,045,205 B1 | 5/2006 | Sager | |
| 7,511,298 B2 | 3/2009 | Kawaraya et al. | |
| 8,193,704 B2 | 6/2012 | Takashima et al. | |
| 9,059,418 B2 | 6/2015 | Seok et al. | |
| 10,079,320 B2 | 9/2018 | Snaith et al. | |
| 2003/0010971 A1 | 1/2003 | Zhang | |
| 2003/0170918 A1 | 9/2003 | Dehaven et al. | |
| 2004/0178325 A1 | 9/2004 | Forrest et al. | |
| 2005/0236033 A1 | 10/2005 | Lawandy | |
| 2005/0263182 A1 | 12/2005 | Morooka et al. | |
| 2005/0268962 A1 | 12/2005 | Gaudiana et al. | |
| 2006/0032529 A1 | 2/2006 | Rand et al. | |
| 2006/0162767 A1 | 7/2006 | Mascarenhas et al. | |
| 2007/0007538 A1 | 1/2007 | Ono et al. | |
| 2007/0028961 A1 | 2/2007 | Zhang et al. | |
| 2007/0082227 A1 | 4/2007 | Kobayashi et al. | |
| 2007/0194311 A1 | 8/2007 | Kojima et al. | |
| 2008/0185037 A1 | 8/2008 | Kim et al. | |
| 2008/0202583 A1 | 8/2008 | Lee | |
| 2009/0032097 A1 | 2/2009 | Bigioni et al. | |
| 2009/0160320 A1 | 6/2009 | Borner et al. | |
| 2009/0242027 A1* | 10/2009 | Inoue | H01G 9/2036 |
| | | | 136/257 |
| 2010/0200051 A1 | 8/2010 | Triani et al. | |
| 2010/0213440 A1 | 8/2010 | Shieh et al. | |
| 2010/0282309 A1 | 11/2010 | Pschirer et al. | |
| 2010/0294350 A1 | 11/2010 | Ko et al. | |
| 2011/0011456 A1 | 1/2011 | Han et al. | |
| 2011/0089402 A1 | 4/2011 | Qi | |
| 2011/0121722 A1 | 5/2011 | Takashima et al. | |
| 2011/0226325 A1* | 9/2011 | Morooka | H01G 9/2068 |
| | | | 136/256 |
| 2011/0287939 A1 | 11/2011 | Goyal | |
| 2012/0017976 A1* | 1/2012 | Nechache | H01L 31/078 |
| | | | 136/255 |
| 2012/0048329 A1* | 3/2012 | Manchanda | H01L 31/1804 |
| | | | 136/244 |
| 2012/0091445 A1 | 4/2012 | Jung et al. | |
| 2013/0104969 A1* | 5/2013 | Rappe | H01L 31/03529 |
| | | | 136/255 |
| 2013/0112273 A1 | 5/2013 | Negami et al. | |
| 2013/0233377 A1* | 9/2013 | Kanatzidis | G01N 21/6402 |
| | | | 136/252 |
| 2015/0034150 A1 | 2/2015 | Snaith et al. | |
| 2015/0200377 A1* | 7/2015 | Etgar | H01L 51/005 |
| | | | 136/256 |
| 2015/0228415 A1* | 8/2015 | Seok | H01G 9/2031 |
| | | | 136/256 |

FOREIGN PATENT DOCUMENTS

| | | | |
|---|---|---|---|
| CN | 101802948 | 8/2010 | |
| CN | 101635203 | 9/2011 | |
| CN | 102459506 | 5/2012 | |
| CN | 102468413 | 5/2012 | |
| CN | 102625956 | 8/2012 | |
| EP | 1207556 | 5/2002 | |
| EP | 1 724 838 | 11/2006 | |
| EP | 1724838 A1 * | 11/2006 | H01G 9/2031 |
| EP | 2 898 553 | 11/2018 | |
| GB | 2012/16605 | 9/2012 | |
| GB | 2013/09409 | 5/2013 | |
| JP | H07147428 | 6/1995 | |
| JP | H10316685 | 12/1998 | |
| JP | 1140854 | 2/1999 | |
| JP | 2001055568 | 2/2001 | |
| JP | 2002198551 | 7/2002 | |
| JP | 2002-299063 A | 10/2002 | |
| JP | 2002299063 | 10/2002 | |
| JP | 2003149345 | 5/2003 | |
| JP | 2004 134581 | 4/2004 | |
| JP | 2004134577 A | 4/2004 | |
| JP | 3 542 077 | 7/2004 | |
| JP | 2005093485 | 4/2005 | |
| JP | 2007 031178 | 2/2007 | |
| JP | 2008-189947 | 8/2008 | |
| JP | 2009-006548 A | 1/2009 | |
| JP | 2010 009786 | 1/2010 | |
| JP | 2011 076791 | 4/2011 | |
| JP | 2012060075 A | 3/2012 | |
| JP | 2015-529982 | 10/2015 | |
| JP | 2017193576 | 10/2017 | |
| KR | 10-1172374 | 8/2012 | |
| WO | WO 99/65085 | 12/1999 | |
| WO | WO 02/082864 | 10/2002 | |
| WO | WO 2006/034561 | 4/2006 | |
| WO | WO 2009/066848 | 5/2009 | |
| WO | WO-2009066848 A1 * | 5/2009 | H01L 31/072 |
| WO | WO 2010/118321 | 10/2010 | |
| WO | WO 2010/142947 | 12/2010 | |
| WO | WO 2011 /030117 | 3/2011 | |
| WO | 2011/071738 | 6/2011 | |
| WO | WO 2011 /064601 | 6/2011 | |
| WO | WO 2011/110869 | 9/2011 | |
| WO | WO2012/035833 | 3/2012 | |

(56) References Cited

FOREIGN PATENT DOCUMENTS

| | | |
|---|---|---|
| WO | WO 2012/073010 | 6/2012 |
| WO | WO 2013/126537 | 8/2013 |
| WO | WO 2013/171518 | 11/2013 |
| WO | WO 2013/171520 | 11/2013 |
| WO | WO 2014/042449 | 3/2014 |
| WO | WO 2013/171517 | 11/2014 |

OTHER PUBLICATIONS

Akihiro Kojima et al., "Organometal Halide Perovskites as Visible-Light Sensitizers for Photovoltaic Cells", Journal of the American Chemical Society, 2009, vol. 131, pp. 6050-6051.
Hui-Seon Kim et al., "Lead Iodide Perovskite Sensitized All-Solid-State Submicron Thin Film Mesoscopic Solar Cell with Efficiency Exceeding 9%", Scientific Reports, Aug. 21, 2012, vol. 2, Article No. 591, pp. 1-7.
Michael M. Lee et al., "Efficient Hybrid Solar Cells Based on Meso-Superstructured Organometal Halide Perovskites", Science, Nov. 2, 2012, vol. 338, pp. 643-647.
Australian Examination Report issued in Application No. 2017268594, dated Oct. 11, 2019, pp. 1-5.
Mitzi et al., Synthesis, Resistivity, and Thermal Properties of Cubic Perovskite NH2 CH=NH2 Snb and Related Systems, Journal of Solid State Chemistry, 1997, 376-381, vol. 134, Issue 2, 1997, pp. 376-381.
European Patent Office Communication of Notice of Opposition filed against EP patent No. EP 2898553, Aug. 22, 2019, pp. 1-22.
European patent application No. EP 13766635.0 as filed (as International application No. PCT/GB2013/052425) from which EP2898553 was granted, 140 pages.
Yang et al. entitled "A Heterojunction Based on Well-ordered Organic-Inorganic Hybrid Perovskite and Its Photovoltaic Performance", Acta Chimica Sinica, vol. 69(6), 2011, pp. 627-632.
Machine translation of article Yang et al. entitled "A Heterojunction Based on Well-ordered Organic-Inorganic Hybrid Perovskite and Its Photovoltaic Performance", Acta Chimica Sinica, pp. 1-8.
Machine translation of WO 02/082864 A 1, pp. 1-5.
Zheng et al. entitled Preparation and characterization of a layered perovskite-type organic-inorganic hybrid compound (C8NH6-CH2CH2NH3)2CuCl4, Thin Solid Films, vol. 514, 2006, pp. 127-131.
Xiao et al. entitled "Preparation and characterization of organic-inorganic hybrid 7 perovskite (C4H9NH3)2CuCl4", Material Science & Engineering B, vol. 117, 2005, pp. 313-316.
Wu et al. entitled "Preparation and characterization of a layered perovskite-type organic-inorganic hybrid compound based on (C6H4)2N(CH2)6NH3Cl", Synthetic Metals, vol. 159, 2009, pp. 2425-2429.
Kojima et al. entitled "Organometal Halide Perovskites as Visible-Light Sensitizers for Photovoltaic Cells", Journal of the American Chemical Society, vol. 131, Nr. 17, 2009, pp. 6050-6051.
Kitazawa et al. entitled "Optical Properties of CH3NH3PbX3 (X=halogen) and their mixed-halide crystals", Journal of Materials Science, vol. 37, 2002, pp. 3585-3587.
Rand et al. entitled "Organic Double-Heterostructure Photovoltaic Cells Employing Thick Tris (acetylacetonato) ruthenium (III) Exciton-Blocking-Layers", Advanced Materials, vol. 17, 2005, pp. 2714-2718.
Bernede. entitled "Organic Photovoltaic Cells: History, Principles and Techniques", J. Chil. Chem. Soc., vol. 53, No. 3, 2008, pp. 1549-1564.
J. Nelson entitled "The Physics of Solar Cells", first published 2003 by Imperial College Press, ISBN-13 978-1-86094-340-9, pp. v-xvii, 242-245 and 296-303.
Translation of JP 2002299063, 7 pages.
Office Action Japanese Patent Application No. 2017-240862, dated Jul. 24, 2019, 3 pages.
Translation of Japanese Office Action issued in Patent Application No. 2017-240862, 2 pages.

Korean Office Action issued KR 10-2015-7010081, dated Jul. 30, 2019, pp. 1-10.
Translation of Korean Office Action issued in Patent Application No. KR 10-2015-7010081, 8 pages.
Japanese Office Action issued in Application No. 2017-240862, dated Nov. 16, 2018, 4 pages with English translation 4 pages.
Machine translation of JP2002198551, 9 pages.
Machine translation for JP2005093485, 8 pages.
Japanese Office Action issued in Application No. 2017-140959, dated Jul. 30, 2018, 5 pages with 5 pages of translation.
Lee et al., Pressure-induced phase transitions and templating effect in three-dimensional organic-inorganic hybrid perovskites Physical Review B: Condensed Matter and Materials Physics, 2003, 68(2), pp. 020103/1-020103/4.
Worhatch et al., Study of Local Structure in Selected Organic-Inorganic Perovskites in the Pm3m Phase, Chemistry of Materials, 2008, 20(4), pp. 1272-1277.
Extended European Search Report issued in EP Application l No. 18185861.4 , dated Oct. 4, 2018, 6 pages.
Zhong et al., "Charge recombination reduction in dye-sensitized solar cells by depositingultrapure TiO2 nanoparticles on inert BaTiO3 films", Materials Science and Engineering B, vol. 176, Jun. 29, 2011 (Jun. 29, 2011), pp. 1115-1122, DOI: 10.1016/j.mseb.2011.05.052.
Z. Chen et al., "Schottky solar cells based on CsSnl3 thin-films", Appl. Phys. Lett. 101, 093901 (2012).
Chinese Office Action issued in Application No. 201610585145.1, dated Jul. 2, 2018, with translation attached, 10 pages.
International Preliminary Report on Patentability dated Dec. 8, 2014.
Oxford University Innovation Limited, Communication pursuant to Article 94(3) EPC for European Patent Application No. 13766635. 0, Aug. 5, 2016, 4 pages.
Isis Innovation Limited, Office Action for Japanese Patent Application No. 2015-531644, dated Oct. 4, 2016, 5 pages, with English translation.
Cheng et al., "Layered Organic-Inorganic Hybrid Perovskites-:Structure, Optical Properties, Film Preparation, Patterning and Templating Engineering," CrystEngComm. 12: 2646-2662, 2010.
Hashmi et al., "Air Processed Inkjet Infiltrated Carbon Based Printed Perovskite Solar Cells with High Stability and Reproducibility," Adv. Mater. Technol. 1600183, pp. 1-6, 2016.
Hashmi et al., "Air Processed Inkjet Infiltrated Carbon Based Printed Perovskite Solar Cells with High Stability and Reproducibility," Adv. Mater. Technol. 1600183, 2016, Supporting information.
Kashiwamura et al., "Thin Films of Microcrystalline (CH3NH3) (C5HsC2H4NH3)zPb2Br1 and Related Compounds: Fabrication and Optical Properties," *Synthetic Metals*. 96(2): 133-136, 1998.
Kim, "Syntheses, Crystal Structures, and Dielectric Property of Oxynitride Perovskites," Dissertation, The Ohio State University, pp. 1-188, 2005.
Kitazawa, "Stability of (C6H5C2H4NH3)zPb(Brxl 4_x) Mixed Crystals," Jpn. J. Appl. Phys. 36:6876-6879, 1997.
Kojima et al., "Organometal Halide Perovskites as Visible-Light Sensitizer for Photovoltaic Cells," *J. Am. Chem. Soc.* 131 (17): 6050-6051, Supporting Information, 2009.
Liu et al., "Critical Parameters in TiO2/ZrO2/Carbon-Based Mesoscopic Perovskite Solar Cell," Journal of Power Sources. 293: 533-538, 2015.
Mitzi, "Synthesis, Structure, and Properties of Organic-Inorganic Perovskites and Related Materials," Prog. Inorg. Chem., 48, pp. 1-121, 1999.
Mitzi, "Solution-Processed Inorganic Semiconductors," J. Mater. Chem. 14: 2355-2365, 2004.
Miyasaka et al, "Lead Halide Perovskites as Quantum dot Sensitizers for Mesoscopic TiO2 Photovoltaic Cells," *The Electrochemical Society Meeting Abstracts*, 216th ECS Meeting Abstract No. 742, 2009 Society Meeting.
Papavassiliou, "Synthetic Three-and Lower-Dimensional Semiconductors Based on Inorganic Units," Molecular crystals and liquid crystals science and technology. Section A. Molecular crystals and liquid crystals. 286(1): 231-238, 1996.

(56) References Cited

OTHER PUBLICATIONS

Weber, "CH3NH3PbX3, a Pb(II)-System with Cubic Perovskite Structure," Z. Naturforsch. 33b: 1443-1445, 1978, English Abstract only.
The Notice of Opposition filed in European Patent Application No. 13723943.0 by Oxford University Innovation Limited, pp. 1-32, Dec. 7, 2016.
Choi et al., "Structure of Methylammonium Lead Iodide Within Mesoporous Titanium Dioxide: Active Material in High-Performance Perovskite Solar Cells," Nano. Lett. 14, pp. 127-133,2014.
Edri et al., "High Open-Circuit Voltage Solar Cells Based on Organic-Inorganic Lead Bromide Perovskite," J. Phys. Chem. Lett. ,4, pp. 897-902, 2013.
Jeon et al., "Solvent engineering for high-performance inorganic-organic hybrid perovskite solar cells", Nature Materials, 13, pp. 897-903, 2014.
Kim et al., "Lead Iodide Perovskite Sensitized All-Solid-State Submicron Thin Film Mesoscopic Solar Cell with Efficiency Exceeding 9%", Scientific Reports, 2:591, pp. 1-7, PMC. Web. May 8, 2017.
Liu et al., "Efficient planar heterojunction perovskite solar cells by vapour deposition", Nature, 501, pp. 395-398, 2013.
Mei et al., "A hole-conductor-free, fully printable mesoscopic perovskite solar cell with high stability", Science, 345, pp. 295-298, 2014.
Noh et al., "Chemical Management for Colorful, Efficient, and Stable Inorganic-Organic Hybrid Nanostructured Solar Cells", Nano Lett., pp. A-F, 2013.
Saliba et al., "Cesium-containing triple cation perovskite solar cells: improved stability, reproducibility and high efficiency", Energy Environ. Sci., 9, pp. 1989-1997,2016.
Shockley et al., "Detailed Balance Limit of Efficiency of p-n Junction Solar Cells", Journal of Applied Physics 32(3), pp. 510-519, 1961.
Wojciechowski et al., "Sub-150° C. processed meso-superstructured perovskite solar cells with enhanced efficiency", Energy Environ. Sci., 7, pp. 1-9, 2013.
Zhou et al., "Interface engineering Science, 345, pp. 542-546, 2014 of highly efficient perovskite solar cells", Science, 345, pp. 542-546, 2014.
Smestad, "Testing of Dye Sensitized TiO2 Solar Cells II: Theoretical Voltage Output and Photoluminescence Efficiencies," Solar Energy Materials and Solar Cells, 32, pp. 273-288, 1994.
Smestad et al., "Testing of Dye Sensitized TiO2 Solar Cells I: Experimental Photocurrent Output and Conversion Efficiencies," Solar Energy Materials and Solar Cells, 32, pp. 259-272, 1994.
Smestad, "Absorptivity as a Predictor of the Photoluminescence Spectra of Silicon Solar Cells and Photosynthesis," Solar Energy Materials and Solar Cells, 38, pp. 57-71, 1995.
Oxford University Innovation Limited, Communication Pursuant to Article 94(3) EPC for EP 13766635.0, 6 pages, Sep. 28, 2017.
Hong et al., "Viability of Lead-Free Perovskites with Mixed Chalcogen and Halogen Anions for Photovoltaic Applications," The Journal of Physical Chemistry, 120, pp. 6435-6441, 2016.
Saparov et al., "Organic-Inorganic Perovskites: Structural Versatility for Functional Materials Design," Chemical Reviews, 116, pp. 4558-4596, 2016.
Oxford University Innovation Limited, Communication pursuant to Article 94(3) EPC for European Patent Application No. 15198085.1, Mar. 14, 2018, 6 pages.
Li et al., "New Organic-Inorganic Perovskite Materials With Different Optical Properties Modulated by Different Inorganic Sheets," Crystal Growth & Design, vol. 8, No. 6, 1990-1996, 2008.
Oxford University Innovation Limited, Extended European Search Report for European Patent Application No. 18155003.9, dated Mar. 27, 2018, 9 pages.
Oxford University Innovation Limited, First Office Action from the State Intellectual Property Office of China for CN 201610597085.5, 11 pages, dated Apr. 13, 2018.
Borriello et al., "Ab initio investigation of hybrid organic-inorganic perovskites based on tin halides", 2008, Physical Review B, 77, pp. 235214-1 thru 235214-9.
Abrusci et al., "Facile Infiltration of Semiconducting Polymer into Mesoporous Electrodes for Hybrid Solar Cells," Energy Environ. Sci. 4, pp. 3051-3058, 2011.
Antila et al., "ALD Grown Aluminum Oxide Submonolayers in Dye-Sensitized Solar Cells: The Effect on Interfacial Electron Transfer and Performance," J. Phys. Chem. C, 115, p. 16720-16729, 2011.
Bach et al., "Solid-State Dye-Sensitized Mesoporous TiO2 Solar Cells with High Photon-to-Electron Conversion Efficiencies," Nature 395, pp. 583-585, 1998.
Ball et al.,"Low-Temperature Processed Mesosuperstructured to Thin-Film Perovskite Solar Cells," Energy & Environmental Science, 6, pp. 1739-1743, 2013.
Barkhouse et al., "Device Characteristics of a 10.1 % Hydrazine-Processed $Cu_2ZnSn(Se,S)_4$ Solar Cell," Progress in Photovoltaics: Research and Applications, 20, pp. 6-11, 2012.
Beiley et al., "Modeling Low Cost Hybrid Tandem Photovoltaics With the Potential for Efficiencies Exceeding 20%," Energy & Environmental Science, 5, pp. 9173-9179, 2012.
Bogush, et al., "Preparation of Monodisperse Silica Particles: Control of Size and Mass Fraction," Journal of Non-Crystalline Solids, 104, pp. 95-106, 1988.
Brown et al., "Surface Energy Relay Between Cosensitized Molecules in Solid-State Dye-Sensitized Solar Cells," J. Phys. Chem. C, 115, pp. 23204-23208, 2011.
Burschka et al., "Tris(2-(1 H-pyrazol-1-yl)pyridine)cobalt(III) asp-Type Dopant for Organic Semiconductors and Its Application in Highly Efficient Solid-State Dye-Sensitized Solar Cells," J. Am. Chem. Soc., 133 (45), pp. 18042-18045, 2011.
Chang et al., "Panchromatic Photon-Harvesting by Hole-Conducting Materials in Inorganic-Organic Heterojunction Sensitized-Solar Cell Through the Formation of Nanostructured Electron Channels," Nano Lett. 12, pp. 1863-1867 2012.
Chirila et al., "Highly efficient Cu(In,Ga)Se2 Solar Cells Grown on Flexible Polymer Films," Nature Materials, vol. 10, p. 857-861, 2011.
Chondroudis et al., "Electroluminescence from an Organic-Inroganic Perovskite Incorporating a Quaterthiophene Dye Within Lead Halide Perovskite Layers," Chem. Mater., 11, pp. 3028-3030, 1999.
Chung, et al.; "All-Solid-State Dye-Sensitized Solar Cells With High Efficiency", Nature, vol. 485, p. 486-489, 2012.
Dennler, et al., "Polymer-Fullerene Bulk-Heterojunction Solar Cells," Advanced Materials 21, pp. 1323-1338, 2009.
Ding et al., "Pore-Filling of Spiro-OMeTAD in Solid-State Dye Sensitized Solar Cells: Quantification, Mechanism, and Consequences for Device Performance," Adv. Funct. Mater. 19, pp. 2431-2436, 2009.
Dwivedi et al., "Direct Deposition of Inorganic-Organic Hybrid Semiconductors and Their Template-Assisted Microstructures," Materials Chemistry and Physics, 137, pp. 941-946, Jan. 2013.
Era et al., "Organicinorganic Heterostructure Electroluminescent Device Using a Layered Perovskite Semiconductor (C6H5C2H4NH3)2Pbl4," Appl. Phys. Lett., 65, pp. 676-678, 1994.
Era et al., "Polarized Electroluminescence from Oriented p-sexiphenyl Vacuum deposited Film," Appl. Phys. Lett. 67(17), pp. 2436-2438, 1995.
Era et al., "Self-Organized Growth of PbI-Based Layered Perovskite Quantum Well by Dual-Source Vapor Deposition," Chem Mater, 9, pp. 8-10, 1997.
Era et al., "Enhanced Phosphorescence from Naphthalene-Chromophore Incorporated into Lead Bromide-Based Layered Perovskite Having Organic-Inorganic Superlattice Structure," Chem. Phys. Lett. 296, pp. 417-420, 1998.
Era et al., "PbBr-Based Layer Perovskite Organic-Inorganic Superlattice Having Hole-Transporting Carbazole Chromophore in Organic Layer," Curr. Appl. Phys., 5, pp. 67-70, 2005.
Graetzel at al., "Materials Interface Engineering for Solution-Processed Photovoltaics," Nature, vol. 488, p. 304-312, 2012.

(56) References Cited

OTHER PUBLICATIONS

Green et al., "Solar Cell Efficiency Tables (Version 38)," Prog. Photovolt: Res. Appl., 19, pp. 565-572,2011.
Green, et al., "Solar Cell Efficiency Tables (version 39)," Progress in Photovoltaics: Research and Applications, 20, pp. 12-20, 2012.
Haber, "Manual on Catalyst Characterization", Pure and Appl. Chem., 63(9), pp. 1227-1246, 1991.
Hagfeldt et al., "Light-Induced Redox Reactions in Nanocrystalline Systems," Chem. Rev., 95, pp. 49-68, 1995.
Halls, et al., "Efficient Photodiodes from Interpenerating Polymer Networks," Nature, 376, pp. 498-500, 1995.
Hibberd et al., "Non-Vacuum Methods for Formation of Cu(In, Ga)(Se, S)$_2$ Thin Film Photovoltaic Absorbers," Prof. Photvolt: Res Appl, 18, pp. 434-452, 2010.
Hines, et al., "Colloidal PbS Nanocrystals with Size-Tunable Near-Infrared Emission: Observation of Post-Synthesis Self-Narrowing of the Particle Size Distribution," Adv. Mater., 15(21), pp. 1844-1849, 2003.
Hirade et al., "Small Molecular Organic Photovoltaic Cells With Exciton Blocking Layer at Anode Interface for Improved Device Performance," Appl. Phys. Lett. 99, 153302-1-153302-3, 2011.
Im et al., "6.5% Efficient Pero vs kite Quantum-dot-sensitized Solar Cell," Nanoscale, vol. 3, p. 4088-4093, 2011.
Ishihara, "Optical Properties of PbI-based Perovskite Structures," Journal of Luminescence 60&61, pp. 269-274, 1994.
Itzhaik, et al., "Sb2S3-Sensitized Nanoporous TiO2 Solar Cells," J. Phys. Chem. C, 113, pp. 4254-4256, 2009.
Kagan, et al., "Organic-Inorganic Hybrid Materials as Semiconducting Channels in Thin-Film Field-Effect Transistors," Science 286, pp. 945-947, 1999.
Kavan, et al., "Highly Efficient Semiconducting TiO2 Photoelectrodes Prepared by Aerosol Pyrolysis," Electrochim. Acta, 40, pp. 643-652, 1995.
Kay et al., "Artificial Photosynthesis. 2. Investigations on the Mechanism of Photsensitization of Nanocrystalline TiO2 Solar Cells by Chlorophyll Derivatives," J. Phys. Chem., 98, pp. 952-959, 1994.
Kim et al., "Lead Iodide Perovskite Sensitized All-Solid-State Submicron Thin Film Mesoscopic Solar Cell with Efficiency Exceeding 9%," Scientific Reports, 2(591), pp. 1-7, 2012.
Kim et al., "New Architecture for High-Efficiency Polymer Photovoltaic Cells Using Solution-Based Titanium Oxide as an Optical Spacer," Adv. Mater., 18, pp. 572-576, 2006.
Kitazawa et al., "Optical Properties of CH3NH3PbX3 (X=halogen) and Their Mixed-Halide Cystals," J. Mat Sci., 37, pp. 3585-3587, 2002.
Knop et al., "Alkylammonium Lead Halides. Part 2. CH3NH3PbX3 (X=Cl, Br, I) Perovskites: Cuboctahedral Halide Cages with Isotropic Cation Reorientation," Can. J. Chem., 68, pp. 412-422, 1990.
Knutson et al., "Tuning the Band Gap in Hybrid Tin Iodide Perovskite Semiconductors Using Structural Templating," Inorg. Chem., 44, pp. 4699-4705, 2005.
Kojima et al., "Novel Photoelectrochemical Cell with Mesoscopic Electrodes Sensitized by Lead-Halide Compounds (11)," 214$_{th}$ ECS Meeting Abstracts, vol. MA2007-02, p. 352, 2007.
Kojima et al., "Organometal Halide Perovskites as Visible-Light Sensitizers for Photovoltaic Cells", Journal of the American Chemical Society, vol. 131 Journal of the American Chemical Society, vol. 131, p. 6050-6051, 2009.
Koops et al., "Transient Emission Studies of Electron Injection in Dye Sensitised Solar Cells," Inorganica Chimica Acta, 361, pp. 663-670, 2008.
Koops et al., "Parameters Influencing the Efficiency of Electron Injection in Dye-Sensitized Solar Cells," JACS, 131 (13), pp. 4808-4818, 2009.
Lee, K H. et al., "Morphology of All-Solution-Processed "Bilayer" Organic Solar Cells," Adv. Mater, 323, pp. 766-770, 2011.
Lee et al., "Optimizing the performance of a Plastic Dye-Sensitized Solar Cell," J Phys Chem C, 115, pp. 9787-9796, 2011.

Lee et al., "Efficient Hybrid Solar Cells Based on Meso-Superstructured Organometal Halide Perovskites", Science, vol. 338, pp. 643-647, 2012.
Lee et al., "Quantum-Dot-Sensitized Solar Cell With Uprecedentedly High Photocurrent," Scientific Reports, 3(1050), pp. 1-8, 2013.
Leijtens et al., "Hole Transport Materials with Low Glass Transition Temperatures and High Solubility for Application in Solid-State Dye-Sensitized Solar Cells," ACS Nano, 6(2), pp. 1455-1462, 2012.
Leventis et al., "Transient Optical Studies of Interfacial Charge Transfer at Nanostructured Metal Oxide/PbS Quantum Dot/Organic Hole Conductor Heterojunctions," JACS, 132, pp. 2743-2750, 2010.
Liang et al., "For the Bright Future-Bulk Heterojunction Polymer Solar Cells with Power Conversion Efficiency of 7.4%," Advanced Energy Materials, vol. 22, p. E135-E138, 2010.
Li et al., "Polymer Solar Cells," Nature Photonics, 6, pp. 153-161, 2012.
Li et al., "High-Efficiency Solution Processable Polymer Photovoltaic Cells by Self-Organization of Polymer Blends," Nature Materials, 4, pp. 864-868, 2005.
Li et al., "Formability of ABX$_3$ (X=F, Cl, Br, I) Halide Perovskites," Acta Cryst., B64, pp. 702-707,2008.
Lin et al., "Enhanced Performance of Dye-Sensitized Solar Cells by an Al2O3 Charge-Recombination Barrier Formed by Low-Temperature Atomic Layer Deposition," J. Mater. Chem., 19, pp. 2999-3003, 2009.
Liu et al., "Photovoltaic Effect In Micrometer-Thick Perovskite-Type Oxide Multilayers on Si Substrates," Applied Physics Letters, 93, pp. 171911-1-171911-3, 2008.
Martinson et al., "Radial Electron Collection in Dye-Sensitized Solar Cells," Nano Lett., vol. 8, No. 9, pp. 2862-2866, 2008.
Megaw, "Compounds of the Structural Type of Calcium Titanate," Nature 155, pp. 484-485, 1945.
Melas-Kyriazi et al., "The Effect of Hole Transport Material Pore Filling on Photovoltaic Performance in Solid-State Dye-Sensitized Solar Cells," Adv. Energy. Mater. 1, pp. 407-414, 2011.
Mishra et al., "Small Molecule Organic Semiconductors on the Move: Promises for Future Solar Energy Technology," Angew. Chem. Int. Ed., 51, pp. 2020-2067, 2012.
Mitzi et al., "Conducting Tin Halides with a Layered Organic-Based Perovskite Structure," Nature., 369, pp. 467-469, 1994.
Mitzi et al., "Conducting Layered Organic-Inorganic Halides Containing <110> Oriented Perovskite Sheets," Science, vol. 267, p. 1473-1476, 1995.
Mitzi et al., "Design, Structure, and Optical Properties of Organic-Inorganic Perovskites Containing an Oligothiophene Chromophore," Inorg. Chem., 38, pp. 6246-6256, 1999.
Mitzi et al., Thin Film Deposition of Organic-Inorganic Hybrid Material Using a Single Source Thermal Ablation. Chem Mater., 11, pp. 542-544, 1999.
Mitzi at al., "Organic-Inorganic Electronics," IBM Journal of Research and Development, 45(1), p. 29-45, 2001.
Mitzi et al., "High-Mobility Ultrathin Semiconducting Films Prepared by Spin Coating," Nature, 428, pp. 299-303, 2004.
Miyasaka et al., "Photovoltaic Performance of Plastic Dye-Sensitized Electrodes Prepared by Low-Temperature Binder-Free Coating of Mesoscopic Titania," Journal of the Electrochemical Society, 154, p. A455-A461, 2007.
O'Regan et al., "A Low-Cost, High-Efficiency Solar-Cell Based on Dye-Sensitized Colloidal TiO2 Films," Nature, 353, pp. 737-740, 1991.
Palomares et al., "Slow Charge Recombination in Dye-Sensitised Solar Cells (DSSC) using AlzO3 Coated Nanoporous TiO$_2$ Films," Chemical Communications, pp. 1464-1465, 2002.
Peacock et al., "Band Offsets and Schottky Barrier Heights of High Dielectric Constant Oxides," J. Appl. Phys., vol. 92, No. 8, pp. 4712-4721, 2002.
Pernik et al., "Tracking the Adsorption and Electron Injection Rates of CdSe Quantum Dots on TiO2: Linked Versus Direct Attachment," J. Phys. Chem. C, 115 (27), pp. 13511-13519, 2011.
Peumans et al., "Small molecular weight organic thin-film photodetectors and solar cells," J. Appl. Phys. 93, pp. 3693-3723, 2003.

(56) References Cited

OTHER PUBLICATIONS

Poglitsch et al., "Dynamic Disorder in Methylammoniumtrihalogenoplumbates (II) Observed by Millimeter-Wave Spectroscopy," J. Chem. Phys., 87(11), pp. 6373-6378, 1987.
Roelofs et al., "Effect of $Al_2O_3$ Recombination Barrier Layers Deposited by Atomic Layer Deposition in Solid State CdS Quantum Dot-Sensitized Solar Cells," J. Phys. Chem. C, 117, pp. 5584-5592, 2013.
Rouquerol et al., "Recommendations for the Characterization of Porous Solids", Pure & Appl. Chem., vol. 66, No. 8, pp. 1739-1758, 1994.
Schulze et al., "Efficient Vacuum-Deposited Organic Solar Cells Based on a New Low-Bankgap Oligothiophene and Fullerene $C_{60}$," Adv. Mater, 18, pp. 2872-2875, 2006.
Sing, et al., "Reporting Physisorption Data For Gas/Solid Systems with Special Reference to the Determination of Surface Area and Porosity," Pure and Appl. Chem., 57(4), pp. 603-619, 1985.
Snaith et al., "The Role of a "Schottky Barrier" at an Electron-Collection Electrode in Solid-State Dye-Sensitized Solar Cells," Adv. Mater. 18, pp. 1910-1914, 2006.
Snaith et al., "Advances in Liquid-Electrolyte and Solid-State Dye-Sensitized Solar Cells," Advanced Materials, 19, pp. 3187-3200, 2007.
Snaith et al., "Charge Collection and Pore Filling in Solid-State Dye-Sensitized Solar Cells," Nanotechnology 19, pp. 424003-424015, 2008.
Snaith et al., "Charge Generation and Photovoltaic Operation of Solid-State Dye-Sensitized Solar Cells Incorporating a High Extinction Coefficient Indolene-Based Sensitizer," Adv. Func. Mater., 19, pp. 1-9, 2009.
Sourisseau et al., "Hybrid Perovskite Resulting from the Solid-State Reaction between the Organic Cations and Perovskite Layers of a1-(Br-(CH2)2-NH3)2Pbl4," Inorg. Chem., 46, pp. 6148-6154, 2007.
Tang et al., "Colloidal-Quantum-dot Photovoltaics Using Atomic-Ligand Passivation," Nature Materials 10, pp. 765-771, 2011.
Todorov et al., "High-Efficiency Solar Cell with Earth-Abundant Liquid-Processed Absorber," Adv. Mater., 22, pp. E156-E159, 2010.
Tokito et al., "Structures and Optical Properties of Organic/Inorganic Superlattices," Appl. Phys. Lett. 64, pp. 1353-1355, 1994.
Vincent et al.,"Alkylammonium Lead Halides. Part 1. Isolated $Pbl_6^{4-}$-Ions in $(CH_3NH_3)_4Pbl_6 2H_2 0)$," Can. J. Chem., 65, pp. 1042-1046, 1987.
Wu, "High-efficiency polycrystalline CdTe thin-film solar cells," Solar Energy, vol. 77, p. 803-814, 2004.
Yamada et al., "Tunable Perovskite Semiconductor $CH_3NH_3SnX_3$ (X: Cl, Br, or I) Characterized by X-ray and DTA," Bull. Chem. Soc. Jpn., 84(9), pp. 926-932, 2011.
Yan et al., "A High-Mobility Electron-Transporting Polymer for Printed Transistors," Nature, vol. 457, pp. 679-687, Feb. 2009.
Yella, et al., "Porphyrin-Sensitized Solar Cells with Cobalt (II/III)-Based Redox Electrolyte Exceed 12 Percent Efficiency," Science 334, pp. 629-634, 2011.
Yu, et al., "Polymer Photovoltaic Cells: Enhanced Efficiencies via a Network of Internal Donor-Acceptor Heterojunctions," Science 270, pp. 1789-1791, 1995.
Zhang et al,. "Dye-sensitized Solar Cells Made from BaTiO3-coated TiO2 Nanoporous Electrodes," Journal of Photochemistry and Photobiology A: Chemistry 197, pp. 260-265, 2008.
Experimental Annex "A", pp. 1-6, Filed with the European Patent Office on Sep. 1, 2014 in Response to the Written Opinion of the International Preliminary Examining Authority of PCT Application No. PCT/GB2013/051310 dated May 30, 2014.
Office Action issued in Chinese Patent Application No. 201810158929.5 dated Dec. 30, 2020, 12 pages, translation of office action 7 pages.

Kenjiro Teshima, "Photoelectrochemical cell with using organic and inorganic perovskite compound as sensitizer", Feb. 2009, Proceedings of the 12th thin film substrate scientific society at Shizuoka University, 4 pages.
C.W. Tang "Two-layer organic photovoltaic cell"; Appl. Phys. Lett., 48(2), 13, pp. 183-185, 1986-1-13.
J.F. Geisz et al. "Lattice-Matched GaNPAs-on-Silicon Tandem Solar Cells", 31st IEEE Photovoltaics Specialists Conference and Exhibition, Jan. 3-7, 2005, Conference Paper, 7 pages.
Z. Chen et al., "Shottky solar cells based on CsSnl3 thin-films", Appl. Phys. Lett. 101, 093901 (2012), Aug. 27, 2012, American Institute of Physics, pp. 1-4.
In Chung et al., "All-solid-state dye-sensitized solar cells with high efficiency", Nature, vol. 485, May 24, 2012, Macmillan Publishers Limited, pp. 486-490.
J. Rouquerol et al. "Recommendations for the Characterization of Porous Solids", Pure & Appl. Chem., vol. 66, No. 8, pp. 1739-1758, 1994.
Electroluminescence; PVeducation.org; https://www.pveducation.org/pvcdrom/characterisation/eiectroluminescence: Accessed Jun. 2020 (Year: 2020).
Toshinori Matsushima et al.; Electroluminescence Enhancement in Dry-Processed Organic-Inorganic Layered Perovskite Films; Jpn. J. Appl. Phys. vol. 44, No. 3, 2005, pp. 1457-1461 (Year: 2005).
Akihiro Kojima et al.; Highly Luminescent Lead Bromide Perovskite Nanoparticles Synthesized with Porous Alumina Media; Chem. Lett. 2012, 41, 397-399 (Year: 2012).
Rui Sheng et al.; Methylammonium Lead Bromide Perovskite-Based Solar Cells by Vapor-Assisted Deposition; J. Phys. Chem. C 2015, 119, 7, 3545-3549 (Year: 2015).
Kanatzidis et al, Priority U.S. Appl. No. 61/601,262, "Liquid Electrolyte-Free, Solid-State Solar Cells With Inorganic Hole Transport Materials", filed Feb. 21, 2012, 61 pages, United States Patent and Trademark Office.
Kanatzidis et al., Priority U.S. Appl. No. 61/601,219, "Photoluminescent Compounds", filed Feb. 21, 2012, 95 pages, United States Patent and Trademark Office.
Korea Research Institute of Chemical Technology, Korean Application No. 10-2012-0101192, "Solar Cell with Pillar-Structured Light Harvester", filed Sep. 12, 2012, 144 pages with translation, Korean Intellectual Property Office.
Mazzarella L, et al, "Infrared Light Management Using a Nanocrystalline Silicon Oxide Interlayer in Monolithic Perovskite/Silicon Heterojunction Tandem Solar Cells with Efficiency above 25%", Ad-vanced Energy Materials, 2019, vol. 9, issue No. 1803241, pp. 1-9.
Jiang et al., "Surface passivation of perovskite film for efficient solar cells", Nature Photonics, Jul. 2019, vol. 13, pp. 460-467.
Office Action issued Japanese Application No. 2020-020952, dated Mar. 29, 2021, dated Apr. 6, 2021, 6 pages, translation 8 pages.
Office Action issued Japanese Application No. 2019-078604 , dated Apr. 15, 2021, dated Apr. 22, 2021, 5 pages, translation 8 pages.
Notification of Submission of Opposition Proceedings against European patent No. EP 2898553 (EP application No. 13766635.0), May 3, 2021, 20 pages, European Patent Office, Munich,Gemany.
Yang et al., "Lead-Free Cu Based Hybrid Perovskite Solar Cell", J Chin Ceram Soc, 2018, 46(4): pp. 455-460, with English translation consisting of 3 pages.
Guangyong Li et al., "Recent Progress in Modeling, Simulation and Optimization of Polymer Solar Cells", IEEE Journal of Photovoltaics, vol. 2, No. 3, Jul. 2012, pp. 320-340.
Jun Eguchi, "Investigation regarding the solar cells", Department of Chemistry and Biochemistry, Furukawa Laboratory, graduation thesis 2009, 28 pages including English translation of summary of thesis.

\* cited by examiner (a)

(b)

(a)

(b)

(a)

(b)

OPTOELECTRONIC DEVICE

FIELD OF THE INVENTION

The invention relates to an optoelectronic device, and in particular to a flat junction optoelectronic device. The invention also relates to a process for producing such an optoelectronic device.

BACKGROUND TO THE INVENTION

Thin-film photovoltaics are a promising alternative to their monocrystalline counterparts owing to their high-efficiency, comparable stability and potentially lower manufacturing cost. The most widely-studied thin-film materials currently under investigation for photovoltaic applications include the compound semiconductors CdTe [X. Wu, Solar Energy, vol. 77, p. 803, 2004], $CuIn_{1-x}Ga_xSe_2$ (CIGS) [Chirila et al., Nature Materials, vol. 10, p. 857, 2011], $Cu_2ZnSnS_4$ (CZTS) [D. Barkhouse et al., Progress in Photovoltaics, vol. 20, p. 6, 2012]; dye-sensitized solar cells [A. Yalla et al., Science, vol. 334, p. 629, 2011]; and organic semiconductor solar cells [Y. Liang et al., Advanced Energy Materials, vol. 22, p. E135, 2010]. Inorganic compound semiconductors which comprise high-efficiency solar cells are typically fabricated using expensive vacuum-based deposition although recent routes towards solution processing of CIGS and CZTS have exhibited high efficiency devices [M. Graetzel at al., Nature, vol. 488, p. 304, 2012]. Dye-sensitized and organic solar cells with lower record efficiencies are typically fabricated with solution-based deposition procedures but suffer from poor long-term stability. In addition, the relatively low production capacity of tellurium and indium makes CdTe and CIGS potentially commercially unattractive.

Perovskites [D. Mitzi et al., Science, vol. 267, p. 1473, 1995] are an alternative family of semiconductor materials which have been investigated for device applications [D. Mitzi at al., IBM Journal of Research and Development, vol. 45, p. 29, 2001]. For photovoltaics, perovskites have been used as the sensitizer in liquid electrolyte photoelectrochemical cells [J.-H. Im et al., Nanoscale, vol. 3, p. 4088, 2011; A. Kojima et al., Journal of the American Chemical Society, vol. 131, p. 6050, 2009], although in this previously reported electrolyte system, the perovskite absorbers decayed rapidly and the solar cells dropped in performance after only 10 minutes. Perovskites have also been used in solid-state photoelectrochemical cells [H.-S. Kim et al., Scientific Reports, doi:10.1038/srep00591; A. Kojima et al., ECS Meeting Abstracts, vol. MA2007-02, p. 352, 2007] and as the hole transporter in solid-state dye-sensitized solar cells [I. Chung, Nature, vol. 485, p. 486, 2012]. The main operating principle of sensitized solar cells, is that the role of light absorption, and charge transport are separated into different materials in the solar cell. This enables light absorbing materials, which would generate charge inefficiently if light was shone on a solid film of the material, to operate very efficiently in a sensitized solar cell. Hence, since there are examples of perovskites employed as sensitizers in meso-structured solar cells, or as hole-transporters in dye-sensitized solar cells, but no reports of solid films of perovskites operating efficiently in solar cells, it would be reasonable to assume that perovskites are not an ideal family of materials to employ as solid thin films in thin film photovoltaics.

SUMMARY OF THE INVENTION

The invention provides optoelectronic devices having a thin film of a light-absorbing or light-emitting perovskite disposed between n-type (electron conducting) and p-type (hole conducting) layers. The inventors have unexpectedly found that good device efficiencies can be obtained by using a compact thin film of the photoactive perovskite, as opposed to the requirement of a mesoporous composite. Whilst an open porous perovskite structure could typically be infiltrated with a p- or n-type material to form a bulk heterojunction with that material, the dense perovskite layer employed in the present invention will generally form a planar heterojunction with the p-type layer and/or the n-type layer.

The perovskites employed in the optoelectronic devices of the invention are attractive for optoelectronic device applications because they can be formed from earth-abundant elements by both solution and vacuum processing, have tunable band structures (and therefore optical and electronic properties), and can be stable in atmospheric conditions. The inventors have shown that the photoactive perovskite film may be grown on a thin scaffold or seed layer, or in the absence of such scaffold, by solution deposition. Devices incorporating the thin seed layer can be processed entirely at temperatures not exceeding 150° C., which is important for reducing the cost of manufacturing, and for enabling processing on plastic substrates to provide flexible devices, and also for enabling processing on top of other layers to enable the production of tandem and multi-junction devices. The perovskite thin film can also usefully be formed by evaporation from a bulk powder or by co-evaporation of perovskite precursor compounds.

Accordingly, the invention provides an optoelectronic device comprising a photoactive region, which photoactive region comprises:
  an n-type region comprising at least one n-type layer;
  a p-type region comprising at least one p-type layer; and, disposed between the n-type region and the p-type region:
  a layer of a perovskite semiconductor without open porosity.

Typically, the optoelectronic device is a photovoltaic device.

Alternatively, the optoelectronic device may be other than a photovoltaic device.

The optoelectronic device may for instance be a light-emitting device.

In some embodiments, the photoactive region comprises:
  said n-type region;
  said p-type region; and, disposed between the n-type region and the p-type region:
  (i) a first layer which comprises a scaffold material and a perovskite semiconductor; and
  (ii) a capping layer disposed on said first layer, which capping layer is said layer of a perovskite semiconductor without open porosity,
  wherein the perovskite semiconductor in the capping layer is in contact with the perovskite semiconductor in the first layer.

In another aspect, the invention provides a process for producing an optoelectronic device comprising a photoactive region, which photoactive region comprises:
  an n-type region comprising at least one n-type layer;
  a p-type region comprising at least one p-type layer; and, disposed between the n-type region and the p-type region:
  a layer of a perovskite semiconductor without open porosity, which process comprises:
  (a) providing a first region;
  (b) disposing a second region on the first region, which second region comprises a layer of a perovskite semiconductor without open porosity; and (c) disposing a third region on the second region, wherein:
the first region is an n-type region comprising at least one n-type layer and the third region is a p-type region comprising at least one p-type layer; or
the first region is a p-type region comprising at least one p-type layer and the third region is an n-type region comprising at least one n-type layer.

Typically, the process of the invention is for producing a photovoltaic device comprising said photoactive region.

Alternatively, the process may be used to produce an optoelectronic device other than a photovoltaic device, which optoelectronic device comprises said photoactive region. The process may for instance be used to produce a light-emitting device comprising said photoactive region.

In some embodiments of the process of the invention the photoactive region comprises: said n-type region; said p-type region; and, disposed between the n-type region and the p-type region:
(i) a first layer which comprises a scaffold material and a perovskite semiconductor; and
(ii) a capping layer disposed on said first layer, which capping layer is said layer of a perovskite semiconductor without open porosity, wherein the perovskite semiconductor in the capping layer is in contact with the perovskite semiconductor in the first layer.

In such embodiments, the process of the invention comprises:
(a) providing said first region;
(b) disposing said second region on the first region, wherein the second region comprises:
(i) a first layer which comprises a scaffold material and a perovskite semiconductor; and
(ii) a capping layer on said first layer, which capping layer is said layer of a perovskite semiconductor without open porosity, wherein the perovskite semiconductor in the capping layer is in contact with the perovskite semiconductor in the first layer; and
(c) disposing said third region on the second region.

The invention further provides an optoelectronic device which is obtainable by the process of the invention for producing an optoelectronic device.

Typically, the optoelectronic device is a photovoltaic device.

Alternatively, the optoelectronic device may be other than a photovoltaic device. The optoelectronic device may for instance be a light-emitting device.

DETAILED DESCRIPTION OF THE INVENTION

Figure 1:
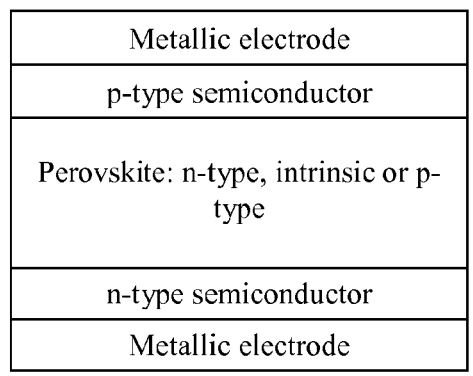
FIG. 1 provides schematic illustrations of: (a) the generic structure of an embodiment of the optoelectronic device of the present invention; and (b) the photovoltaic cells exemplified herein (variations where the thin $Al_2O_3$ or $TiO_2$ layer is omitted are also investigated). At least one of the metallic electrodes is semi-transparent across the visible to near Infrared region of the solar spectrum. Semi-transparent is with a transparency of typically 80%, and ranging from 40 to 90%.
Figure 1:
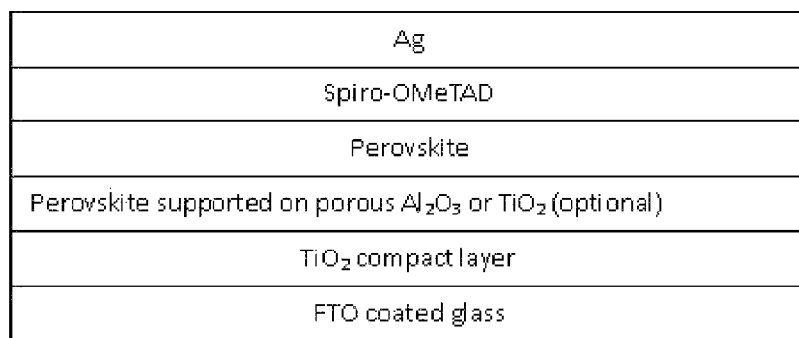

The invention provides an optoelectronic device comprising a photoactive region. The photoactive region comprises: an n-type region comprising at least one n-type layer; a p-type region comprising at least one p-type layer; and, disposed between the n-type region and the p-type region: a layer of a perovskite semiconductor without open porosity.

The term "photoactive region", as used herein, refers to a region in the optoelectronic device which (i) absorbs light, which may then generate free charge carriers; or (ii) accepts charge, both electrons and holes, which may subsequently recombine and emit light.

The term "semiconductor" as used herein refers to a material with electrical conductivity intermediate in magnitude between that of a conductor and a dielectric. A semiconductor may be an n-type semiconductor, a p-type semiconductor or an intrinsic semiconductor.

As used herein, the term "n-type region", refers to a region of one or more electron-transporting (i.e. n-type) materials. Similarly, the term "n-type layer" refers to a layer of an electron-transporting (i.e. an n-type) material. An electron-transporting (i.e. an n-type) material could be a single electron-transporting compound or elemental material, or a mixture of two or more electron-transporting compounds or elemental materials. An electron-transporting compound or elemental material may be undoped or doped with one or more dopant elements.

As used herein, the term "p-type region", refers to a region of one or more hole-transporting (i.e. p-type) materials. Similarly, the term "p-type layer" refers to a layer of a hole-transporting (i.e. a p-type) material. A hole-transporting (i.e. a p-type) material could be a single hole-transporting compound or elemental material, or a mixture of two or more hole-transporting compounds or elemental materials. A hole-transporting compound or elemental material may be undoped or doped with one or more dopant elements.

The term "perovskite", as used herein, refers to a material with a three-dimensional crystal structure related to that of $CaTiO_3$ or a material comprising a layer of material, wherein the layer has a structure related to that of $CaTiO_3$. The structure of $CaTiO_3$ can be represented by the formula $ABX_3$, wherein A and B are cations of different sizes and X is an anion. In the unit cell, the A cations are at (0,0,0), the B cations are at (½, ½, ½) and the X anions are at (½, ½, 0). The A cation is usually larger than the B cation. The skilled person will appreciate that when A, B and X are varied, the different ion sizes may cause the structure of the perovskite material to distort away from the structure adopted by $CaTiO_3$ to a lower-symmetry distorted structure. The symmetry will also be lower if the material comprises a layer that has a structure related to that of $CaTiO_3$. Materials comprising a layer of perovskite material are well known. For instance, the structure of materials adopting the $K_2NiF_4$-type structure comprises a layer of perovskite material. The skilled person will appreciate that a perovskite material can be represented by the formula $[A][B][X]_3$, wherein [A] is at least one cation, [B] is at least one cation and [X] is at least one anion. When the perovskite comprise more than one A cation, the different A cations may distributed over the A sites in an ordered or disordered way. When the perovskite comprises more than one B cation, the different B cations may distributed over the B sites in an ordered or disordered way. When the perovskite comprise more than one X anion, the different X anions may distributed over the X sites in an ordered or disordered way. The symmetry of a perovskite comprising more than one A cation, more than one B cation or more than one X cation, will be lower than that of $CaTiO_3$.

As mentioned in the preceding paragraph, the term "perovskite", as used herein, refers to (a) a material with a three-dimensional crystal structure related to that of $CaTiO_3$ or (b) a material comprising a layer of material, wherein the layer has a structure related to that of $CaTiO_3$. Although both of these categories of perovskite may be used in the devices according to the invention, it is preferable in some circumstances to use a perovskite of the first category, (a), i.e. a perovskite having a three-dimensional (3D) crystal structure. Such perovskites typically comprise a 3D network of perovskite unit cells without any separation between layers. Perovskites of the second category, (b), on the other hand, include perovskites having a two-dimensional (2D) layered structure. Perovskites having a 2D layered structure may comprise layers of perovskite unit cells that are separated by (intercalated) molecules; an example of such a 2D layered perovskite is $[2-(1-cyclohexenyl)ethylammonium]_2PbBr_4$. 2D layered perovskites tend to have high exciton binding energies, which favours the generation of bound electron-hole pairs (excitons), rather than free charge carriers, under photoexcitation. The bound electron-hole pairs may not be sufficiently mobile to reach the p-type or n-type contact where they can then transfer (ionise) and generate free charge. Consequently, in order to generate free charge, the exciton binding energy has to be overcome, which represents an energetic cost to the charge generation process and results in a lower voltage in a photovoltaic cell and a lower efficiency. In contrast, perovskites having a 3D crystal structure tend to have much lower exciton binding energies (on the order of thermal energy) and can therefore generate free carriers directly following photoexcitation. Accordingly, the perovskite semiconductor employed in the devices and processes of the invention is preferably a perovskite of the first category, (a), i.e. a perovskite which has a three-dimensional crystal structure. This is particularly preferable when the optoelectronic device is a photovoltaic device.

The perovskite semiconductor employed in the present invention, in said layer of a perovskite semiconductor without open porosity, is typically one which is capable of (i) absorbing light, and thereby generating free charge carriers; and/or (ii) emitting light, by accepting charge, both electrons and holes, which subsequently recombine and emit light. Thus, the perovskite employed is typically a light-absorbing and/or a light-emitting perovskite.

As the skilled person will appreciate, the perovskite semiconductor employed in the present invention, in said layer of a perovskite semiconductor without open porosity, may be a perovskite which acts as an n-type, electron-transporting semiconductor when photo-doped. Alternatively, it may be a perovskite which acts as a p-type hole-transporting semiconductor when photo-doped. Thus, the perovskite may be n-type or p-type, or it may be an intrinsic semiconductor. In preferred embodiments, the perovskite employed is one which acts as an n-type, electron-transporting semiconductor when photo-doped.

Typically, the perovskite semiconductor used in the present invention is a photosensitizing material, i.e. a material which is capable of performing both photogeneration and charge (electron or hole) transportation.

As used herein, the term "porous" refers to a material within which pores are arranged. Thus, for instance, in a porous scaffold material the pores are volumes within the scaffold where there is no scaffold material. The individual pores may be the same size or different sizes. The size of the pores is defined as the "pore size". The limiting size of a pore, for most phenomena in which porous solids are involved, is that of its smallest dimension which, in the absence of any further precision, is referred to as the width of the pore (i.e. the width of a slit-shaped pore, the diameter of a cylindrical or spherical pore, etc.). To avoid a misleading change in scale when comparing cylindrical and slit-shaped pores, one should use the diameter of a cylindrical pore (rather than its radius) as its "pore-width" (J. Rouquerol et al., "Recommendations for the Characterization of Porous Solids", Pure & Appl. Chem., Vol. 66, No. 8, pp. 1739-1758, 1994). The following distinctions and definitions were adopted in previous IUPAC documents (K. S. W. Sing, et al, Pure and Appl. Chem., vol. 57, n 04, pp 603-919, 1985; and IUPAC "Manual on Catalyst Characterization", J. Haber, Pure and Appl. Chem., vol. 63, pp. 1227-1246, 1991):

Micropores have widths (i.e. pore sizes) smaller than 2 nm.

Mesopores have widths (i.e. pore sizes) of from 2 nm to 50 nm.

Macropores have widths (i.e. pore sizes) of greater than 50 nm.

Pores in a material may include "closed" pores as well as open pores. A closed pore is a pore in a material which is a non-connected cavity, i.e. a pore which is isolated within the material and not connected to any other pore and which cannot therefore be accessed by a fluid (e.g. a liquid, such as a solution) to which the material is exposed. An "open pore" on the other hand, would be accessible by such a fluid. The concepts of open and closed porosity are discussed in detail in J. Rouquerol et al., "Recommendations for the Characterization of Porous Solids", Pure & Appl. Chem., Vol. 66, No. 8, pp. 1739-1758, 1994.

Open porosity, therefore, refers to the fraction of the total volume of the porous material in which fluid flow could effectively take place. It therefore excludes closed pores. The term "open porosity" is interchangeable with the terms "connected porosity" and "effective porosity", and in the art is commonly reduced simply to "porosity". (The perovskite semiconductor present in the "layer of a perovskite semiconductor without open porosity", in the optoelectronic device of the invention, cannot therefore be said to be a "porous perovskite".)

The term "without open porosity", as used herein, therefore refers to a material with no effective porosity.

The optoelectronic device of the present invention comprises a layer of a perovskite semiconductor without open porosity. That layer, and the perovskite semiconductor within it, are without open porosity. The perovskite semiconductor in the layer is not therefore infiltrated by the, or any of the, n-type material(s) in the n-type region, and likewise it is not infiltrated by the, or any of the, p-type material(s) in the p-type region. Rather, the perovskite semiconductor in that layer typically forms a planar heterojunction with the n-type or the p-type region, or in some cases it forms planar heterojunctions with both the n-type region and the p-type region.

Also, when the layer of the perovskite semiconductor without open porosity is a "capping layer", which is disposed on a first layer which comprises a scaffold material and a perovskite semiconductor, the capping layer is not infiltrated by the scaffold material either, because the capping layer and the perovskite semiconductor within the capping layer are without open porosity. The perovskite in the first layer, on the other hand (which is generally the same perovskite compound as the perovskite compound in the capping layer), is typically disposed in pores of the scaffold material and may therefore be said to be "infiltrated" by the scaffold material.

In some embodiments of the optoelectronic device of the present invention, the layer of the perovskite semiconductor without open porosity is non-porous. The term "non-porous" as used herein, refers to a material without any porosity, i.e. without open porosity and also without closed porosity.

Generally, the layer of the perovskite semiconductor without open porosity consists essentially of the perovskite semiconductor. A perovskite is a crystalline compound. Thus, the layer of the perovskite semiconductor without open porosity typically consists essentially of crystallites of the perovskite. In some embodiments, the layer of the perovskite semiconductor without open porosity consists of the perovskite semiconductor. Thus, typically the layer of the perovskite semiconductor without open porosity consists of crystallites of the perovskite.

The layer of the perovskite semiconductor without open porosity is generally in contact with at least one of the n-type region or the p-type region.

The layer of the perovskite semiconductor without open porosity typically forms a planar heterojunction with the n-type region or the p-type region. Either the n-type region or the p-type region may be disposed on the layer of the perovskite semiconductor without open porosity, but as explained above, since the layer of the perovskite semiconductor is without open porosity the n-type or p-type material does not infiltrate the perovskite semiconductor to form a bulk heterojunction; rather it usually forms a planar heterojunction with the perovskite semiconductor. Typically, the layer of the perovskite semiconductor without open porosity forms a planar heterojunction with the n-type region.

In some embodiments, the layer of the perovskite semiconductor without open porosity is in contact with both the n-type region and the p-type region. In such embodiments there will be no other layer (such as a "first layer" which comprises a scaffold material and a perovskite semiconductor) separating the layer of the perovskite semiconductor without open porosity from the n-type region or the p-type region. As explained above, since the layer of the perovskite semiconductor is without open porosity, in such embodiments neither the n-type region or the p-type region material infiltrates the perovskite semiconductor to form a bulk heterojunction; rather it usually forms a planar heterojunction with the perovskite semiconductor. Thus, the layer of the perovskite semiconductor without open porosity may form planar heterojunctions with both the n-type and p-type regions on either side of the layer. Accordingly, in some embodiments of the optoelectronic device of the invention, the layer of the perovskite semiconductor forms a first planar heterojunction with the n-type region and a second planar heterojunction with the p-type region.

The optoelectronic device of the invention is typically a thin film device.

Usually, the thickness of the layer of the perovskite semiconductor without open porosity is from 10 nm to 100 m. More typically, the thickness of the layer of the perovskite semiconductor without open porosity is from 10 nm to 10 m. Preferably, the thickness of the layer of the perovskite semiconductor without open porosity is from 50 nm to 1000 nm, for instance from 100 nm to 700 nm. The thickness of the layer of the perovskite semiconductor is often greater than 100 nm. The thickness may for example be from 100 nm to 100 m, or for instance from 100 nm to 700 nm.

In order to provide highly efficient photovoltaic devices, the absorption of the absorber/photoactive region should ideally be maximised so as to generate an optimal amount of current. Consequently, when using a perovskite as the absorber in a solar cell, the thickness of the perovskite layer should ideally be in the order of from 300 to 600 nm, in order to absorb most of the sun light across the visible spectrum. In particular, in a solar cell the perovskite layer should generally be thicker than the absorption depth (which is defined as the thickness of film required to absorb 90% of the incident light of a given wavelength, which for the perovskite materials of interest is typically above 100 nm if significant light absorption is required across the whole visible spectrum (400 to 800 nm)), as the use of a photoactive layer in photovoltaic devices with a thickness of less than 100 nm can be detrimental to the performance of the device.

In contrast, electroluminescent (light-emitting) devices do not need to absorb light and are therefore not constrained by the absorption depth. Moreover, in practice the p-type and n-type contacts of electroluminescent devices are typically chosen such that once an electron or hole is injected on one side of the device it will not flow out of the other (i.e. they are selected so as to only inject or collect a single carrier), irrespective of the thickness of the photoactive layer. In essence, the charge carriers are blocked from transferring out of the photoactive region and will thereby be available to recombine and generate photons, and can therefore make use of a photoactive region that is significantly thinner.

Typically, therefore, when the optoelectronic device is a photovoltaic device, the thickness of the layer of the perovskite semiconductor is greater than 100 nm. The thickness of the layer of the perovskite semiconductor in the photovoltaic device may for instance be from 100 nm to 100 m, or for instance from 100 nm to 700 nm. The thickness of the layer of the perovskite semiconductor in the photovoltaic device may for instance be from 200 nm to 100 m, or for instance from 200 nm to 700 nm.

As used herein, the term "thickness" refers to the average thickness of a component of an optoelectronic device.

The inventors have shown that a thin scaffold may be used to seed the growth of the photoactive perovskite layer where the majority of the photoactivity (e.g. light absorption) occurs in a capping layer that forms above the scaffold. This capping layer is the abovementioned layer of the perovskite semiconductor without open porosity, and, in these embodiments, a "first layer" separates that capping layer from either the n-type region or the p-type region.

Accordingly, in some embodiments, said photoactive region of the device comprises:
said n-type region;
said p-type region; and, disposed between the n-type region and the p-type region:
(i) a first layer which comprises a scaffold material and a perovskite semiconductor; and
(ii) a capping layer disposed on said first layer, which capping layer is said layer of a perovskite semiconductor without open porosity.

The perovskite semiconductor in the capping layer is in contact with the perovskite semiconductor in the first layer.

Since the perovskite in the first layer and the perovskite in the capping layer are often deposited together in the same step, typically by the same solution deposition or vapour deposition step, the perovskite semiconductor in the capping layer is usually made of the same perovskite compound as the perovskite semiconductor in the first layer.

Unlike the first layer, which comprises both the scaffold material and the perovskite semiconductor, the capping layer does not comprise the scaffold material. As explained above, the capping layer, which is said layer of a perovskite semiconductor without open porosity, typically consists essentially of, or consists of crystallites of the perovskite semiconductor. The capping layer usually therefore consists essentially of the perovskite semiconductor. In some embodiments the capping layer consists of the perovskite semiconductor.

The first layer comprises said scaffold material and said perovskite semiconductor disposed on the surface of the scaffold material. The term "scaffold material" as used herein refers to a material whose function(s) include acting as a physical support for another material. In the present case, the scaffold material acts as a support for the perovskite semiconductor present in the first layer. The perovskite semiconductor is disposed, or supported on, the surface of the scaffold material. The scaffold material is usually porous, meaning that it typically has an open porous structure. Accordingly, the "surface" of the scaffold material here typically refers to the surfaces of pores within the scaffold material. Thus, the perovskite semiconductor in the first layer is typically disposed on the surfaces of pores within the scaffold material.

In some embodiments, the scaffold material is porous and the perovskite semiconductor in the first layer is disposed in pores of the scaffold material. The effective porosity of said scaffold material is usually at least 50%. For instance, the effective porosity may be about 70%. In one embodiment, the effective porosity is at least 60%, for instance at least 70%.

The scaffold material is usually mesoporous. The term "mesoporous", as used herein, means that the mean pore size of the pores within the material is from 2 nm to 50 nm. Individual pores may be different sizes and may be any shape.

Alternatively, the scaffold material may be macroporous. The term "macroporous", as used herein, means that the mean pore size of the pores within the material is greater than 2 nm. In some embodiments, the pore size in the scaffold material, when it is macroporous, is greater than 2 nm and equal to or less than 1 m, or for instance, greater than 2 nm and equal to or less than 500 nm, more preferably greater than 2 nm and equal to or less than 200 nm.

The scaffold material may be a charge-transporting scaffold material (e.g. an electron-transporting material such as titania, or alternatively a hole transporting material) or a dielectric material, such as alumina. The term "dielectric material", as used herein, refers to material which is an electrical insulator or a very poor conductor of electric current. The term dielectric therefore excludes semiconducting materials such as titania. The term dielectric, as used herein, typically refers to materials having a band gap of equal to or greater than 4.0 eV. (The band gap of titania is about 3.2 eV.) The skilled person of course is readily able to measure the band gap of a semiconductor, by using well-known procedures which do not require undue experimentation. For instance, the band gap of the semiconductor can be estimated by constructing a photovoltaic diode or solar cell from the semiconductor and determining the photovoltaic action spectrum. The monochromatic photon energy at which the photocurrent starts to be generated by the diode can be taken as the band gap of the semiconductor; such a method was used by Barkhouse et al., Prog. Photovolt: Res. Appl. 2012; 20:6-11. References herein to the band gap of the semiconductor mean the band gap as measured by this method, i.e. the band gap as determined by recording the photovoltaic action spectrum of a photovoltaic diode or solar cell constructed from the semiconductor and observing the monochromatic photon energy at which significant photocurrent starts to be generated.

Usually, the perovskite semiconductor in the first layer (which layer also comprises the scaffold material) contacts one of the p-type and n-type regions, and the perovskite semiconductor in the capping layer contacts the other of the p-type and n-type regions. Typically, the perovskite semiconductor in the capping layer forms a planar heterojunction with the region with which it is in contact, i.e. with the p-type region or the n-type region.

In one preferred embodiment, the perovskite semiconductor in the capping layer contacts the p-type region, and the perovskite semiconductor in the first layer contacts the n-type region. Usually, in this embodiment, the scaffold material is either an electron-transporting scaffold material or a dielectric scaffold material. Typically, the perovskite semiconductor in the capping layer forms a planar heterojunction with the p-type region.

In another embodiment, however, the perovskite semiconductor in the capping layer contacts the n-type region, and the perovskite semiconductor in the first layer contacts the p-type region. Typically, in this embodiment, the scaffold material is a hole-transporting scaffold material or a dielectric scaffold material. Typically, the perovskite semiconductor in the capping layer forms a planar heterojunction with the n-type region.

The thickness of the capping layer is usually greater than the thickness of the first layer. The majority of the photoactivity (e.g. light absorption) therefore usually occurs in a capping layer.

The thickness of the capping layer is typically from 10 nm to 100 m. More typically, the thickness of the capping layer is from 10 nm to 10 m. Preferably, the thickness of the capping layer is from 50 nm to 1000 nm, or for instance from 100 nm to 700 nm.

The thickness of the capping layer may for example be from 100 nm to 100 m, or for instance from 100 nm to 700 nm. A capping layer having a thickness of at least 100 nm is usually preferred.

The thickness of the first layer, on the other hand, is often from 5 nm to 1000 nm. More typically, it is from 5 nm to 500 nm, or for instance from 30 nm to 200 nm.

The perovskite semiconductor employed in the present invention, in said layer of a perovskite semiconductor without open porosity, and, when present, in said first layer, is typically one which is capable of (i) absorbing light, and thereby generating free charge carriers; and/or (ii) emitting light, by accepting charge, both electrons and holes, which subsequently recombine and emit light.

Thus, the perovskite employed is typically a light-absorbing and/or a light-emitting perovskite.

Usually, the perovskite is a light-absorbing material. Typically a perovskite is employed which is capable of absorbing light having a wavelength of from 300 to 2000 nm (i.e. a perovskite which is capable of absorbing light that has a wavelength which falls anywhere within this range). More typically, the perovskite employed is one which is capable of absorbing light having a wavelength in the range of from 300 to 1200 nm, or, for instance, capable of absorbing light having a wavelength of from 300 to 1000 nm. More typically, the perovskite employed is one which is capable of absorbing light having a wavelength anywhere in the range of from 300 to 800 nm.

The perovskite semiconductor employed in the optoelectronic device of the invention preferably has a band gap which is narrow enough to allow the excitation of electrons by incident light. A band gap of 3.0 eV or less is particularly preferred, especially when the optoelectronic device is a photovoltaic device, because such a band gap is low enough for sunlight to excite electrons across it. Certain perovskites, including some oxide perovskites and 2D layered perovskites, have band gaps that are wider than 3.0 eV, and are therefore less preferred for use in photovoltaic devices than perovskites which have a band gap of 3.0 eV or less. Such perovskites include $CaTiO_3$, $SrTiO_3$ and $CaSrTiO_3:Pr^{3+}$, which have band gaps of around 3.7 eV, 3.5 eV and 3.5 eV respectively.

Accordingly, the perovskite semiconductor employed in the optoelectronic device of the invention typically has a band gap of equal to or less than 3.0 eV. In some embodiments, the band gap of the perovskite is less than or equal to 2.8 eV, for instance equal to or less than 2.5 eV. The band gap may for instance be less than or equal to 2.3 eV, or for instance less than or equal to 2.0 eV.

Usually, the band gap is at least 0.5 eV. Thus, the band gap of the perovskite may be from 0.5 eV to 2.8 eV. In some embodiments it is from 0.5 eV to 2.5 eV, or for example from 0.5 eV to 2.3 eV. The band gap of the perovskite may for instance be from 0.5 eV to 2.0 eV. In other embodiments, the band gap of the perovskite may be from 1.0 eV to 3.0 eV, or for instance from 1.0 eV to 2.8 eV. In some embodiments it is from 1.0 eV to 2.5 eV, or for example from 1.0 eV to 2.3 eV. The band gap of the perovskite semiconductor may for instance be from 1.0 eV to 2.0 eV.

The band gap of the perovskite is more typically from 1.2 eV to 1.8 eV. The band gaps of organometal halide perovskite semiconductors, for example, are typically in this range and may for instance, be about 1.5 eV or about 1.6 eV. Thus, in one embodiment the band gap of the perovskite is from 1.3 eV to 1.7 eV.

The perovskite semiconductor employed in the optoelectronic device of the invention typically comprises at least one anion selected from halide anions and chalcogenide anions.

The term "halide" refers to an anion of a group 7 element, i.e., of a halogen. Typically, halide refers to a fluoride anion, a chloride anion, a bromide anion, an iodide anion or an astatide anion. The term "chalcogenide anion", as used herein refers to an anion of a group 6 element, i.e. of a chalcogen. Typically, chalcogenide refers to an oxide anion, a sulphide anion, a selenide anion or a telluride anion.

In the optoelectronic device of the invention, the perovskite often comprises a first cation, a second cation, and said at least one anion.

As the skilled person will appreciate, the perovskite may comprise further cations or further anions. For instance, the perovskite may comprise two, three or four different first cations; two, three or four different second cations; or two, three of four different anions.

Typically, in the optoelectronic device of the invention, the second cation in the perovskite is a metal cation. The metal may be selected from tin, lead and copper, and is preferably selected from tin and lead.

More typically, the second cation is a divalent metal cation. For instance, the second cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Sn^{2+}$, $Yb^{2+}$ and $Eu^{2+}$. The second cation may be selected from $Sn^{2+}$, $Pb^{2+}$ and $Cu^{2+}$. Usually, the second cation is selected from $Sn^{2+}$ and $Pb^{2+}$.

In the optoelectronic device of the invention, the first cation in the perovskite is usually an organic cation.

The term "organic cation" refers to a cation comprising carbon. The cation may comprise further elements, for example, the cation may comprise hydrogen, nitrogen or oxygen.

Usually, in the optoelectronic device of the invention, the organic cation has the formula $(R_1R_2R_3R_4N)^+$, wherein:

$R_1$ is hydrogen, unsubstituted or substituted $C_1$-$C_{20}$ alkyl, or unsubstituted or substituted aryl;

$R_2$ is hydrogen, unsubstituted or substituted $C_1$-$C_{20}$ alkyl, or unsubstituted or substituted aryl;

$R_3$ is hydrogen, unsubstituted or substituted $C_1$-$C_{20}$ alkyl, or unsubstituted or substituted aryl; and $R_4$ is hydrogen, unsubstituted or substituted $C_1$-$C_{20}$ alkyl, or unsubstituted or substituted aryl.

Alternatively, the organic cation may have the formula $(R_5NH_3)$, wherein: $R_5$ is hydrogen, or unsubstituted or substituted $C_1$-$C_{20}$ alkyl. For instance, $R_5$ may be methyl or ethyl. Typically, $R_5$ is methyl.

In some embodiments, the organic cation has the formula $(R_5R_6N=CH—NR_7R_8)^+$, wherein: $R_5$ is hydrogen, unsubstituted or substituted $C_1$-$C_{20}$ alkyl, or unsubstituted or substituted aryl; $R_6$ is hydrogen, unsubstituted or substituted $C_1$-$C_{20}$ alkyl, or unsubstituted or substituted aryl; $R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl.

Typically, $R_5$ in the cation $(R_5R_6N=CH—NR_7R_8)^+$ is hydrogen, methyl or ethyl, $R_6$ is hydrogen, methyl or ethyl, $R_7$ is hydrogen, methyl or ethyl, and $R_8$ is hydrogen, methyl or ethyl. For instance $R_5$ may be hydrogen or methyl, $R_6$ may be hydrogen or methyl, $R_7$ may be hydrogen or methyl, and $R_8$ may be hydrogen or methyl.

The organic cation may, for example, have the formula $(H_2N=CH—NH_2)^+$.

As used herein, an alkyl group can be a substituted or unsubstituted, linear or branched chain saturated radical, it is often a substituted or an unsubstituted linear chain saturated radical, more often an unsubstituted linear chain saturated radical. A $C_1$-$C_{20}$ alkyl group is an unsubstituted or substituted, straight or branched chain saturated hydrocarbon radical. Typically it is $C_1$-$C_{10}$ alkyl, for example methyl, ethyl, propyl, butyl, pentyl, hexyl, heptyl, octyl, nonyl or decyl, or $C_1$-$C_6$ alkyl, for example methyl, ethyl, propyl, butyl, pentyl or hexyl, or $C_1$-$C_4$ alkyl, for example methyl, ethyl, i-propyl, n-propyl, t-butyl, s-butyl or n-butyl.

When an alkyl group is substituted it typically bears one or more substituents selected from substituted or unsubstituted $C_1$-$C_{20}$ alkyl, substituted or unsubstituted aryl (as defined herein), cyano, amino, $C_1$-$C_{10}$ alkylamino, di($C_1$-$C_{10}$)alkylamino, arylamino, diarylamino, arylalkylamino, amido, acylamido, hydroxy, oxo, halo, carboxy, ester, acyl, acyloxy, $C_1$-$C_2$ alkoxy, aryloxy, haloalkyl, sulfonic acid, sulfhydryl (i.e. thiol, —SH), $C_1$-$C_{10}$ alkylthio, arylthio, sulfonyl, phosphoric acid, phosphate ester, phosphonic acid and phosphonate ester. Examples of substituted alkyl groups include haloalkyl, hydroxyalkyl, aminoalkyl, alkoxyalkyl and alkaryl groups. The term alkaryl, as used herein, pertains to a $C_1$-$C_2$ alkyl group in which at least one hydrogen atom has been replaced with an aryl group. Examples of such groups include, but are not limited to, benzyl (phenylmethyl, $PhCH_2$—), benzhydryl ($Ph_2CH$—), trityl (triphenylmethyl, $Ph_3C$—), phenethyl (phenylethyl, $Ph-CH_2CH_2$—), styryl ($Ph-CH=CH$—), cinnamyl ($Ph-CH=CH—CH_2$—).

Typically a substituted alkyl group carries 1, 2 or 3 substituents, for instance 1 or 2.

An aryl group is a substituted or unsubstituted, monocyclic or bicyclic aromatic group which typically contains from 6 to 14 carbon atoms, preferably from 6 to 10 carbon atoms in the ring portion. Examples include phenyl, naphthyl, indenyl and indanyl groups. An aryl group is unsubstituted or substituted. When an aryl group as defined above is substituted it typically bears one or more substituents selected from $C_1$-$C_6$ alkyl which is unsubstituted (to form an aralkyl group), aryl which is unsubstituted, cyano, amino, $C_1$-$C_{10}$ alkylamino, di($C_1$-$C_{10}$)alkylamino, arylamino, diarylamino, arylalkylamino, amido, acylamido, hydroxy, halo, carboxy, ester, acyl, acyloxy, $C_1$-$C_{20}$ alkoxy, aryloxy, haloalkyl, sulfhydryl (i.e. thiol, —SH), $C_{1-10}$ alkylthio, arylthio, sulfonic acid, phosphoric acid, phosphate ester, phosphonic acid and phosphonate ester and sulfonyl. Typically it carries 0, 1, 2 or 3 substituents. A substituted aryl group may be substituted in two positions with a single $C_1$-$C_6$ alkylene group, or with a bidentate group represented by the formula —X—($C_1$-$C_6$)alkylene, or —X—($C_1$-$C_6$)alkylene-X—, wherein X is selected from O, S and NR, and wherein R is H, aryl or $C_1$-$C_6$ alkyl. Thus a substituted aryl group may be an aryl group fused with a cycloalkyl group or with a heterocyclyl group. The ring atoms of an aryl group may include one or more heteroatoms (as in a heteroaryl group). Such an aryl group (a heteroaryl group) is a substituted or unsubstituted mono- or bicyclic heteroaromatic group which typically contains from 6 to 10 atoms in the ring portion including one or more heteroatoms. It is generally a 5- or 6-membered ring, containing at least one heteroatom selected from O, S, N, P, Se and Si. It may contain, for example, 1, 2 or 3 heteroatoms. Examples of heteroaryl groups include pyridyl, pyrazinyl, pyrimidinyl, pyridazinyl, furanyl, thienyl, pyrazolidinyl, pyrrolyl, oxazolyl, oxadiazolyl, isoxazolyl, thiadiazolyl, thiazolyl, isothiazolyl, imidazolyl, pyrazolyl, quinolyl and isoquinolyl. A heteroaryl group may be unsubstituted or substituted, for instance, as specified above for aryl. Typically it carries 0, 1, 2 or 3 substituents.

Mainly, in the optoelectronic device of the invention, $R_1$ in the organic cation is hydrogen, methyl or ethyl, $R_2$ is hydrogen, methyl or ethyl, $R_3$ is hydrogen, methyl or ethyl, and $R_4$ is hydrogen, methyl or ethyl. For instance $R_1$ may be hydrogen or methyl, $R_2$ may be hydrogen or methyl, $R_3$ may be hydrogen or methyl, and $R_4$ may be hydrogen or methyl.

Alternatively, the organic cation may have the formula $(R_5NH_3)^+$, wherein: $R_5$ is hydrogen, or unsubstituted or substituted $C_1$-$C_2$ alkyl. For instance, $R_5$ may be methyl or ethyl. Typically, $R_5$ is methyl.

In one embodiment, the perovskite is a mixed-anion perovskite comprising two or more different anions selected from halide anions and chalcogenide anions. Usually, said two or more different anions are two or more different halide anions.

Thus, the perovskite employed may be a mixed-anion perovskite comprising a first cation, a second cation, and two or more different anions selected from halide anions and chalcogenide anions. For instance, the mixed-anion perovskite may comprise two different anions and, for instance, the anions may be a halide anion and a chalcogenide anion, two different halide anions or two different chalcogenide anions. The first and second cations may be as further defined hereinbefore. Thus the first cation may be an organic cation, which may be as further defined herein. For instance it may be a cation of formula $(R_1R_2R_3R_4N)^+$, or formula $(R_5NH_3)^+$, as defined above. Alternatively, the organic cation may be a cation of formula $[R_5R_6N=CH—NR_7R_8]^+$ as defined above. The second cation may be a divalent metal cation. For instance, the second cation may be selected from $Ca^{2+}$ $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. Usually, the second cation is selected from $Sn^{2+}$ and $Pb^{2+}$.

In the optoelectronic device of the invention, the perovskite is usually a mixed-halide perovskite, wherein said two or more different anions are two or more different halide anions. Typically, they are two or three halide anions, more typically, two different halide anions. Usually the halide anions are selected from fluoride, chloride, bromide and iodide, for instance chloride, bromide and iodide.

Often, in the optoelectronic device of the invention, the perovskite is a perovskite compound of the formula (I):

$$[A][B][X]_3 \qquad (I)$$

wherein:
[A] is at least one organic cation;
[B] is at least one metal cation; and
[X] is said at least one anion.

The perovskite of formula (I) may comprise one, two, three or four different metal cations, typically one or two different metal cations. Also, the perovskite of the formula (I), may, for instance, comprise one, two, three or four different organic cations, typically one or two different organic cations. Likewise, the perovskite of formula (I), may, comprise one two, three or four different anions, typically two or three different anions.

The organic and metal cations in the perovskite compound of formula (I) may be as further defined hereinbefore. Thus the organic cations may be selected from cations of formula $(R_1R_2R_3R_4N)$ and cations of formula $(R_5NH_3)$, as defined above. The metal cations may be selected from divalent metal cations. For instance, the metal cations may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. Usually, the metal cation is $Sn^{2+}$ or $Pb^{2+}$.

The organic cation may, for instance, be selected from cations of formula $(R_5R_6N=CH-NR_7R_8)^+$, and cations of formula $(H_2N=CH-NH_2)^+$, as defined above. The metal cations may be selected from divalent metal cations. For instance, the metal cations may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^2$, $Yb^{2+}$ and $Eu^{2+}$. Usually, the metal cation is $Sn^{2+}$ or $Pb^{2+}$.

Typically, [X] in formula (I) is two or more different anions selected from halide anions and chalcogenide anions. More typically, [X] is two or more different halide anions.

In one embodiment, the perovskite is a perovskite compound of the formula (IA):

$$AB[X]_3 \qquad (IA)$$

wherein:
A is an organic cation;
B is a metal cation; and
[X] is two or more different halide anions.

Typically, [X] in formula (IA) is two or more different anions selected from halide anions and chalcogenide anions. Usually, [X] is two or more different halide anions. Preferably, [X] is two or three different halide anions. More preferably, [X] is two different halide anions. In another embodiment [X] is three different halide anions.

The organic and metal cations in the perovskite compound of formula (IA) may be as further defined hereinbefore. Thus the organic cation may be selected from cations of formula $(R_1R_2R_3R_4N)^+$ and cations of formula $(R_5NH_3)^+$, as defined above. The metal cation may be a divalent metal cation. For instance, the metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. Usually, the metal cation is $Sn^{2+}$ or $Pb^{2+}$.

The organic cation may, for instance, be selected from cations of formula $(R_5R_6N=CH-NR_7R_8)^+$, and cations of formula $(H_2N=CH-NH_2)^+$, as defined above. The metal cation may be a divalent metal cation. For instance, the metal cation may be selected from $Ca^{2+}$, $Sr^{2+}$, $Cd^{2+}$, $Cu^{2+}$, $Ni^{2+}$, $Mn^{2+}$, $Fe^{2+}$, $C_{2+}$,$Pd^{2+}$, $Ge^{2+}$, $Sn^{2+}$, $Pb^{2+}$, $Yb^{2+}$ and $Eu^{2+}$. Usually, the metal cation is $Sn^{2+}$ or $Pb^{2+}$.

Typically, in the optoelectronic device of the invention, the perovskite is a perovskite compound of formula (II):

$$ABX_{3-y}X'_y \qquad (II)$$

wherein:
A is an organic cation;
B is a metal cation;
X is a first halide anion;
X' is a second halide anion which is different from the first halide anion; and
y is from 0.05 to 2.95.

Usually, y is from 0.5 to 2.5, for instance from 0.75 to 2.25. Typically, y is from 1 to 2.

Again, in formula (II), the organic and metal cations may be as further defined hereinbefore. Thus the organic cation may be a cation of formula $(R_1R_2R_3R_4N)^+$ or, more typically, a cation of formula $(R_5NH_3)^+$, as defined above. The metal cation may be a divalent metal cation. For instance, the metal cation may be selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. Usually, the metal cation is $Sn^{2+}$ or $Pb^{2+}$.

In some embodiments, the perovskite is a perovskite compound of formula (IIa):

$$ABX_{3z}X'_{3(1-z)} \qquad (IIa)$$

wherein:
A is an organic cation of the formula $(R_5R_6N=CH-NR_7R_8)^+$, wherein: $R_5$ is hydrogen, unsubstituted or substituted $C_1$-$C_2$ alkyl, or unsubstituted or substituted aryl; $R_6$ is hydrogen, unsubstituted or substituted $C_1$-$C_2$ alkyl, or unsubstituted or substituted aryl; $R_7$ is hydrogen, unsubstituted or substituted $C_1$-$C_2$ alkyl, or unsubstituted or substituted aryl; and $R_8$ is hydrogen, unsubstituted or substituted $C_1$-$C_2$ alkyl, or unsubstituted or substituted aryl;
B is a metal cation;
X is a first halide anion;
X' is a second halide anion which is different from the first halide anion; and
z is greater than 0 and less than 1.

Usually, z is from 0.05 to 0.95.

Usually, z is from 0.1 to 0.9. z may, for instance, be 0.1, 0.2, 0.3, 0.4, 0.5, 0.6, 0.7, 0.8 or 0.9, or z may be a range of from any one of these values to any other of these values (for instance, from 0.2 to 0.7, or from 0.1 to 0.8).

B, X and X' may be as defined hereinbefore. The organic cation may, for instance, be $(R_5R_6N=CH-NR_7R_8)^+$, wherein: $R_5$, $R_6$, $R_7$ and $R_8$ are independently selected from hydrogen and unsubstituted or substituted $C_1$-$C_6$ alkyl. For instance, the organic cation may be $(H_2N=CH-NH_2)^+$.

Often, in the optoelectronic device of the invention, the perovskite is a perovskite compound selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbBrCl_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$.

For instance, in the optoelectronic device of the invention, the perovskites may be selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3Pb_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$.

Typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnICl_2$, $CH_3NH_3SnF_2I$, $CH_3NH_3SnI_2Cl$ and $CH_3NH_3SnF_2Cl$.

More typically, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnF_2Br$, $CH_3NH_3SnF_2I$ and $CH_3NH_3SnF_2Cl$.

Usually, the perovskite is selected from $CH_3NH_3PbBrI_2$, $CH_3NH_3PbBrCl_2$, $CH_3NH_3PbIBr_2$, $CH_3NH_3PbICl_2$, $CH_3NH_3SnF_2Br$, and $CH_3NH_3SnF_2I$.

Often, the perovskite employed is $CH_3NH_3PbCl_2I$.

In some embodiments, the perovskite may be a perovskite of formula $(H_2N=CH-NH_2)PbI_{3z}Br_{3(1-z)}$, wherein z is greater than 0 or less than 1. z may be as further defined hereinbefore.

The perovskite semiconductor employed in the optoelectronic device of the invention may comprise said mixed-anion perovskite and a single-anion perovskite, for instance in a blend, wherein said single anion perovskite comprises a first cation, a second cation and an anion selected from halide anions and chalcogenide anions; wherein the first and second cations are as herein defined for said mixed-anion perovskite. For instance, the optoelectronic device may comprise: $CH_3NH_3PbICl_2$ and $CH_3NH_3PbI_3$; $CH_3NH_3PbICl_2$ and $CH_3NH_3PbBr_3$; $CH_3NH_3PbBrCl_2$ and $CH_3NH_3PbI_3$; or $CH_3NH_3PbBrCl_2$ and $CH_3NH_3PbBr_3$.

The optoelectronic device may comprise a perovskite of formula $(H_2N=CH-NH_2)PbI_{3z}Br_{3\,(1-z)}$, wherein z is as defined herein, and a single-anion perovskite such as $(H_2N=CH-NH_2)PbI_3$ or $(H_2N=CH-NH_2)PbBr_3$.

Alternatively, the perovskite semiconductor employed in the optoelectronic device of the invention may comprise more than one perovskite, wherein each perovskite is a mixed-anion perovskite, and wherein said mixed-anion perovskite is as herein defined. For instance, the optoelectronic device may comprise two or three said perovskites. The optoelectronic device of the invention may, for instance, comprise two perovskites wherein both perovskites are mixed-anion perovskites. For instance, the optoelectronic device may comprise: $CH_3NH_3PbICl_2$ and $CH_3NH_3PbIBr_2$; $CH_3NH_3PbICl_2$ and $CH_3NH_3PbRI_2$; $CH_3NH_3PbBrCl_2$ and $CH_3NH_3PbIBr_2$; or $CH_3NH_3PbBrCl_2$ and $CH_3NH_3PbIBr_2$.

The optoelectronic device may comprise two different perovskites, wherein each perovskite is a perovskite of formula $(H_2N=CH-NH_2)PbI_{3z}Br_{3\,(1-z)}$, wherein z is as defined herein.

In some embodiments of the optoelectronic device of the invention, when [B] is a single metal cation which is $Pb^{2+}$, one of said two or more different halide anions is iodide or fluoride; and when [B] is a single metal cation which is $Sn^{2+}$ one of said two or more different halide anions is fluoride. Usually, in some embodiments of the optoelectronic device of the invention, one of said two or more different halide anions is iodide or fluoride. Typically, in some embodiments of the optoelectronic device of the invention, one of said two or more different halide anions is iodide and another of said two or more different halide anions is fluoride or chloride. Often, in some embodiments of the optoelectronic device of the invention, one of said two or more different halide anions is fluoride. Typically, in some embodiments of the optoelectronic device of the invention, either: (a) one of said two or more different anions is fluoride and another of said two or more different anions is chloride, bromide or iodide; or (b) one of said two or more different anions is iodide and another of said two or more different anions is fluoride or chloride. Typically, [X] is two different halide anions X and X'. Often, in the optoelectronic device of the invention, said divalent metal cation is $Sn^{2+}$. Alternatively, in the optoelectronic device of the invention, said divalent metal cation may be $Pb^{2+}$.

The n-type region in the optoelectronic device of the invention comprises one or more n-type layers. Often, the n-type region is an n-type layer, i.e. a single n-type layer. In other embodiments, however, the n-type region may comprise an n-type layer and an n-type exciton blocking layer. In cases where an n-type exciton blocking layer is employed, the n-type exciton blocking layer is usually disposed between the n-type layer and the layer(s) comprising the perovskite semiconductor.

An exciton blocking layer is a material which is of wider bad gap than the perovskite, but has either its conduction band or valance band closely matched with those of the perovskite. If the conduction band (or lowest unoccupied molecular orbital energy levels) of the exciton blocking layer are closely aligned with the conduction band of the perovskite, then electrons can pass from the perovskite into and through the exciton blocking layer, or through the exciton blocking layer and into the perovskite, and we term this an n-type exciton blocking layer. An example of such is bathocuproine, as described in {P. Peumans, A. Yakimov, and S. R. Forrest, "Small molecular weight organic thin-film photodetectors and solar cells" J. Appl. Phys. 93, 3693 (2001)} and {Masaya Hirade, and Chihaya Adachi, "Small molecular organic photovoltaic cells with exciton blocking layer at anode interface for improved device performance" Appl. Phys. Lett. 99, 153302 (2011)}.

An n-type layer is a layer of an electron-transporting (i.e. an n-type) material. The n-type material may be a single n-type compound or elemental material, or a mixture of two or more n-type compounds or elemental materials, which may be undoped or doped with one or more dopant elements.

The n-type layer employed in the optoelectronic device of the invention may comprise an inorganic or an organic n-type material.

A suitable inorganic n-type material may be selected from a metal oxide, a metal sulphide, a metal selenide, a metal telluride, a perovskite, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped.

The n-type material may be selected from a metal oxide, a metal sulphide, a metal selenide, a metal telluride, amorphous Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped.

More typically, the n-type material is selected from a metal oxide, a metal sulphide, a metal selenide, and a metal telluride.

Thus, the n-type layer may comprise an inorganic material selected from oxide of titanium, tin, zinc, niobium, tantalum, tungsten, indium, gallium, neodinium, palladium, or cadmium, or an oxide of a mixture of two or more of said metals. For instance, the n-type layer may comprise $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, or $CdO$.

Other suitable n-type materials that may be employed include sulphides of cadmium, tin, copper, or zinc, including sulphides of a mixture of two or more of said metals. For instance, the sulphide may be $FeS_2$, $CdS$, $ZnS$ or $Cu_2ZnSnS_4$.

The n-type layer may for instance comprise a selenide of cadmium, zinc, indium, or gallium or a selenide of a mixture of two or more of said metals; or a telluride of cadmium, zinc, cadmium or tin, or a telluride of a mixture of two or more of said metals. For instance, the selenide may be Cu(In,Ga)Se$_2$. Typically, the telluride is a telluride of cadmium, zinc, cadmium or tin. For instance, the telluride may be CdTe.

The n-type layer may for instance comprise an inorganic material selected from oxide of titanium, tin, zinc, niobium, tantalum, tungsten, indium, gallium, neodinium, palladium, cadmium, or an oxide of a mixture of two or more of said metals; a sulphide of cadmium, tin, copper, zinc or a sulphide of a mixture of two or more of said metals; a selenide of cadmium, zinc, indium, gallium or a selenide of a mixture of two or more of said metals; or a telluride of cadmium, zinc, cadmium or tin, or a telluride of a mixture of two or more of said metals.

Examples of other semiconductors that may be suitable n-type materials, for instance if they are n-doped, include group IV compound semiconductors; amorphous Si; group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide).

Typically, the n-type layer comprises TiO$_2$.

When the n-type layer is an inorganic material, for instance TiO$_2$ or any of the other materials listed above, it may be a compact layer of said inorganic material. Preferably the n-type layer is a compact layer of TiO$_2$.

Other n-type materials may also be employed, including organic and polymeric electron-transporting materials, and electrolytes. Suitable examples include, but are not limited to a fullerene or a fullerene derivative, an organic electron transporting material comprising perylene or a derivative thereof, or poly{[N,N0-bis(2-octyldodecyl)-naphthalene-1, 4,5,8-bis(dicarboximide)-2,6-diyl]-alt-5,50-(2,20-bithiophene)}(P(NDI2OD-T2)).

The p-type region in the optoelectronic device of the invention comprises one or more p-type layers. Often, the p-type region is a p-type layer, i.e. a single p-type layer. In other embodiments, however, the p-type region may comprise a p-type layer and a p-type exciton blocking layer. In cases where a p-type exciton blocking layer is employed, the p-type exciton blocking layer is usually disposed between the p-type layer and the layer(s) comprising the perovskite semiconductor. If the valance band (or highest occupied molecular orbital energy levels) of the exciton blocking layer is closely aligned with the valance band of the perovskite, then holes can pass from the perovskite into and through the exciton blocking layer, or through the exciton blocking layer and into the perovskite, and we term this a p-type exciton blocking layer. An example of such is tris[4-(5-phenylthiophen-2-yl)phenyl]amine, as described in {Masaya Hirade, and Chihaya Adachi, "Small molecular organic photovoltaic cells with exciton blocking layer at anode interface for improved device performance" Appl. Phys. Lett. 99, 153302 (2011)}.

A p-type layer is a layer of a hole-transporting (i.e. a p-type) material. The p-type material may be a single p-type compound or elemental material, or a mixture of two or more p-type compounds or elemental materials, which may be undoped or doped with one or more dopant elements.

The p-type layer employed in the optoelectronic device of the invention may comprise an inorganic or an organic p-type material.

Suitable p-type materials may be selected from polymeric or molecular hole transporters. The p-type layer employed in the optoelectronic device of the invention may for instance comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b'] dithiophene-2,6-diyl]]), PVK (poly(N-vinylcarbazole)), HTM-TFSI (1-hexyl-3-methylimidazolium bis(trifluoromethylsulfonyl)imide), Li-TFSI (lithium bis(trifluoromethanesulfonyl)imide) or tBP (tert-butylpyridine). Usually, the p-type material is selected from spiro-OMeTAD, P3HT, PCPDTBT and PVK. Preferably, the p-type layer employed in the optoelectronic device of the invention comprises spiro-OMeTAD.

The p-type layer may for example comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]), or PVK (poly(N-vinylcarbazole)).

Suitable p-type materials also include molecular hole transporters, polymeric hole transporters and copolymer hole transporters. The p-type material may for instance be a molecular hole transporting material, a polymer or copolymer comprising one or more of the following moieties: thiophenyl, phenelenyl, dithiazolyl, benzothiazolyl, diketopyrrolopyrrolyl, ethoxydithiophenyl, amino, triphenyl amino, carbozolyl, ethylene dioxythiophenyl, dioxythiophenyl, or fluorenyl. Thus, the p-type layer employed in the optoelectronic device of the invention may for instance comprise any of the aforementioned molecular hole transporting materials, polymers or copolymers.

Suitable p-type materials also include m-MTDATA (4,4', 4"-tris(methylphenylphenylamino)triphenylamine), MeOTPD (N,N,N',N'-tetrakis(4-methoxyphenyl)-benzidine), BP2T (5,5'-di(biphenyl-4-yl)-2,2'-bithiophene), Di-NPB (N,N-Di-[(1-naphthyl)-N,N-diphenyl]-1,1'-biphenyl)-4,4'-diamine), α-NPB (N,N'-di(naphthalen-1-yl)-N,N'-diphenyl-benzidine), TNATA (4,4',4"-tris-(N-(naphthylen-2-yl)-N-phenylamine)triphenylamine), BPAPF (9,9-bis[4-(N, N-bis-biphenyl-4-yl-amino)phenyl]-9H-fluorene), spiro-NPB (N2,N7-Di-1-naphthalenyl-N2,N7-diphenyl-9,9'-spirobi[9H-fluorene]-2,7-diamine), 4P-TPD (4,4'-bis-(N,N-diphenylamino)-tetraphenyl), PEDOT:PSS and spiro-OMeTAD.

The p-type layer may be doped with an ionic salt or a base. The p-type layer may for instance be doped with an ionic salt selected from HMI-TFSI (1-hexyl-3-methylimidazolium bis(trifluoromethylsulfonyl)imide) and Li-TFSI (lithium bis(trifluoromethaneslfonyl)imide), or with a base which is tBP (tert-butylpyridine).

Additionally or alternatively, the p-type layer may be doped to increase the hole-density. The p-type layer may for instance be doped with NOBF$_4$ (Nitrosonium tetrafluoroborate), to increase the hole-density.

In other embodiments, the p-type layer may comprise an inorganic hole transporter. For instance, the p-type layer may comprise an inorganic hole transporter comprising an oxide of nickel, vanadium, copper or molybdenum; CuI, CuBr, CuSCN, Cu$_2$O, CuO or CIS; a perovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. The p-type layer may be a compact layer of said inorganic hole transporter.

The p-type layer may for instance comprise an inorganic hole transporter comprising an oxide of nickel, vanadium, copper or molybdenum; CuI, CuBr, CuSCN, Cu$_2$, CuO or CIS; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. The p-type layer may for instance comprise an inorganic hole transporter selected from CuI, CuBr, CuSCN, $Cu_2O$, CuO and CIS. The p-type layer may be a compact layer of said inorganic hole transporter.

Typically, the p-type layer comprises a polymeric or molecular hole transporter, and the n-type layer comprises an inorganic n-type material. The p-type polymeric or molecular hole transporter may be any suitable polymeric or molecular hole transporter, for instance any of those listed above. Likewise, the inorganic n-type material may be any suitable n-type inorganic, for instance any of those listed above. In one embodiment, for instance, the p-type layer comprises spiro-OMeTAD and the n-type layer comprises $TiO_2$. Typically, in that embodiment, the n-type layer which comprises $TiO_2$ is a compact layer of $TiO_2$.

In other embodiments, both the n-type layer and the p-type layer comprise inorganic materials. Thus, the n-type layer may comprise an inorganic n-type material and the p-type layer may comprise an inorganic p-type material. The inorganic p-type material may be any suitable p-type inorganic, for instance any of those listed above. Likewise, the inorganic n-type material may be any suitable n-type inorganic, for instance any of those listed above.

In yet other embodiments, the p-type layer comprises an inorganic p-type material (i.e. an inorganic hole transporter) and the n-type layer comprises a polymeric or molecular hole transporter. The inorganic p-type material may be any suitable p-type inorganic, for instance any of those listed above. Likewise, the n-type polymeric or molecular hole transporter may be any suitable n-type polymeric or molecular hole transporter, for instance any of those listed above.

For instance, the p-type layer may comprise an inorganic hole transporter and the n-type layer may comprise an electron transporting material, wherein the electron transporting material comprises a fullerene or a fullerene derivative, an electrolyte, or an organic electron transporting material, preferably wherein the organic electron transporting material comprises perylene or a derivative thereof, or poly{[N,N0-bis(2-octyldodecyl)-naphthalene-1,4,5,8-bis(dicarboximide)-2,6-diyl]-alt-5,50-(2,20-bithiophene)}(P(NDI2OD-T2)). The inorganic hole transporter may for instance comprise an oxide of nickel, vanadium, copper or molybdenum; CuI, CuBr, CuSCN, $Cu_2O$, CuO or CIS; a perovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. More typically, the inorganic hole transporter comprises an oxide of nickel, vanadium, copper or molybdenum; CuI, CuBr, CuSCN, $Cu_2O$, CuO or CIS; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. Thus, the inorganic hole transporter may comprise an oxide of nickel, vanadium, copper or molybdenum; CuI, CuBr, CuSCN, $Cu_2O$, CuO or CIS.

Paragraphs which follow concern the use of a second, p-type perovskite, in the p-type layer, or a second, n-type perovskite, in the n-type layer. (In preferred embodiments, though, neither the p-type layer nor the n-type layer comprises a perovskite. Thus, preferably, neither the p-type region nor the n-type region comprises a perovskite.)

When the p-type layer comprises an inorganic hole transporter which is a perovskite, the perovskite is different from the perovskite used in said layer of a perovskite semiconductor without open porosity, and, when present, in said "first layer" which also comprises the scaffold material. Thus, when the p-type layer comprises an inorganic hole transporter which is a perovskite, the perovskite of the p-type layer is termed herein a "second perovskite" (and the perovskite in said layer of a perovskite semiconductor without open porosity, and, when present, in said first layer, is referred to herein as the "first perovskite").

Similarly, when the n-type layer comprises an inorganic electron transporter which is a perovskite, the perovskite will be different from the perovskite used in said layer of a perovskite semiconductor without open porosity, and, when present, in said "first layer" which also comprises the scaffold material. Thus, when the n-type layer comprises an inorganic electron transporter which is a perovskite, the perovskite is herein termed a "second perovskite" (and the perovskite in said layer of a perovskite semiconductor without open porosity, and, when present, in said "first layer", is referred to herein as the "first perovskite").

The skilled person will appreciate that the addition of a doping agent to a perovskite may be used to control the charge transfer properties of that perovskite. Thus, for instance, a perovskite that is an intrinsic material may be doped to form an n-type or a p-type material. Accordingly, the first perovskite and/or the second perovskite may comprise one or more doping agents. Typically the doping agent is a dopant element.

The addition of different doping agents to different samples of the same material may result in the different samples having different charge transfer properties. For instance, the addition of one doping agent to a first sample of perovskite material may result in the first sample becoming an n-type material, whilst the addition of a different doping agent to a second sample of the same perovskite material may result in the second sample becoming a p-type material.

Thus, at least one of the first and second perovskites may comprise a doping agent. The first perovskite may for instance comprise a doping agent that is not present in the or each second perovskite. Additionally or alternatively, the, or one of the, second perovskites, may comprise a doping agent that is not present in the first perovskite. Thus the difference between the first and second perovskites may be the presence or absence of a doping agent, or it may be the use of a different doping agent in each perovskite. Alternatively, the difference between the first and second perovskites may not lie in the doping agent but instead the difference may lie in the overall structure of the first and second perovskites.

The second perovskite, when present, may be a perovskite comprising a first cation, a second cation, and at least one anion.

In some embodiments, the second perovskite which is employed in the p-type or the n-type layer, which is different from the first perovskite, is a perovskite compound of formula (IB):

$$[A][B][X]_3 \qquad (IB)$$

wherein:

[A] is at least one organic cation or at least one Group I metal cation;
[B] is at least one metal cation; and
[X] is at least one anion.

As the skilled person will appreciate, [A] may comprise $Cs^+$.

Usually, [B] comprises $Pb^{2+}$ or $Sn^{2+}$. More typically, [B] comprises $Pb^{2+}$.

Typically, [X] comprises a halide anion or a plurality of different halide anions.

Usually, [X] comprises P.

In some embodiments, [X] is two or more different anions, for instance, two or more different halide anions. For instance, [X] may comprise $I^-$ and $F^-$, $I^-$ and $Br^-$ or $I^-$ and $Cl^-$.

Usually, the perovskite compound of formula IB is $CsPbI_3$ or $CsSnI_3$. For instance, the perovskite compound of formula (IB) may be $CsPbI_3$.

Alternatively, the perovskite compound of formula (IB) may be $CsPbI_2Cl$, $CsPbICl_2$, $CsPbI_2F$, $CsPbIF_2$, $CsPbI_2Br$, $CsPbIBr_2$, $CsSnI_2Cl$, $CsSnICl_2$, $CsSnI_2F$, $CsSnIF_2$, $CsSnI_2Br$ or $CsSnIBr_2$. For instance, the perovskite compound of formula (IB) may be $CsPbI_2Cl$ or $CsPbICl_2$. Typically, the perovskite compound of formula (IB) is $CsPbICl_2$.

In the perovskite compound of formula (IB): [X] may be one, two or more different anions as defined herein, for instance, two or more different anions as defined herein for the first perovskite; [A] usually comprises an organic cation as defined herein, as above for the first perovskite; and [B] typically comprises a metal cation as defined herein. The metal cation may be defined as hereinbefore for the first perovskite.

In some embodiments, the second perovskite is a perovskite as defined for the first perovskite hereinabove, provided that the second perovskite is different from the first perovskite.

The scaffold material which is employed in the embodiments of the optoelectronic device of the invention which comprise said first layer, may be a dielectric scaffold material. Usually, the dielectric scaffold material has a band gap of equal to or greater than 4.0 eV.

Usually, in the optoelectronic device of the invention, the dielectric scaffold material comprises an oxide of aluminium, zirconium, silicon, yttrium or ytterbium. For instance, the dielectric scaffold material may comprise zirconium oxide, silica, alumina, ytterbium oxide or yttrium oxide; or alumina silicate. Often, dielectric scaffold material comprises silica, or alumina. More typically, the dielectric scaffold material comprises porous alumina.

Typically, in the optoelectronic device of the invention, the dielectric scaffold material is mesoporous. Thus, typically, in the optoelectronic device of the invention, the dielectric scaffold material comprises mesoporous alumina.

Alternatively, the scaffold material may be an inorganic electron-transporting material, such as, for instance, titania. Thus, for instance, the scaffold material may comprise an oxide of titanium, tin, zinc, niobium, tantalum, tungsten, indium, gallium, neodinium, palladium or cadmium. For instance, the scaffold material may comprise $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, or $CdO$. Often, the scaffold material comprises a mesoporous oxide of titanium, tin, zinc, niobium, tantalum, tungsten, indium, gallium, neodinium, palladium or cadmium or a mixture thereof. Titania, porous titania, and mesoporous titania are preferred. Typically, in such embodiments, the scaffold material comprises porous titania, preferably mesoporous titania.

The scaffold material may for instance comprise an inorganic hole transporting material.

The scaffold material may on the other hand be an inorganic hole transporting material. Thus, the scaffold material may for instance comprise an oxide of nickel, vanadium, copper or molybdenum, CuI, CuBr, CuSCN, $Cu_2O$, CuO or CIS.

The porosity of the scaffold material employed in the embodiments of the optoelectronic device of the invention which comprise said first layer, is usually equal to or greater than 50%. For instance, the porosity may be about 70%. In one embodiment, the porosity is equal to or greater than 60%, for instance equal to or greater than 70%.

Typically, in the optoelectronic device of the invention, the thickness of the photoactive region is from 100 nm to 3000 nm, for instance from 200 nm to 1000 nm, or for instance the thickness may be from 300 nm to 800 nm. Often, thickness of the photoactive layer is from 400 nm to 600 nm. Usually the thickness is about 500 nm.

The optoelectronic device of the invention usually comprises a first electrode and a second electrode. Thus, the optoelectronic device of the invention typically comprises a first electrode, a second electrode, and, disposed between the first and second electrodes, said photoactive region.

The first and second electrodes are an anode and a cathode, and usually one or both of the anode and cathode is transparent to allow the ingress of light. At least one of the electrodes is usually semi-transparent across the visible to near Infrared region of the solar spectrum. Semi-transparent is with a transparency of typically 80%, and ranging from 40 to 90%. The choice of the first and second electrodes of the optoelectronic devices of the present invention may depend on the structure type. Typically, the first layer of the device is deposited onto the first electrode which comprises tin oxide, more typically onto a fluorine-doped tin oxide (FTO) anode, which is usually a transparent or semi-transparent material. Thus, the first electrode is usually transparent and typically comprises tin oxide, more typically fluorine-doped tin oxide (FTO). Usually, the thickness of the first electrode is from 200 nm to 600 nm, more typically from 300 to 500 nm. For instance the thickness may be 400 nm. Typically, FTO is coated onto a glass sheet. Usually, the second electrode comprises a high work function metal, for instance gold, silver, nickel, palladium or platinum, and typically silver. Usually, the thickness of the second electrode is from 50 nm to 250 nm, more usually from 100 nm to 200 nm. For instance, the thickness of the second electrode may be 150 nm.

Often, the first electrode will comprise a transparent or semi-transparent electrically conductive material. For instance, the first electrode may comprise a transparent conducting oxide. Transparent conducting oxides include tin oxide, zinc oxide, doped tin oxide and doped zinc oxide. For example, the first electrode may comprise ITO (indium tin oxide), FTO (fluorine-doped tin oxide) or AZO (aluminium-doped tin oxide), preferably FTO. The first electrode may comprise from 90 to 100 wt % of ITO, FTO or AZO, and in some cases the first electrode may consist essentially of ITO, FTO or AZO. Usually, the thickness of the first electrode is from 200 nm to 600 nm, more typically from 300 to 500 nm. For instance, the thickness may be 400 nm. The first electrode will often be disposed on a glass substrate. For instance, the first electrode may comprise FTO and may be disposed on a glass substrate. In the optoelectronic devices of the invention, the ingress and/or egress of light typically occurs through the first electrode as it is often transparent or semi-transparent. It is possible for light to enter a device through a metal electrode (such as the second electrode may often be), particularly if the metal electrode forms a thin layer.

Often, the second electrode comprises a metal. Usually, the second electrode comprises a high work function metal, for instance aluminium, gold, silver, nickel, palladium or platinum, and typically silver or gold. Usually, the thickness of the second electrode is from 50 nm to 250 nm, more usually from 100 nm to 200 nm. For instance, the thickness of the second electrode may be 150 nm.

In one embodiment of the invention, the optoelectronic device of the invention may comprise a first electrode, a second electrode, and, disposed between the first and second electrodes, said photoactive region; wherein the first electrode is in contact with the n-type region of said photoactive region and the second electrode is in contact with the p-type region of said photoactive region.

Accordingly, the optoelectronic device according to the invention may comprise the following regions in the following order:
I. a first electrode;
II. an n-type region comprising at least one n-type layer;
III. a layer of a perovskite semiconductor without open porosity;
IV. a p-type region comprising at least one p-type layer; and
V. a second electrode.

The term "the following regions in the following order", as used herein, means that each of the regions listed will be present, and that the ordering of each of the present layers will be in the given order. For instance, in the above case (I, II, III, IV, V), II succeeds I, and precedes III, and II alone is between I and III (i.e. neither IV nor V are between I and III, but II is). This is the normal understanding of "in the following order". The order does not, however, define the orientation in space of the collection of regions: I, II, III is equivalent to III, II, I (i.e. "up" and "down" or "left" and "right" are undefined). Additional layers or regions may be present between each of these regions. For instance, I, II, III includes I, Ia, II, IIa, III and I, Ia, Ib, II, III. Typically, however, each region (e.g. I to V) is in contact with both the preceding and the succeeding region.

Additional layers or regions may be present between each of these regions. Typically, however, each region I to V is in contact with both the preceding and the succeeding region. Each of the regions (a first electrode, an n-type region, a layer of a perovskite semiconductor without open porosity, a p-type region and a second electrode) may be as defined anywhere herein. For example, the optoelectronic device according to the invention may comprise the following regions in the following order:
I. a first electrode which comprises a transparent conducting oxide, preferably FTO;
II. an n-type region comprising at least one n-type layer;
III. a layer of a perovskite semiconductor without open porosity;
IV. a p-type region comprising at least one p-type layer; and
V. a second electrode which comprises a metal, preferably silver or gold.

In some embodiments, the second electrode may alternatively comprise a transparent conducting oxide. For example both the first electrode and the second electrode may be selected from ITO, FTO and AZO. If the second electrode comprises a metal such as silver or gold, the thickness of the second electrode may occasionally be from 1 to 10 nm. For instance, the first electrode may comprise FTO or ITO and the second electrode may comprise a layer of silver with a thickness of from 1 to 10 nm, for instance 5 to 10 nm. A thin layer of silver can be semi-transparent.

Figure 8:
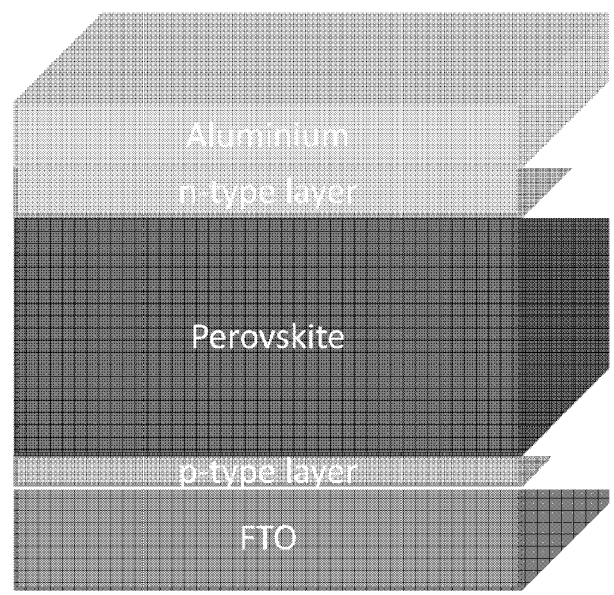
FIG. 8 shows a device schematic for inverted p-i-n type thin film solar cells.

The invention also provides an inverted heterojunction thin film perovskite device. Therefore, in one embodiment, the optoelectronic device of the invention may comprise a first electrode, a second electrode, and, disposed between the first and second electrodes, said photoactive region; wherein the second electrode is in contact with the n-type region of said photoactive region and the first electrode is in contact with the p-type region of said photoactive region. Such an architecture leads to what is known as an inverted device. These devices may have the configuration shown schematically in FIG. 8. In some circumstances it is desirable to have an inverted device structure wherein holes are collected through the substrate side of the device. In particular, inverted device architectures may be required for tandem applications. Tandem applications include use with a number of inorganic photovoltaic low band gap cells such as CIGS. The inventors have developed a low temperature, ambient air and solution-processable photovoltaic cell based on a semiconducting perovskite absorber. Often, the selective p-type and n-type contacts may be in the form of PEDOT:PSS and $PC_{60}BM$ respectively. Remarkably, the final electrode configuration is very similar to that employed in "bulk heterojunction" polymer solar cells, albeit with the photoactive layer swapped where the bulk-heterojunction is replaced with a solid perovskite film and a very respectable 7.5% full sun power conversion efficiency is achieved with much scope for further improvement.

Thin-film photovoltaics based on solution-processable technologies offer the promise of low-cost and easily manufacturable devices, necessary to assuage the world's ever-increasing energy needs. Suitable candidates are organic-based photovoltaics, inorganic and hybrid structures. Organic-based photovoltaics, while delivering low-cost and easily processable technology, suffer from reduced performance in comparison to other thin film technologies due to fundamental losses in charge generation where a rather large offset between the donor and the acceptor is necessary to achieve efficient charge separation, limiting the maximum achievable power conversion efficiency to just under 11% in a single junction. Inorganic-based thin film photovoltaics can require the use of highly toxic solvents and high temperatures of over 500° C., rendering them undesirable for mass-production.

For these reasons, perovskite-based hybrid photovoltaics are an appealing alternative as they can be processed under 150° C., are fully solid-state and already exhibit high power conversion efficiencies of over 12%. Perovskite absorbers have been previously used in sensitized solar cells as well as in thin-film architectures. Particularly, in the latter configuration, the perovskite $CH_3NH_3PbI_{3-x}Cl_x$ can act as a combined sensitizer and electron-transporter when processed on an alumina mesostructured scaffold, minimizing energy losses simply because electrons are directly transferred to the conductive substrate through the perovskite's conduction band. In this way, extremely high open circuit voltages of over 1.1V can be achieved.

Often in perovskite-based photovoltaics, electrons are collected from the FTO substrate, while holes were collected at the metal cathode. This configuration is undesirable for some tandem applications where holes must be collected at the TCO (transparent conducting oxide) interface. Here, a novel inverted device architecture is demonstrated. Often, it is based on the n- and p-type materials commonly employed for charge collection in organic photovoltaics, namely [6,6]-Phenyl C61 butyric acid methyl ester ($PC_{60}BM$) and poly (3,4-ethylenedioxythiophene) poly(styrenesulfonate) (PEDOT:PSS), as well as $V_2O_5$ and NiO.

In one embodiment, the optoelectronic device of the invention comprises a first electrode, a second electrode, and, disposed between the first and second electrodes, said photoactive region; wherein the second electrode is in contact with the n-type region of said photoactive region and the first electrode is in contact with the p-type region of said photoactive region, wherein the first electrode comprises a transparent or semitransparent electrically conductive material, and wherein the second electrode comprises aluminium, gold, silver, nickel, palladium or platinum.

Accordingly, the optoelectronic device according to the invention may comprise the following regions in the following order:
  I. a second electrode;
  II. an n-type region comprising at least one n-type layer;
  III. a layer of a perovskite semiconductor without open porosity;
  IV. a p-type region comprising at least one p-type layer; and
  V. a first electrode.

Each of the regions (a second electrode, an n-type region, a layer of a perovskite semiconductor without open porosity, a p-type region and a first electrode) may be as defined anywhere herein.

For example, the optoelectronic device according to the invention may comprise the following regions in the following order:
  I. a second electrode which comprises a metal;
  II. an n-type region comprising at least one n-type layer;
  III. a layer of a perovskite semiconductor without open porosity;
  IV. a p-type region comprising at least one p-type layer; and
  V. a first electrode which comprises a transparent conducting oxide.

For example, the optoelectronic device according to the invention may comprise the following regions in the following order:
  I. a second electrode which comprises a metal, preferably silver or gold;
  II. an n-type region comprising at least one n-type layer;
  III. a layer of a perovskite semiconductor without open porosity;
  IV. a p-type region comprising at least one p-type layer; and
  V. a first electrode which comprises a transparent conducting oxide, preferably FTO.

Any of the components in an inverted device according to the invention may be as defined anywhere herein. For instance, the perovskite may be a perovskite according to any one of formulae I, Ia, II or IIa above. For instance, the perovskite may be a perovskite compound selected from $CH_3NH_3PbI_3$, $CH_3NH_3PbBr_3$, $CH_3NH_3PbCl_3$, $CH_3NH_3PbF_3$, $CH_3NH_3PbBrI_2$, $CH_3NH_3PbBrCl_2$, $CH_3NH_3PbIBr_2$, $CH_3NH_3PbICl_2$, $CH_3NH_3PbClBr_2$, $CH_3NH_3PbI_2Cl$, $CH_3NH_3SnBrI_2$, $CH_3NH_3SnBrCl_2$, $CH_3NH_3SnF_2Br$, $CH_3NH_3SnIBr_2$, $CH_3NH_3SnICl_2$, $CH_3NH_3SnF_2I$, $CH_3NH_3SnClBr_2$, $CH_3NH_3SnI_2Cl$ and $CH_3NH_3SnF_2Cl$. In some embodiments, the second electrode may alternatively comprise a transparent conducting oxide. For example both the first electrode and the second electrode may be selected from ITO, FTO and AZO. If the second electrode comprises a metal such as silver or gold, the thickness of the second electrode may occasionally be from 1 to 10 nm. For instance, the first electrode may comprise FTO or ITO and the second electrode may comprise a layer of silver with a thickness of from 1 to 10 nm, for instance 5 to 10 nm. A thin layer of silver can be semi-transparent.

The n-type region in an inverted device may comprise at least one n-type layer as defined anywhere herein for a standard, non-inverted device. For instance, an n-type layer may comprise $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, or $CdO$. In one embodiment, the n-type region may comprise a compact layer of titanium dioxide. Often, the n-type region may comprise a compact layer of titanium dioxide and a layer of [60]PCBM ([6,6]-phenyl-$C_{61}$-butyric acid methyl ester). When the n-type region comprises a layer of titanium dioxide and a layer of [60]PCBM, the compact layer of titanium oxide is typically adjacent to the second electrode and the layer of [60]PCBM is typically adjacent to the layer of a perovskite semiconductor without open porosity.

The p-type region in an inverted device may comprises at least one p-type layer as defined anywhere herein for a standard, non-inverted device. For instance, a p-type layer may comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]), PVK (poly(N-vinylcarbazole)), PEDOT (poly(3,4-ethylenedioxythiophene)), or PEDOT:PSS (poly(3,4-ethylenedioxythiophene) poly(styrenesulfonate)). Alternatively, the p-type layer may for instance comprise an inorganic hole transporter comprising an oxide of nickel, vanadium, copper or molybdenum. In particular, the p-type region may comprise a layer of Spiro-OMeTAD and/or a layer of PEDOT:PSS. In one embodiment, the p-type region comprises a layer of PEDOT:PSS. If the p-type region comprises a layer of a p-type polymeric material (such as PEDOT, or PEDOT:PSS), the p-type layer may be crosslinked. The layer is crosslinked in order to limit the extent to which it is dissolved in the perovskite precursor solution during manufacture of the device, i.e. the polymer (e.g. PEDOT:PSS) is crosslinked in order to insolubilise it. For instance, the p-type region may comprise a p-type layer comprising a polymeric material wherein the p-type layer is crosslinked. Occasionally, the p-type region may comprises a layer of PEDOT:PSS wherein the layer is crosslinked. The p-type layer may be crosslinked by using a lewis acid, for instance $Fe^{3+}$. The p-type region may comprise a layer of PEDOT:PSS wherein the layer has been crosslinked using $FeCl_3$.

An optoelectronic device according to the invention may comprise the following regions in the following order:
  I. a second electrode which comprises a metal;
  II. an n-type region comprising a compact layer of titanium dioxide and a layer of [60]PCBM;
  III. a layer of a perovskite semiconductor without open porosity;
  IV. a p-type region comprising a layer of PEDOT:PSS, optionally wherein the layer is crosslinked; and
  V. a first electrode which comprises a transparent conducting oxide.

An optoelectronic device according to the invention may comprise the following regions in the following order:
  I. a second electrode which comprises a metal, preferably aluminium, silver or gold;

II. an n-type region comprising a compact layer of titanium dioxide and a layer of [60]PCBM;
III. a layer of a perovskite semiconductor without open porosity;
IV. a p-type region comprising a layer of PEDOT:PSS, optionally wherein the layer is crosslinked; and
V. a first electrode which comprises a transparent conducting oxide, preferably FTO.

For example, an optoelectronic device according to the invention may comprise the following regions in the following order:
I. a second electrode which comprises aluminium;
II. a compact layer of titanium dioxide;
III. a layer of [60]PCBM;
IV. a layer of a perovskite semiconductor without open porosity;
V. a layer of crosslinked PEDOT:PSS; and
VI. a first electrode which comprises FTO.

Said photoactive region may be the only photoactive region in the device and the optoelectronic device of the invention may therefore be a single junction device.

Alternatively, the optoelectronic device of the invention may be a tandem junction optoelectronic device or a multi junction optoelectronic device.

Accordingly, the optoelectronic device may comprise a first electrode, a second electrode, and, disposed between the first and second electrodes:
said photoactive region; and
at least one other photoactive region.

The other photoactive region or regions may be the same as or different from the photoactive region defined hereinbefore.

In some embodiments, the other photoactive region or regions are the same as the photoactive region defined hereinbefore.

Thus, the optoelectronic device of the invention may comprise: a first electrode, a second electrode, and, disposed between the first and second electrodes: a plurality of said photoactive regions.

When the optoelectronic device of the invention is a tandem or multi junction device, as the skilled person will appreciate, it may comprise one or more tunnel junctions. Each tunnel junction is usually disposed between two photoactive regions.

A tandem junction optoelectronic device (or multi junction optoelectronic device) according to the invention may combine the herein disclosed perovskite thin film technology with known technologies to deliver optimised performance.

Figure 16:
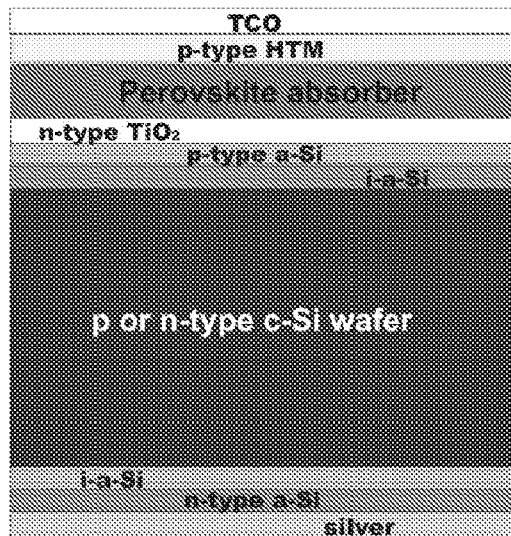
FIG. 16 shows a schematic illustration of a hybrid tandem solar cell architecture, here a c-Si HIT (Heterojunction with Intrinsic Thin layer) cell is used as the rear cell in the tandem junction, where i=intrinsic, a=amorphous, c=crystalline, TCO=transparent conducting oxide. Sun light is incident from the top.
Figure 17:
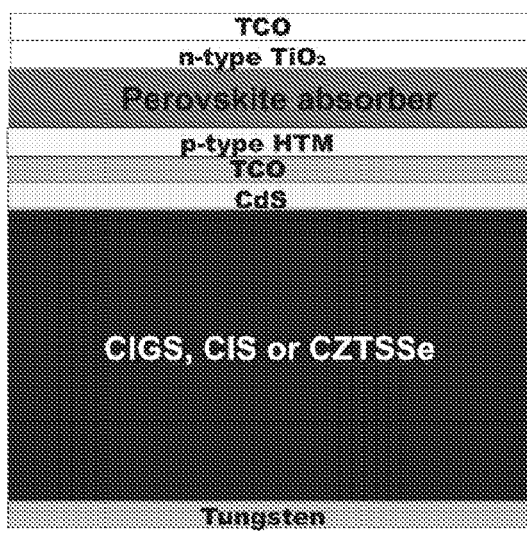
FIG. 17 shows a schematic illustration of a hybrid tandem solar cell architecture, here a perovskite solar cell is employed as the top cell, with a conventional thin film solar cell as the rear cell in the tandem junction, where TCO=transparent conducting oxide. Notably for the current generation of thin film technologies (e.g. GIGS solar cells) there is a requirement to realize "inverted" perovskite solar cells for monolithic two terminal tandem devices. Sun light is incident from the top.

An "all perovskite" multi-junction cell is very attractive, however even without the need to develop new absorbers, the current system employing $CH_3NH_3PbI_{3-x}Cl_x$ is already very well set to match with crystalline silicon and other thin film technologies such as CIS, CIGS and CZTSSe, if used as atop cell in a tandem junction. There is potential to produce optoelectronic devices with efficiencies in excess of 20%. The remarkable aspect of this is that it doesn't require a "quantum leap" in the currently presented technology, simply a little optimization and effective integration. There are many distinct advantages of "piggybacking" on existing technologies; the continuing drop in the cost of existing PV becomes advantageous, the market should be much more willing to adopt an "enhanced silicon technology" rather than an all new perovskite technology, and last but not least, a key challenge for the broader PV community has been to develop a wide-gap top cell for silicon and thin film technologies. In FIGS. 16 and 17, schematic illustrations of possible tandem junction device configurations are given, for perovskite on c-Si and perovskite on conventional thin film.

In one embodiment, the invention provides an optoelectronic device which comprises a first electrode, a second electrode, and, disposed between the first and second electrodes:
said photoactive region as defined hereinbefore; and
at least one other photoactive region,
wherein the at least one other photoactive region comprises at least one layer of a semiconductor material.

The at least one other photoactive region may be at least one other photoactive region from photoactive regions used in conventional and known optoelectronic and photovoltaic devices. For instance, it may be a photoactive region from a crystalline silicon photovoltaic cell or a photoactive region from a conventional thin film gallium arsenide, CIGS, CIS or CZTSSe photovoltaic device.

Often, a tandem optoelectronic device comprises the following regions in the following order:
I. a first electrode;
II. a first photoactive region as defined anywhere hereinbefore;
III. a second photoactive region which comprises a layer of a semiconductor material; and
IV. a second electrode.

The semiconductor material in region III may be any semiconductor material. The term "semiconductor material", as used herein, refers to a material with electrical conductivity intermediate in magnitude between that of a conductor and an insulator.

Typically, a semiconductor material is a material that has a conductivity of from $10^3$ to $10^{-8}$ $Scm^{-1}$. Standard techniques such as a 4-point probe conductivity measurement may be used to measure conductivity. Examples of semiconductor materials include an oxide or chalcogenide of a metal or metalloid element; a group IV compound; a compound comprising a group III element and a group V element; a compound comprising a group II element and a group VI element; a compound comprising a group I element and a group VII element; a compound comprising a group IV element and a group VI element; a compound comprising a group V element and a group VI element; a compound comprising a group II element and a group V element; a ternary or quaternary compound semiconductor; a perovskite semiconductor or an organic semiconductor. Typical examples of semiconductor materials include oxides of titanium, niobium, tin, zinc, cadmium, copper or lead; chalcogenides of antimony or bismuth; copper zinc tin sulphide; copper zinc tin selenide, copper zinc tin selenide sulphide, copper indium gallium selenide; and copper indium gallium diselenide. Further examples are group IV compound semiconductors (e.g. silicon carbide); group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide); ternary or quaternary semiconductors (eg. copper indium selenide, copper indium gallium diselenide, or copper zinc tin sulphide); perovskite semiconductor materials (e.g. $CH_3NH_3PbI_3$ and $CH_3NH_3PbI_2Cl$); and organic semiconductor materials (e.g. conjugated polymeric compounds including polymers such as polyacetylenes, polyphenylenes and polythiophenes). Examples of organic semiconductors include poly(3,4-ethylenedioxythiophene), 2,2-7,7-tetrakis-N,N-di-p-methoxyphenylamine-9,9-spirobifluorene (spiro-OMeTAD) and conjugated organic polymers such as polyacetylenes, polyphenylenes, polythiophenes or polyanilines. Examples of materials which are not semiconductor materials include, for instance elemental metals, which are of course conductors, and electrical insulators or dielectrics such as silica or calcite.

The term "oxide", as used herein, refers to a compound comprising at least one oxide ion (i.e. $O^{2-}$) or divalent oxygen atom. It is to be understood that the terms "metal oxide" and "an oxide of a metal element" used herein encompass both oxides comprising one metal, and also mixed-metal oxides. For the avoidance of doubt, a mixed-metal oxide refers to a single oxide compound comprising more than one metal element. Examples of mixed-metal oxides include zinc tin oxide and indium tin oxide. Similarly, it is to be understood that the terms "metalloid oxide" and "an oxide of a metalloid element" used herein encompass oxides comprising one metalloid element and also mixed-metalloid oxides. For the avoidance of doubt, a mixed-metalloid oxide refers to a single oxide compound comprising more than one metalloid element.

The term "chalcogenide", used herein, refers to a compound comprising at least one of a sulphide, selenide or telluride ion (i.e. $S^{2-}$, $Se^{2-}$, or $Te^{2-}$) or a divalent sulphur, selenium or tellurium atom. It is to be understood that the terms "metal chalcogenide" and "a chalcogenide of a metal element" encompass chalcogenides comprising one metal and also mixed-metal chalcogenides. For the avoidance of doubt, a mixed-metal chalcogenide refers to a single chalcogenide compound comprising more than one metal element. Similarly, it is to be understood that the terms "metalloid chalcogenide" and "a chalcogenide of a metalloid element" used herein encompass chalcogenides comprising one metalloid and also mixed-metalloid chalcogenides. For the avoidance of doubt, a mixed-metalloid chalcogenide refers to a single chalcogenide compound comprising more than one metalloid element.

Occasionally, the semiconductor material comprises an oxide or chalcogenide of a metal or metalloid element. For example, the semiconductor material consists of an oxide or chalcogenide of a metal or metalloid element. For instance, the semiconductor material comprises an oxide of titanium, niobium, tin, zinc, cadmium, copper or lead or any combination thereof, or a chalcogenide of antimony, bismuth or cadmium or any combination thereof. For instance the semiconductor material may comprise zinc tin oxide; copper zinc tin sulphide; copper indium gallium selenide, or copper indium gallium diselenide.

In one embodiment the semiconductor material may be a doped semiconductor, where an impurity element is present at a concentration ranging between 0.01 to 40%. If the impurity element acts as an electron donor, then the semiconductor material will be doped to become n-type, if the impurity element acts as an electron acceptor, then the semiconductor material will be doped to become p-type. It is noted that for metal oxides doped with impurity metalloid elements which substitute the primary metalloid element, if the valency of the dopant is larger than the valency of the primary metalloid element then the metal oxide will be n-type doped, if the valency of the dopant metalloid element is lower than that of the primary metalloid element then the metal oxide will be p-type doped. Any of the above mentioned elements can be used to dope any of the above mentioned semiconductor materials to different levels of efficacy and effect.

Accordingly, in some cases the semiconductor material comprises an oxide or chalcogenide of a metal or metalloid element; a group IV compound; a compound comprising a group III element and a group V element; a compound comprising a group II element and a group VI element; a compound comprising a group I element and a group VII element; a compound comprising a group IV element and a group VI element; a compound comprising a group V element and a group VI element; a compound comprising a group II element and a group V element; a ternary or quaternary compound semiconductor; or an organic semiconductor.

Often, the semiconductor material comprises silicon; an oxide of titanium, niobium, tin, zinc, cadmium, copper or lead; a chalcogenide of antimony or bismuth; copper zinc tin sulphide; copper zinc tin selenide, copper zinc tin selenide sulphide, copper indium gallium selenide; copper indium gallium diselenide, silicon carbide, gallium arsenide, cadmium selenide, cuprous chloride, lead selenide, bismuth telluride, or cadmium arsenide.

If the semiconductor material comprises silicon, the silicon may be monocrystalline, polycrystalline or amorphous.

The photoactive region according to the invention may be in tandem with a traditional silicon solar cell. For instance, the semiconductor material may comprise a layer of crystalline silicon.

In some embodiments the optoelectronic device comprises the following regions in the following order:
  I. a first electrode;
  II. a first photoactive region as defined in anywhere herein;
  III. a layer (A) of a p-type semiconductor;
  IV. a first layer of an intrinsic semiconductor;
  V. a layer (B) of a p-type semiconductor or a layer (B) of an n-type semiconductor;
  VI. a second layer of an intrinsic semiconductor;
  VII. a layer (C) of an n-type semiconductor; and
  VIII. a second electrode.

Occasionally, the optoelectronic device comprises the following regions in the following order:
  I. a first electrode;
  II. a first region;
  III. a layer of perovskite semiconductor without open porosity;
  IV. a third region;
  V. a layer (A) of a p-type semiconductor;
  VI. a first layer of an intrinsic semiconductor;
  VII. a layer (B) of a p-type semiconductor or a layer (B) of an n-type semiconductor;
  VIII. a second layer of an intrinsic semiconductor;
  IX. a layer (C) of an n-type semiconductor; and
  X. a second electrode;
  wherein the first region is an n-type region comprising at least one n-type layer and the third region is a p-type region comprising at least one p-type layer; or
  the first region is a p-type region comprising at least one p-type layer and the third region is an n-type region comprising at least one n-type layer.

Any of the components (e.g. the perovskite, the first region or the third region) in this tandem device may be as defined anywhere herein. Any p-type, n-type or intrinsic semiconductor referred to may comprise any semiconductor defined herein which may be appropriately p-doped, n-doped or undoped.

Often, the first region is a p-type region comprising at least one p-type layer and the third region is an n-type region comprising at least one n-type layer. Accordingly, the p-type layer will be adjacent to the first electrode, and the perovskite photoactive region according to the invention will be inverted. Typically, light which falls on the device is incident through the first electrode. The n-type region comprising at least one n-type layer may be as defined herein and/or the p-type region comprising at least one p-type layer may be as defined herein.

Often, in a tandem optoelectronic device according to the invention, the layer (A) of a p-type semiconductor is a layer of p-type amorphous silicon and/or the layer (C) of an n-type semiconductor is a layer of n-type amorphous silicon. Typically, the layer (A) of a p-type semiconductor is a layer of p-type amorphous silicon and the layer (C) of an n-type semiconductor is a layer of n-type amorphous silicon Often, the first layer of an intrinsic semiconductor is a layer of intrinsic amorphous silicon and/or the second layer of an intrinsic semiconductor is a layer of intrinsic amorphous silicon. Sometimes, the first layer of an intrinsic semiconductor is a layer of intrinsic amorphous silicon and the second layer of an intrinsic semiconductor is a layer of intrinsic amorphous silicon. In the tandem device, the layer (B) of a p-type semiconductor or the layer (B) of an n-type semiconductor may be a layer of p-type crystalline silicon or a layer of n-type crystalline silicon.

As defined elsewhere herein, the first electrode typically comprises a transparent conducting oxide and/or the second electrode comprises a metal. Often the first electrode typically comprises a transparent conducting oxide and the second electrode comprises a metal. The transparent conducting oxide may be as defined above and is often FTO, ITO, or AZO, and typically ITO. The metal may be any metal. Generally the second electrode comprises a metal selected from silver, gold, copper, aluminium, platinum, palladium, or tungsten. This list of metals may also apply to other instances of the second electrode herein. Often, the first electrode material comprises ITO and/or the second electrode comprises silver. Typically, the first electrode material comprises ITO and the second electrode comprises silver.

Rather than the photoactive region according to the invention comprising a layer of perovskite without open porosity being in tandem with a silicon photoactive region, it may be in tandem with a thin film photoactive region. For instance, the optoelectronic device may comprises the following regions in the following order:
I. a first electrode;
II. a first photoactive region as defined anywhere hereinbefore;
III. a second photoactive region which comprises a layer of a semiconductor material; and
IV. a second electrode;
wherein the semiconductor material comprises a layer of copper zinc tin sulphide, copper zinc tin selenide, copper zinc tin selenide sulphide, copper indium gallium selenide, copper indium gallium diselenide or copper indium selenide. The layer of a semiconductor material may be a thin film of a semiconductor material.

In one embodiment, the optoelectronic device comprises the following regions in the following order:
I. a first electrode;
II. a first photoactive region as defined hereinbefore;
III. a layer of a transparent conducting oxide;
IV. a layer (D) of an n-type semiconductor;
V. a layer of copper zinc tin sulphide, copper zinc tin selenide, copper zinc tin selenide sulphide, copper indium gallium selenide, copper indium gallium diselenide or copper indium selenide; and
VI. a second electrode.

For example, the optoelectronic device according may comprises the following regions in the following order:
I. a first electrode;
II. a first region;
III. a layer of perovskite semiconductor without open porosity;
IV. a third region;
V. a layer of a transparent conducting oxide;
VI. a layer (D) of an n-type semiconductor;
VII. a layer of copper zinc tin sulphide, copper zinc tin selenide, copper zinc tin selenide sulphide, copper indium gallium selenide, copper indium gallium diselenide or copper indium selenide; and
VIII. a second electrode;
wherein the first region is an n-type region comprising at least one n-type layer and the third region is a p-type region comprising at least one p-type layer; or
the first region is a p-type region comprising at least one p-type layer and the third region is an n-type region comprising at least one n-type layer.

The layer (D) of an n-type semiconductor may comprise any metal oxide or chalcogenide semiconductor. Often, the layer (D) of an n-type semiconductor comprises cadmium sulfide.

Typically, in the tandem device comprising a thin film of a semiconductor, the first region is an n-type region comprising at least one n-type layer and the third region is a p-type region comprising at least one p-type layer. The n-type region comprising at least one n-type layer may be as defined any where herein and/or the p-type region comprising at least one p-type layer may be as defined anywhere herein.

The first electrode and/or second electrode may be as defined above. Typically, the first electrode comprises a transparent conducting oxide and/or the second electrode comprises a metal. Often, the first electrode comprises a transparent conducting oxide and the second electrode comprises a metal. Typically, the first electrode comprises ITO and/or the second electrode comprises tungsten, or the first electrode comprises ITO and the second electrode comprises tungsten.

The optoelectronic device of the invention may be a photovoltaic device; a photodiode; a phototransistor; a photomultiplier; a photo resistor; a photo detector; a light-sensitive detector; solid-state triode; a battery electrode; a light emitting device; a light emitting diode; a transistor; a solar cell; a laser; or a diode injection laser.

In a preferred embodiment, the optoelectronic device of the invention is a photovoltaic device, for instance a solar cell.

The optoelectronic device according to the invention may be a solar cell.

In another preferred embodiment, the optoelectronic device of the invention is a light-emitting device, for instance a light emitting diode.

The perovskite compounds employed in the optoelectronic device of the invention, in said layer of a perovskite semiconductor without open porosity, and/or in said first layer, may be produced by a process comprising mixing:
(a) a first compound comprising (i) a first cation and (ii) a first anion; with
(b) a second compound comprising (i) a second cation and (ii) a second anion; wherein:
the first and second cations are as defined herein for the perovskite; and
the first and second anions may be the same or different anions.

The perovskites which comprise at least one anion selected from halide anions and chalcogenide anions, may, for instance, be produced by a process comprising mixing:

(a) a first compound comprising (i) a first cation and (ii) a first anion; with (b) a second compound comprising (i) a second cation and (ii) a second anion; wherein:

the first and second cations are as herein defined for the perovskite; and the first and second anions may be the same or different anions selected from halide anions and chalcogenide anions.

Typically, the first and second anions are different anions. More typically, the first and second anions are different anions selected from halide anions.

The perovskite produced by the process may comprise further cations or further anions. For example, the perovskite may comprise two, three or four different cations, or two, three of four different anions. The process for producing the perovskite may therefore comprise mixing further compounds comprising a further cation or a further anion. Additionally or alternatively, the process for producing the perovskite may comprise mixing (a) and (b) with: (c) a third compound comprising (i) the first cation and (ii) the second anion; or (d) a fourth compound comprising (i) the second cation and (ii) the first anion.

Typically, in the process for producing the perovskite, the second cation in the mixed-anion perovskite is a metal cation. More typically, the second cation is a divalent metal cation. For instance, the second cation may be selected from $Ca^2$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. Usually, the second cation is selected from $Sn^{2+}$ and $Pb^{2+}$.

Often, in the process for producing the perovskite, the first cation in the mixed-anion perovskite is an organic cation.

Usually, the organic cation has the formula $(R_1R_2R_3R_4N)^+$, wherein:

$R_1$ is hydrogen, or unsubstituted or substituted $C_1$-$C_2$ alkyl, or unsubstituted or substituted aryl;

$R_2$ is hydrogen, or unsubstituted or substituted $C_1$-$C_2$ alkyl, or unsubstituted or substituted aryl;

$R_3$ is hydrogen, or unsubstituted or substituted $C_1$-$C_2$ alkyl, or unsubstituted or substituted aryl; and $R_4$ is hydrogen, or unsubstituted or substituted $C_1$-$C_2$ alkyl, or unsubstituted or substituted aryl.

Mainly, in the organic cation, $R_1$ is hydrogen, methyl or ethyl, $R_2$ is hydrogen, methyl or ethyl, $R_3$ is hydrogen, methyl or ethyl, and $R_4$ is hydrogen, methyl or ethyl. For instance $R_1$ may be hydrogen or methyl, $R_2$ may be hydrogen or methyl, $R_3$ may be hydrogen or methyl, and $R_4$ may be hydrogen or methyl.

Alternatively, the organic cation may have the formula $(R_5NH_3)^+$, wherein: $R_5$ is hydrogen, or unsubstituted or substituted $C_1$-$C_2$ alkyl. For instance, $R_5$ may be methyl or ethyl. Typically, $R_5$ is methyl.

Alternatively, the organic cation may have the formula $(R_5R_6N=CH-NR_7R_8)^+$, wherein: $R_5$ is hydrogen, unsubstituted or substituted $C_1$-$C_{20}$ alkyl, or unsubstituted or substituted aryl; $R_6$ is hydrogen, unsubstituted or substituted $C_1$-$C_{20}$ alkyl, or unsubstituted or substituted aryl; $R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl.

Typically, $R_5$ in the cation $(R_5R_6N=CH-NR_7R_8)^+$ is hydrogen, methyl or ethyl, $R_6$ is hydrogen, methyl or ethyl, $R_7$ is hydrogen, methyl or ethyl, and $R_8$ is hydrogen, methyl or ethyl. For instance $R_5$ may be hydrogen or methyl, $R_6$ may be hydrogen or methyl, $R_7$ may be hydrogen or methyl, and $R_8$ may be hydrogen or methyl.

The organic cation may, for example, have the formula $(H_2N=CH-NH_2)^+$.

In the process for producing the perovskite, the perovskite is usually a mixed-halide perovskite, wherein said two or more different anions are two or more different halide anions.

Typically, in the process for producing the perovskite, the perovskite is a perovskite compound of the formula (I):

$$[A][B][X]_3 \quad (I)$$

wherein:

[A] is at least one organic cation;

[B] is at least one metal cation; and

[X] is said two or more different anions; and the process comprises mixing:

(a) a first compound comprising (i) a metal cation and (ii) a first anion; with (b) a second compound comprising (i) an organic cation and (ii) a second anion; wherein:

the first and second anions are different anions selected from halide anions or chalcogenide anions.

The perovskite of the formula (I) may, for instance, comprise one, two, three or four different metal cations, typically one or two different metal cations. The perovskite of the formula (I), may, for instance, comprise one, two, three or four different organic cations, typically one or two different organic cations. The perovskite of the formula (I), may, for instance, comprise two, three or four different anions, typically two or three different anions. The process may, therefore, comprise mixing further compounds comprising a cation and an anion.

Typically, [X] is two or more different halide anions. The first and second anions are thus typically halide anions. Alternatively [X] may be three different halide ions. Thus the process may comprise mixing a third compound with the first and second compound, wherein the third compound comprises (i) a cation and (ii) a third halide anion, where the third anion is a different halide anion from the first and second halide anions.

Often, in the process for producing the perovskite, the perovskite is a perovskite compound of the formula (IA):

$$AB[X]_3 \quad (IA)$$

wherein:

A is a organic cation;

B is a metal cation; and

[X] is said two or more different anions.

the process comprises mixing:

(a) a first compound comprising (i) a metal cation and (ii) a first halide anion; with (b) a second compound comprising (i) an organic cation and (ii) a second halide anion: wherein:

the first and second halide anions are different halide anions.

Usually, [X] is two or more different halide anions. Preferably, [X] is two or three different halide anions. More preferably, [X] is two different halide anions. In another embodiment [X] is three different halide anions.

Typically, in the process for producing the perovskite, the perovskite is a perovskite compound of formula (II):

$$ABX_{3-y}X'_y \quad (II)$$

wherein:

A is an organic cation;

B is a metal cation;

X is a first halide anion;

X' is a second halide anion which is different from the first halide anion; and y is from 0.05 to 2.95; and the process comprises mixing:

(a) a first compound comprising (i) a metal cation and (ii) X; with (b) a second compound comprising (i) an organic cation and (ii) X':

wherein the ratio of X to X' in the mixture is equal to (3-y):y.

In order to achieve said ratio of X to X' equal to (3-y):y, the process may comprise mixing a further compound with the first and second compounds. For example, the process may comprise mixing a third compound with the first and second compounds, wherein the third compound comprises (i) the metal cation and (ii) X'. Alternative, the process may comprising mixing a third compound with the first and second compounds, wherein the third compound comprises (i) the organic cation and (ii) X.

Usually, y is from 0.5 to 2.5, for instance from 0.75 to 2.25. Typically, y is from 1 to 2.

Typically, in the process for producing the perovskite, the first compound is $BX_2$ and the second compound is AX'.

Often, the second compound is produced by reacting a compound of the formula $(R_5NH_2)$, wherein: $R_5$ is hydrogen, or unsubstituted or substituted $C_1$-$C_2$ alkyl, with a compound of formula HX'. Typically, $R_5$ may be methyl or ethyl, often $R_5$ is methyl.

Usually, the compound of formula $(R_5NH_2)$ and the compound of formula HX' are reacted in a 1:1 molar ratio. Often, the reaction takes place under nitrogen atmosphere and usually in anhydrous ethanol. Typically, the anhydrous ethanol is about 200 proof More typically from 15 to 30 ml of the compound of formula $(R_5NH_2)$ is reacted with about 15 to 15 ml of HX', usually under nitrogen atmosphere in from 50 to 150 ml anhydrous ethanol. The process may also comprise a step of recovering said mixed-anion perovskite. A rotary evaporator is often used to extract crystalline AX'.

Usually, the step of mixing the first and second compounds is a step of dissolving the first and second compounds in a solvent. The first and second compounds may be dissolved in a ratio of from 1:20 to 20:1, typically a ratio of 1:1. Typically the solvent is dimethylformamide (DMF) or water. When the metal cation is $Pb^{2+}$ the solvent is usually dimethylformamide. When the metal cation is $Sn^{2+}$ the solvent is usually water. The use of DMF or water as the solvent is advantageous as these solvents are not very volatile.

The perovskite semiconductor layer in the inventive devices can be prepared by solution-processing or by evaporation in vacuum. Reduced processing temperature is important for reducing the cost of manufacturing, enabling processing on plastic substrates and processing on top of other layers to enable the production of tandem and multi-junction solar cells. Here, the inventors demonstrate that the devices of the invention can operate with all layers processed at low-temperature including the solution-processable scaffold.

The invention provides a process for producing an optoelectronic device comprising a photoactive region, which photoactive region comprises:

an n-type region comprising at least one n-type layer;

a p-type region comprising at least one p-type layer; and, disposed between the n-type region and the p-type region:

a layer of a perovskite semiconductor without open porosity, which process comprises:

(a) providing a first region;

(b) disposing a second region on the first region, which second region comprises a layer of a perovskite semiconductor without open porosity; and (c) disposing a third region on the second region, wherein:

the first region is an n-type region comprising at least one n-type layer and the third region is a p-type region comprising at least one p-type layer; or the first region is a p-type region comprising at least one p-type layer and the third region is an n-type region comprising at least one n-type layer.

Often, the first region is an n-type region comprising at least one n-type layer and the third region is a p-type region comprising at least one p-type layer.

In the process of the invention, the n-type region, the n-type layer, the p-type region and the p-type layer may be as further defined herein before for the optoelectronic device of the invention. Also, the layer of the perovskite semiconductor without open porosity, and the perovskite semiconductor itself, may be as further defined hereinbefore.

In one embodiment of the process of the invention, step (b), of disposing the second region on the first region, comprises:

producing a solid layer of the perovskite on the first region by vapour deposition.

In this embodiment, the step of producing a solid layer by vapour deposition typically comprises:

(i) exposing the first region to vapour, which vapour comprises said perovskite or one or more reactants for producing said perovskite; and (ii) allowing deposition of the vapour onto the first region, to produce a solid layer of said perovskite thereon.

The perovskite in the vapour may be any of the perovskites discussed hereinbefore for the optoelectronic device of the invention, and is typically a perovskite of formula (I), (IA) or (II) as defined hereinbefore.

The one or more reactants for producing said perovskite may comprise the reactant types discussed above for the process for synthesising the perovskite compounds.

Thus, the one or more reactants may comprise:

(a) a first compound comprising (i) a first cation and (ii) a first anion; and (b) a second compound comprising (i) a second cation and (ii) a second anion, as defined hereinbefore for the process for producing the perovskite compounds employed in the optoelectronic device of the invention.

More particularly, the one or more reactants may comprise:

(a) a first compound comprising (i) a metal cation and (ii) a first anion; with (b) a second compound comprising (i) an organic cation and (ii) a second anion; wherein the first and second anions are different anions selected from halide anions or chalcogenide anions, as defined hereinbefore for the process for producing the perovskite compounds employed in the optoelectronic device of the invention.

For instance, the one or more reactants may comprise:

(a) a first compound comprising (i) a metal cation and (ii) a first halide anion; with (b) a second compound comprising (i) an organic cation and (ii) a second halide anion; wherein the first and second halide anions are different halide anions, as defined hereinbefore for the process for producing the perovskite compounds employed in the optoelectronic device of the invention.

For instance, when the perovskite being deposited is $CH_3NH_3PbI_2Cl$, the one or more reactants typically comprise (a) $PbI_2$, and (b) $CH_3NH_3Cl$.

The process generally further comprises producing the vapour in the first place by evaporating said perovskite or evaporating said one or more reactants for producing said perovskite. In this step the perovskite or the one or more reactants for producing the perovskite are typically transferred to an evaporation chamber which is subsequently evacuated. The perovskite or the one or more reactants for producing the perovskite are typically then heated.

The resulting vapour is then exposed to and thereby deposited the first region, to produce a solid layer of said perovskite thereon. If reactants are used, these react together in situ to produce the perovskite on the first region.

Typically, the vapour deposition is allowed to continue until the solid layer of perovskite has a desired thickness, for instance a thickness of from 10 nm to 100 m, or more typically from 10 nm to 10 m. Preferably, the vapour deposition is allowed to continue until the solid layer of perovskite has a thickness of from 50 nm to 1000 nm, or for instance from 100 nm to 700 nm. For instance, deposition may be continued until approximately 100 nm to 300 nm of the powder is deposited onto the first region.

The vapour deposition may continue until the solid layer of the perovskite has a thickness of at least 100 nm. Typically, for instance it continues until the solid layer of the perovskite has a thickness of from 100 nm to 100 m, or for instance from 100 nm to 700 nm.

The inventors have found that a dual source vapour deposition process allows uniform layers of the perovskite to be deposited. Vapour deposition is one of the most common ways in large manufacturing to deposit thin films of controlled thickness and conventionally refers to deposition of thin films by the condensation of a vaporised form of the desired film material onto a surface in vacuum. Deposition methods of inorganic perovskite have been well researched, such as pulsed-laser deposition and chemical solution deposition. The hybrid inorganic-organic perovskite, such as $(C_6H_5C_2H_4NH_3)_2PbI_4$ or $(C_6H_5C_2H_4NH_3)_2PbBr_4$, have been successfully evaporated through single source thermal deposition. However, since the deposition methods of the hybrid inorganic-organic perovskite were rarely mentioned because of the significant difference in physical and chemical properties between the inorganic and organic materials, the dual-source thermal deposition was applied to evaporate the organic source and inorganic source simultaneously but with independent control (V. K. Dwivedi, J. J. Baumberg, and G. V. Prakash, "Direct deposition of inorganic-organic hybrid semiconductors and their template-assisted microstructures," *Materials Chemistry and Physics*, vol. 137, no. 3, pp. 941-946, January 2013). Recently, template-assisted electrochemical deposition was suggested to obtain a new class of a hybrid perovskite $(C_{12}H_{25}NH_3)_2PbI_4$ in multiple quantum well structures with strong exciton emission. It has also been suggested that these materials can be directly carved into 2D photonic structures that could be very useful in photovoltaic devices. The deposition of hybrid organic-inorganic perovskite materials is always challenging, because most organic materials are very volatile and decompose easily, and this makes control of the deposition process more complicated.

In one embodiment, the step (b) of disposing the second region on the first region comprises:
producing a solid layer of the perovskite by vapour deposition, wherein the vapour deposition is a dual source vapour deposition.

The term "dual source vapour deposition", as used herein, refers to a vapour deposition process in which the vapour which is deposited on a substrate comprises two or more components which originate from two distinct sources. Typically a first source will produce a vapour comprising a first component and a second source will produce a vapour comprising a second component. Dual source vapour deposition may also be extended to include three and four source vapour deposition, although dual source deposition is normally preferable.

In one embodiment, the step (b) of disposing the second region on the first region comprises:
(i) exposing the first region to vapour, which vapour comprises two reactants for producing said perovskite; and
(ii) allowing deposition of the vapour onto the first region, to produce a solid layer of said perovskite thereon;
wherein (i) further comprises producing said vapour comprising two reactants for producing said perovskite by evaporating a first reactant from a first source and evaporating a second reactant from a second source.

The reactants may be as defined herein for the production of a perovskite. The vapour may alternatively comprise three or more reactants. The two sources are typically placed at the same distance from the first region, often from 10 to 40 cm.

Often the first reactant comprises a first compound comprising (i) a first cation and (ii) a first anion; and the second reactant comprises a second compound comprising (i) a second cation and (ii) a second anion. In some cases, the first cation here will be a metal cation. In some cases the second cation here will be an organic cation. Accordingly, the first reactant may comprise a first compound comprising (i) a metal cation and (ii) a first anion; and the second reactant may comprise a second compound comprising (i) an organic cation and (ii) a second anion. Preferably the metal cation is a divalent metal cation. For instance, the metal cation may be a cation selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. Of these cations, it is preferable that the divalent metal cation is $Pb^{2+}$ or $Sn^{2+}$.

Often the organic cation has the formula $(R_1R_2R_3R_4N)^+$, wherein:
$R_1$ is hydrogen, or unsubstituted or substituted $C_1$-$C_{20}$ alkyl, or unsubstituted or substituted aryl;
$R_2$ is hydrogen, or unsubstituted or substituted $C_1$-$C_{20}$ alkyl, or unsubstituted or substituted aryl;
$R_3$ is hydrogen, or unsubstituted or substituted $C_1$-$C_{20}$ alkyl, or unsubstituted or substituted aryl; and
$R_4$ is hydrogen, or unsubstituted or substituted $C_1$-$C_{20}$ alkyl, or unsubstituted or substituted aryl.

The organic cation may be as defined anywhere herein. Often, the organic cation has the formula $(R_5NH_3)^+$, wherein: $R_5$ is hydrogen, or unsubstituted or substituted $C_1$-$C_{20}$ alkyl. For instance, the organic cation has the formula $(R_5NH_3)^+$, wherein: $R_5$ is methyl, ethyl, propyl or butyl, preferably methyl or ethyl. In some cases the organic cation may be a methylammonium cation.

Alternatively, the organic cation has the formula $(R_5R_6N=CH-NR_7R_8)^+$, wherein: $R_5$ is hydrogen, unsubstituted or substituted $C_1$-$C_{20}$ alkyl, or unsubstituted or substituted aryl; $R_6$ is hydrogen, unsubstituted or substituted $C_1$-$C_{20}$ alkyl, or unsubstituted or substituted aryl; $R_7$ is hydrogen, unsubstituted or substituted $C_1$-$C_{20}$ alkyl, or unsubstituted or substituted aryl; and $R_8$ is hydrogen, unsubstituted or substituted $C_1$-$C_{20}$ alkyl, or unsubstituted or substituted aryl.

Typically, $R_5$ in the cation $(R_5R_6N=CH-NR_7R_8)^+$ is hydrogen, methyl or ethyl, $R_6$ is hydrogen, methyl or ethyl, $R_7$ is hydrogen, methyl or ethyl, and $R_8$ is hydrogen, methyl or ethyl. For instance $R_5$ may be hydrogen or methyl, $R_6$ may be hydrogen or methyl, $R_7$ may be hydrogen or methyl, and $R_8$ may be hydrogen or methyl.

The organic cation may, for example, have the formula $(H_2N=CH-NH_2)^+$

The first and second anions may be any anions, but are typically selected from halide ions (e.g. fluoride, chloride, bromide and iodide) or chalcogenide ions (e.g. sulfide, selenide and telluride). Often, the perovskite will be a mixed halide or mixed chalcogenide perovskite and the first and second anions are different anions selected from halide ions or chalcogenide ions. Preferably the first and second anions are halide anions. Typically, the first and second anions are different anions selected from halide anions. For instance, the first anion and second anion may be one of the following pairs as (first anion:second anion):(fluoride:chloride), (chloride:fluoride), (fluoride:bromide), (bromide:fluoride), (fluoride:iodide), (iodide:fluoride), (chloride:bromide), (bromide:chloride), (chloride:iodide), (iodide:chloride), (bromide:iodide) or (iodide:bromide).

In some embodiments, the first reactant will comprise a metal dihalide, and the second reactant will comprise a halide salt of an organic acid. For instance, the first reactant may comprise a first compound which is $BX_2$ and the second reactant may comprise a second compound which is $AX'$, wherein B is a first cation, X is a first anion, A is a second cation and X' is a second anion. Each of the cations and anions may be as defined above. Occasionally, the first reactant comprises a first compound which is $BX_2$ and the second reactant comprises a second compound which is $AX'$, wherein B is a cation selected from $Ca^{2+}$, $Sr^{2+}$, $Cd^{2+}$, $Cu_{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$, X is an anion selected from $F^-$, $Cl^-$, $Br^-$ and $I^-$, A is a cation of formula $(R_5NH_3)^+$, wherein: $R_5$ is hydrogen, or unsubstituted or substituted $C_1$-$C_2$ alkyl, X' is an anion selected from $F^-$, $Cl^-$, $Br^-$ and $I^-$, and X and X' are different anions.

The first reactant may comprise lead halide or tin halide and the second reactant may comprise methylammonium halide or ethyl ammonium halide, wherein the halide ion in the first reactant and the second reactant are different. Often, the first reactant comprises tin fluoride and the second reactant comprises methylammonium chloride, methylammonium bromide or methylammonium iodide;

the first reactant comprises lead chloride or tin chloride and the second reactant comprises methylammonium bromide or methylammonium iodide;

the first reactant comprises lead bromide or tin bromide and the second reactant comprises methylammonium chloride or methylammonium iodide; or the first reactant comprises lead iodide or tin bromide and the second reactant comprises methylammonium chloride or methyl ammonium bromide.

Preferably, the first reactant comprises lead chloride and the second reactant comprises methylammonium iodide.

These pairs of compound also apply for other deposition methods of a perovskite, e.g. solution deposition.

Alternatively, A may be an inorganic monovalent cation. For instance, A may be a cation of a group 1 metal such as $Cs^+$. If A is inorganic, the two halide anions in each reactant may be the same or different. For example, the first reactant may comprise a first compound $BX_2$, and the second reactant may comprise a second compound which is AX, wherein B is a cation selected from $Ca^{2+}$, $Sr^{2+}$, $Cd^{2+}$, $Cu_{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$, X is an anion selected from $F^-$, $Cl^-$, $Br^-$ and $I^-$, A is $Cs^+$, X' is an anion selected from $F^-$, $Cl^-$, $Br^-$ and $I^-$, and X and X' are the same or different.

Dual vapour deposition using these reactants can produce layers of perovskite of formula (IB) as defined above, for instance $CsSnBr_3$. Alternatively, $CsSnBr_{3-y}I_y$ (where y is as defined in formula II above) may be produced.

Dual vapour deposition allows the evaporation rate (here given in ångstroms per second) of each component to be controlled, thus leading to a more controlled deposition. Typically, the evaporation rate of the first reactant (optionally comprising a metal cation) is from 0.1 to 10 Å/s, or from 0.1 to 5 Å/s and the evaporation rate of the second reactant (optionally comprising an organic cation) is from 1 to 20/s or from 1 to 10/s. The amount of perovskite disposed may be controlled by changing the amount of time for which deposition is effected. Typically, vapour deposition (in either single source or dual source cases) may be performed for from 5 to 60 minutes or from 20 to 40 minutes. The deposition time will depend on the evaporation rate used. Often, an excess of the second component is preferable, and the molar ratio of the first reactant and the second reactant deposited may be from 1:1 to 1:16, or from 1:4 to 1:16. Vapour deposition may be stopped when the desired layer thickness is obtained.

Vapour deposition is generally performed in a chamber with a pressure of less than $10^{-4}$ mbar, for instance less than $10^{-5}$ mbar. The step of disposing the second region on the first region by vapour deposition usually further comprises: (iii) heating the solid layer of the perovskite thus produced.

The step of heating the solid layer of the perovskite usually comprises heating the solid layer of the perovskite in an inert atmosphere. Typically, the temperature at which the solid layer of the perovskite is heated does not exceed 150° C. Thus, the solid layer of the perovskite may be heated at a temperature of from 30° C. to 150° C., and is preferably heated at a temperature of from 40° C. to 110° C. The solid layer of the perovskite may be heated at said temperature until it has the desired semiconducting properties. Usually, the solid layer of the perovskite is heated for at least 30 minutes, preferably for at least 1 hour. In some embodiments, the solid layer of the perovskite is heated until the desired semiconducting properties are obtained, which can be measured by routine methods for measuring conductivity and resistivity. The solid layer of the perovskite is in some cases heated until a colour change is observed, which colour change indicates that the desired semiconducting properties are obtained. In the case of the $CH_3NH_3PbI_2Cl$ perovskite, the colour change is typically from yellow to brown.

The second region may be disposed on the first region by a method comprising disposing a solid layer of a first compound (a first perovskite precursor) on the first region, and then treating the disposed layer with a solution of a second compound (a second perovskite precursor). This may be referred to as the "two step method". The solid layer of a first perovskite precursor may be disposed by vacuum deposition. This solid layer is then treated with a solution of a second perovskite precursor. The second precursor in the solution then reacts with the existing solid layer of the first perovskite precursor to produce a solid layer of the perovskite. The solid layer of a first perovskite precursor solution may be treated with a solution comprising the second perovskite precursor, for instance by dipping the solid layer of a first perovskite precursor in a solution comprising the second perovskite precursor. The solid layer of a first perovskite precursor may also be treated by disposing the solution comprising the second perovskite precursor on the solid layer of the first perovskite precursor.

The first perovskite precursor is a first compound comprising (i) a first cation and (ii) a first anion and the second perovskite precursor is a second compound comprising (i) a second cation and (ii) a second anion. The first and second cations are usually as defined herein for the perovskite, and the first and second anions may be the same or different and may be as defined herein for the first and second anions.

In one embodiment, the step of (b) disposing the second region on the first region comprises:

(i) exposing the first region to vapour, which vapour comprises a first perovskite precursor compound, and allowing deposition of the vapour onto the first region, to produce a solid layer of the first perovskite precursor compound thereon; and (ii) treating the resulting solid layer of the first perovskite precursor compound with a solution comprising a second perovskite precursor compound, and thereby reacting the first and second perovskite precursor compounds to produce said layer of the perovskite semiconductor without open porosity, wherein
the first perovskite precursor compound comprises (i) a first cation and (ii) a first anion and the second perovskite precursor compound comprises (i) a second cation and (ii) a second anion.

The first cation, first anion, second cation and second anion may be as described anywhere herein for the perovskite.

In some cases, the first cation here will be a metal cation. In some cases the second cation here will be an organic cation. Accordingly, the first compound may comprise (i) a metal cation and (ii) a first anion; and the second compound may comprise (i) an organic cation and (ii) a second anion. Preferably the metal cation is a divalent metal cation. For instance, the metal cation may be a cation selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$. Of these cations, it is preferable that the divalent metal cation is $Pb^{2+}$ or $Sn^{2+}$.

The first and second anions, which may be the same or different, may be any anions, but are typically selected from halide ions (e.g. fluoride, chloride, bromide and iodide) or chalcogenide ions (e.g. sulfide, selenide and telluride).

Often, the perovskite produced will be a mixed halide or mixed chalcogenide perovskite and the first and second anions are different anions selected from halide ions or chalcogenide ions.

Preferably the first and second anions are halide anions. Typically, the first and second anions are different anions selected from halide anions. For instance, the first anion and second anion may be one of the following pairs as (first anion:second anion): (fluoride:chloride), (chloride:fluoride), (fluoride:bromide), (bromide:fluoride), (fluoride:iodide), (iodide:fluoride), (chloride:bromide), (bromide:chloride), (chloride:iodide), (iodide:chloride), (bromide:iodide) or (iodide:bromide).

The organic cation may be selected from $(R_1R_2R_3R_4N)^+$, $(R_5NH_3)^+$, or $(R_5R_6N=CH-NR_7R_8)^+$ wherein $R_1$ to $R_8$ may be as defined above.

Often, the first compound has the formula $BX_2$ and the second compound has the formula $AX'$, wherein B is a cation selected from $Ca^{2+}$, $Sr^{2+}$, $Cd^{2+}$, $Cu^{2+}$, $Ni^{2+}$, $Mn^{2+}$, $Fe^{2+}$, $Co^{2+}$, $Pd^{2+}$, $Ge^{2+}$, $Sn^{2+}$, $Pb^{2+}$, $Yb^{2+}$ and $Eu^{2+}$, X is an anion selected from $F^-$, $Cl^-$, $Br^-$ and $I^-$, A is a cation of formula $(R_5NH_3)^+$, wherein: $R_5$ is hydrogen, or unsubstituted or substituted $C_1$-$C_{20}$ alkyl, X' is an anion selected from $F^-$, $Cl^-$, $Br^-$ and $I^-$, and X and X' are the same or different anions.

Often, the first perovskite precursor compound may be selected from lead fluoride, lead chloride, lead bromide, lead iodide, tin fluoride, tin chloride, tin bromide, or tin iodide. Typically, it is lead chloride or lead iodide. Often, the second perovskite precursor compound is selected from methylammonium fluoride, methylammonium chloride, methylammonium bromide, methylammonium iodide, ethylammonium fluoride, ethylammonium chloride, ethylammonium bromide, or ethylammonium iodide. Typically, it is methylammonium iodide.

Typically, the vapour deposition of the first perovskite precursor compound is allowed to continue until the solid layer of the first compound has a desired thickness, for instance a thickness of from 10 nm to 100 m, or more typically from 10 nm to 10 m. Preferably, the vapour deposition is allowed to continue until the solid layer of the first compound has a thickness of from 50 nm to 1000 nm, or for instance from 100 nm to 700 nm. For instance, deposition may be continued until approximately 100 nm to 300 nm of the first compound is deposited onto the first region.

The vapour deposition may continue until the solid layer of the first perovskite precursor compound has a thickness of from 100 nm to 100 m or from 100 nm to 700 nm.

The rate of evaporation of the first compound may be from 0.1 to 10 Å/s, or from 1 to 5 Å/s. The vapour deposition is generally performed in a chamber with a pressure of less than $10^4$ mbar, for instance less than $10^5$ mbar. The temperature at which the first compound is evaporated may be from 200° C. to 500° C., or from 250° C. to 350° C.

Typically, step (iii) of exposing the resulting solid layer of the first compound to a solution comprising a second compound to allow the formation of the second region comprises dipping the substrate comprising the solid layer of the first compound in the solution comprising the second compound for a sufficient time to form the second region, i.e. the layer of semiconducting perovskite without open porosity. Step (iii) may comprise dipping the substrate comprising the solid layer of the first compound in the solution comprising the second compound for from 1 to 60 minutes, or from 5 to 15 minutes. Dipping the substrate comprising the solid layer of the first compound in the solution comprising the second compound may be referred to as dip-coating.

The solution comprising the second perovskite precursor compound comprises a solvent and the second compound. The solvent may be any solvent defined herein. The solvent may be dimethylformamide, ethanol or isopropanol. The solvent may be isopropanol. The concentration of the second compound in the solvent may be from 5 to 50 mg/ml or from 10 to 30 mg/ml.

After exposing the resulting solid layer of the first perovskite precursor compound to a solution comprising a second compound to allow formation of the second region (for instance by dip coating), the substrate may be annealed. For instance, the substrate may be heated at from 80° C. to 200° C. or from 100° C. to 150° C. The substrates may be heated for from 1 to 60 minutes, or from 5 to 15 minutes. The substrates may be annealed in a nitrogen atmosphere.

Solution deposition methods may be used to dispose the second region on the first region. Thus, in some embodiments, the step of (b) disposing the second region on the first region comprises:

(i) disposing one or more precursor solutions on the first region, which one or more precursor solutions comprise:

said perovskite dissolved in a solvent, or one or more reactants for producing said perovskite dissolved in one or more solvents; and (ii) removing the one or more solvents to produce on the first region a solid layer of the perovskite.

Again, the perovskite may be any of the perovskites discussed hereinbefore for the optoelectronic device of the invention, and is typically a perovskite of formula (I), (IA) or (II) as defined hereinbefore.

Also, the one or more reactants for producing said perovskite may comprise the reactant types discussed above for the process for synthesising the perovskite compounds.

Thus, the one or more reactants may comprise:

(a) a first compound comprising (i) a first cation and (ii) a first anion; and (b) a second compound comprising (i) a second cation and (ii) a second anion, as defined hereinbefore for the process for producing the perovskite compounds employed in the optoelectronic device of the invention.

More particularly, the one or more reactants may comprise:

(a) a first compound comprising (i) a metal cation and (ii) a first anion; with (b) a second compound comprising (i) an organic cation and (ii) a second anion; wherein the first and second anions are different anions selected from halide anions or chalcogenide anions, as defined hereinbefore for the process for producing the perovskite compounds employed in the optoelectronic device of the invention. The organic cation may be as defined hereinbefore for the process for producing the perovskite.

For instance, the one or more reactants may comprise:

(a) a first compound comprising (i) a metal cation and (ii) a first halide anion; with (b) a second compound comprising (i) an organic cation and (ii) a second halide anion; wherein the first and second halide anions are different halide anions, as defined hereinbefore for the process for producing the perovskite compounds employed in the optoelectronic device of the invention.

For instance, when the perovskite being deposited is $CH_3NH_3PbI_2Cl$, the one or more reactants typically comprise (a) $PbI_2$, and (b) $CH_3NH_3Cl$.

Typically, the step of (b) disposing the second region on the first region comprises:

(i) disposing a precursor solution on the first region, which precursor solution comprises said perovskite dissolved in a solvent; and (ii) removing the solvent to produce on the first region a solid layer of the perovskite.

The perovskite may be any of the perovskites discussed hereinbefore for the optoelectronic device of the invention, and is typically a perovskite of formula (I), (IA) or (II) as defined hereinbefore.

Usually, the steps of (i) disposing a precursor solution on the first region, and (ii) removing the solvent, comprise spin coating or slot-dye-coating the precursor solution or solutions onto the first region, to produce on the first region said solid layer of the perovskite. Typically, said coating is carried out in an inert atmosphere, for instance under nitrogen. The spin coating is usually performed at a speed of from 1000 to 2000 rpm. The spin coating is typically carried out for 30 seconds to 2 minutes.

The precursor solution or solutions may be disposed by spin coating onto the first region to produce on the first region said solid layer of the perovskite.

The steps of disposing the precursor solution or solutions on the first region and removing the solvent or solvents are carried out until the solid layer of the perovskite has a desired thickness, for instance a thickness of from 10 nm to 100 m, more typically from 10 nm to 10 m. For instance, the steps of disposing the precursor solution or solutions on the first region and removing the solvent or solvents may be carried out until the solid layer of the perovskite has a thickness of from 50 nm to 1000 nm, or for instance from 100 nm to 700 nm.

The steps of disposing the precursor solution or solutions on the first region and removing the solvent or solvents may be carried out until the solid layer of the perovskite has a thickness of from 100 nm to 100 m, or from 100 nm to 700 nm.

The step of disposing the second region on the first region (by solution deposition) usually further comprises: (iii) heating the solid layer of the perovskite thus produced.

The step of heating the solid layer of the perovskite usually comprises heating the solid layer of the perovskite in an inert atmosphere. Typically, the temperature at which the solid layer of the perovskite is heated does not exceed 150° C. Thus, the solid layer of the perovskite may be heated at a temperature of from 30° C. to 150° C., and is preferably heated at a temperature of from 40° C. to 110° C. The solid layer of the perovskite may be heated at said temperature until it has the desired semiconducting properties. Usually, the solid layer of the perovskite is heated for at least 30 minutes, preferably for at least 1 hour. In some embodiments, the solid layer of the perovskite is heated until the desired semiconducting properties are obtained, which can be measured by routine methods for measuring conductivity and resistivity. The solid layer of the perovskite is in some cases heated until a colour change is observed, which colour change indicates that the desired semiconducting properties are obtained. In the case of the $CH_3NH_3PbI_2Cl$ perovskite, the colour change is typically from yellow to brown.

In some embodiments of the process of the invention (e.g. when the photoactive region of the device being produced has no scaffold material), the second region consists of said layer of said perovskite semiconductor without open porosity.

In another embodiment of the process of the invention, however, said photoactive region comprises:

said n-type region;

said p-type region; and, disposed between the n-type region and the p-type region:

(i) a first layer which comprises a scaffold material and a perovskite semiconductor; and (ii) a capping layer disposed on said first layer, which capping layer is said layer of a perovskite semiconductor without open porosity, wherein the perovskite semiconductor in the capping layer is in contact with the perovskite semiconductor in the first layer, and the process comprises:

(a) providing said first region;

(b) disposing said second region on the first region, wherein the second region comprises:

(i) a first layer which comprises a scaffold material and a perovskite semiconductor; and (ii) a capping layer on said first layer, which capping layer is said layer of a perovskite semiconductor without open porosity, wherein the perovskite semiconductor in the capping layer is in contact with the perovskite semiconductor in the first layer; and (c) disposing said third region on the second region.

Generally, the scaffold material is porous and said first layer comprises said perovskite semiconductor disposed in pores of the scaffold material. Thus, typically, in this embodiment, the step of (b) disposing said second region on the first region comprises:

(i) disposing a scaffold material on the first region; and (ii) disposing said perovskite into pores of the scaffold material in order to produce said first layer and further disposing said perovskite onto the first layer to produce said capping layer. Usually, the "disposing" of said perovskite into pores of the scaffold material and the "further disposing" of said perovskite onto the first layer are performed together in a single step, for instance by solution deposition step or by vapour deposition. They are typically performed by solution deposition.

Typically, the step (i) of disposing a scaffold material on the first region comprises:

disposing a scaffold composition onto the first region, which scaffold composition comprises the scaffold material, one or more solvents, and optionally a binder; and removing the one or more solvents and, when present, the binder.

The binder is typically a polymer binder, such as, for instance, ethyl cellulose.

This step typically comprises screen printing, doctor blading, slot-dye-coating or spin coating the scaffold composition onto the first region.

The films are typically subsequently heated, either to a temperature of around 500° C. (and usually held there for around 30 minutes) in order to degrade and remove any polymer binder that is present (high temperature sintering), or, in the absence of binder, they were typically heated around 120° C. and held there for around 90 minutes (low temperature sintering). The substrates were typically then cooled ready for perovskite solution deposition.

Thus, usually, the step (i) of disposing the scaffold material on the first region further comprises heating the scaffold composition.

Of importance to low-temperature processing of the mesoporous scaffold layer is the absence of a thermo-degradable polymer binder in the nanoparticle paste during deposition. Instead, nanoparticles are deposited from a colloidal dispersion in one or more solvents. At low-temperatures, adhesion between the particles and to the substrate is thought to proceed by dehydration of surface hydroxide groups [T. Miyasaka et al., Journal of the Electrochemical Society, vol. 154, p. A455, 2007]. The inventors also show that the porosity can be tuned by mixing two solvents in the dispersion with different viscosities and boiling points.

Thus, in a preferred embodiment, the scaffold composition does not comprise a binder and the temperature at which the scaffold composition is heated does not exceed 150° C.

Thus, typically, the step (i) of disposing a scaffold material on the first region comprises:

disposing a scaffold composition onto the first region, which scaffold composition comprises the scaffold material and one or more solvents; and removing the one or more solvents.

Usually, the step (i) of disposing the scaffold material on the first region further comprises heating the scaffold composition to a temperature that does not exceed 150° C. Typically, the scaffold composition is heated to a temperature of from 60° C. to 150° C. The scaffold composition is heated to said temperature for a suitable time, for instance until all solvents are removed. Typically, the scaffold composition is heated to said temperature for at least 30 minutes, more typically for at least 1 hour, or for at least 90 minutes.

Usually, the step (i) of disposing the scaffold material on the first region is performed until the scaffold material which is disposed on the first region has a desired thickness, for instance a thickness of from 5 nm to 500 nm, preferably from 30 nm to 200 nm.

The scaffold material employed in the scaffold composition may be as defined above for the optoelectronic device of the invention. Often, the scaffold material employed is titania or alumina.

The one or more solvents employed in the scaffold composition may comprise a mixture of two or more solvents with different viscosities and boiling points, for instance a mixture of two solvents with different viscosities and boiling points. The use of two or more solvents with different viscosities and boiling points is advantageous, as the inventors have shown that the porosity of the scaffold material disposed on the first region can be tuned by varying the ratio of the two or more solvents. The two or more solvents may for instance comprise two or more different alcohols, for instance two different alcohols. Thus, for example, the two or more solvents may comprise two solvents selected from ethanol, propanol, butanol and terpineol, or from ethanol, iso-propanol, tert-butanol and terpineol.

Typically, step (ii), of disposing said perovskite into pores of the scaffold material in order to produce said first layer and further disposing said perovskite onto the first layer to produce said capping layer is carried out until the capping layer has a desired thickness, for instance a thickness of from 10 nm to 100 m, or more typically a thickness of from 10 nm to 10 m, preferably from 50 nm to 1000 nm, or for instance a thickness of from 100 nm to 700 nm.

Solution deposition methods may be used to dispose said perovskite into pores of the scaffold material in order to produce said first layer and further dispose said perovskite onto the first layer to produce said capping layer. Thus, in some embodiments, the step (ii), of disposing said perovskite into pores of the scaffold material in order to produce said first layer and further disposing said perovskite onto the first layer to produce said capping layer, comprises:

disposing one or more precursor solutions onto the scaffold material, which one or more precursor solutions comprise: said perovskite dissolved in a solvent, or one or more reactants for producing said perovskite dissolved in one or more solvents; and removing the one or more solvents to produce solid perovskite in pores of the scaffold material and a solid capping layer of the perovskite disposed on the first layer.

The perovskite may be any of the perovskites discussed hereinbefore for the optoelectronic device of the invention, and is typically a perovskite of formula (I), (IA) or (II) as defined hereinbefore.

Also, the one or more reactants for producing said perovskite may comprise the reactant types discussed above for the process for synthesising the perovskite compounds.

Thus, the one or more reactants may comprise:

(a) a first compound comprising (i) a first cation and (ii) a first anion; and (b) a second compound comprising (i) a second cation and (ii) a second anion, as defined hereinbefore for the process for producing the perovskite compounds employed in the optoelectronic device of the invention.

More particularly, the one or more reactants may comprise:

(a) a first compound comprising (i) a metal cation and (ii) a first anion; with (b) a second compound comprising (i) an organic cation and (ii) a second anion; wherein the first and second anions are different anions selected from halide anions or chalcogenide anions, as defined hereinbefore for the process for producing the perovskite compounds employed in the optoelectronic device of the invention.

For instance, the one or more reactants may comprise:

(a) a first compound comprising (i) a metal cation and (ii) a first halide anion; with (b) a second compound comprising (i) an organic cation and (ii) a second halide anion; wherein the first and second halide anions are different halide anions, as defined hereinbefore for the process for producing the perovskite compounds employed in the optoelectronic device of the invention.

For instance, when the perovskite being deposited is $CH_3NH_3PbI_2Cl$, the one or more reactants typically comprise (a) $PbI_2$, and (b) $CH_3NH_3Cl$.

Typically, the step (ii), of disposing said perovskite into pores of the scaffold material in order to produce said first layer and further disposing said perovskite onto the first layer to produce said capping layer, comprises:

disposing a precursor solution onto the scaffold material, which precursor solution comprises said perovskite dissolved in a solvent; and removing the solvent to produce solid perovskite in pores of the scaffold material and a solid capping layer of the perovskite disposed on the first layer.

The perovskite may be any of the perovskites discussed hereinbefore for the optoelectronic device of the invention, and is typically a perovskite of formula (I), (IA) or (II) as defined hereinbefore.

Usually, the steps of disposing a precursor solution onto the scaffold material, and removing the solvent or solvents, comprise spin coating or slot-dye-coating the precursor solution or solutions onto the scaffold material, to produce said solid perovskite in pores of the scaffold material and said solid capping layer of the perovskite disposed on the first layer. Typically, the coating is carried out in an inert atmosphere, for instance under nitrogen. The spin coating may for instance be performed at a speed of from 1000 to 2000 rpm. The spin coating is typically carried out for 30 seconds to 2 minutes.

The steps of disposing the precursor solution or solutions onto the scaffold material and removing the solvent or solvents are carried out until the solid capping layer of the perovskite has a desired thickness, for instance a thickness of from 10 nm to 100 m, or more typically from 10 nm to 10 m, or, for instance, from 50 nm to 1000 nm, preferably from 100 nm to 700 nm.

Usually, the step of (b) disposing said second region on the first region further comprises: (iii) heating the perovskite.

The step of heating the perovskite usually comprises heating the perovskite in an inert atmosphere, for instance under nitrogen. Typically, the temperature at which the perovskite is heated does not exceed 150° C. Thus, the perovskite may be heated at a temperature of from 30° C. to 150° C., and is preferably heated at a temperature of from 40° C. to 110° C. The perovskite may be heated at said temperature until it has the desired semiconducting properties. Usually, the perovskite is heated for at least 30 minutes, preferably for at least 1 hour. In some embodiments, the perovskite is heated until the desired semiconducting properties are obtained, which can be measured by routine methods for measuring conductivity and resistivity. The perovskite is in some cases heated until a colour change is observed, which colour change indicates that the desired semiconducting properties have been obtained. In the case of the $CH_3NH_3PbI_2C$ perovskite, the colour change is typically from yellow to brown.

Usually, in the process of the invention for producing an optoelectronic device the first region is disposed on a first electrode. That is to say, the first region is usually already disposed on a first electrode.

The process of the invention for producing an optoelectronic device may however further comprise a step of:

disposing the first region on a first electrode.

This step is generally carried out before the step of disposing the second region on the first region.

The first and second electrodes are an anode and a cathode, one or both of which is transparent to allow the ingress of light. The choice of the first and second electrodes may depend on the structure type.

Typically, first electrode onto which the second region is disposed is tin oxide, more typically fluorine-doped tin oxide (FTO), which is usually a transparent or semi-transparent material. Thus, the first electrode is usually transparent or semi-transparent and typically comprises FTO. Usually, the thickness of the first electrode is from 200 nm to 600 nm, more usually, from 300 to 500 nm. For example the thickness may be 400 nm. Typically, the FTO is coated onto a glass sheet. Often, the FTO coated glass sheets are etched with zinc powder and an acid to produce the required electrode pattern. Usually the acid is HCl. Often the concentration of the HCl is about 2 molar. Typically, the sheets are cleaned and then usually treated under oxygen plasma to remove any organic residues. Usually, the treatment under oxygen plasma is for less than or equal to 1 hour, typically about 5 minutes. The first and second electrodes may be as described anywhere hereinbefore, for instance the first electrode may comprise FTO, ITO or AZO.

The steps of disposing the first region on a first electrode and disposing the third region on the second region, comprise deposition of the p-type and the n-type regions, i.e. deposition of the one or more p-type layers and deposition of the one or more n-type layers. The p-type and the n-type regions, and the one or more p-type layers and the one or more n-type layers, may be as further defined hereinbefore.

The step of depositing a layer of a p-type or n-type inorganic compound may, for instance, comprise depositing the layer by spin coating or by slot-dye-coating the compound or a precursor thereof, or by spray pyrolysis. For instance, a compact layer of titania may be produced by spincoating a (mildly) acidic titanium-isopropoxide sol in a suitable solvent, such as ethanol. Such a sol can be prepared by mixing titanium isopropoxide and anhydrous ethanol with a solution of HCl in anhydrous ethanol. After spincoating, the layer is typically dried at a temperature not exceeding 150° C. Optionally, the compact layer was subsequently heated to 500° C. for 30 minutes on a hotplate in air. Alternatively, such a compact layer may be produced by, spray pyrolysis deposition. This will typically comprise deposition of a solution comprising titanium diisopropoxide bis(acetylacetonate), usually at a temperature of from 200 to 300° C., often at a temperature of about 250° C. Usually the solution comprises titanium diisopropoxide bis(acetylacetonate) and ethanol, typically in a ratio of from 1:5 to 1:20, more typically in a ratio of about 1:10.

Such methods can be applied to other p-type or n-type inorganic materials, to produce n-type and p-type layers in the optoelectronic devices of the invention.

Deposition of an organic, molecular or polymeric hole transporter or electron transporter material my be achieved by spin-coating a solution of the material in a suitable solvent. The p-type hole transporter, spiro-OMeTAD, for instance, is typically dissolved in chlorobenzene. Usually the concentration of spiro-OMeTAD in chlorobenzene is from 150 to 225 mg/ml, more usually the concentration is about 180 mg/ml. An additive may be added to the hole transporter or electron transporter material. The additive may be, for instance, tBP, Li-TFSi, an ionic liquid or an ionic liquid with a mixed halide(s).

The process of the invention for producing an optoelectronic device may further comprise: (d) disposing a second electrode on the third region.

Usually, the second electrode comprises a high work function metal, for instance gold, silver, nickel, palladium or platinum, and typically silver. Usually, the thickness of the second electrode is from 50 nm to 250 nm, more usually from 100 nm to 200 nm. For example, the thickness of the second electrode may be 150 nm.

The second electrode is typically disposed on the third region by vapour deposition. Often, the step of producing a second electrode comprises placing a film comprising the hole transporting material in a thermal evaporator. Usually, the step of producing a second electrode comprises deposition of the second electrode through a shadow mask under a high vacuum. Typically, the vacuum is about $10^{-6}$ mBar.

The second electrode may, for example, be an electrode of a thickness from 100 to 200 nm. Typically, the second electrode is an electrode of a thickness from 150 nm.

Alternatively, the process of the invention for producing an optoelectronic device may be a process for producing an inverted optoelectronic device.

Accordingly, the invention provides a process for producing an inverted optoelectronic device comprising a photoactive region, which photoactive region comprises:
an n-type region comprising at least one n-type layer;
a p-type region comprising at least one p-type layer; and, disposed between the n-type region and the p-type region:
a layer of a perovskite semiconductor without open porosity, which process comprises:
(a) providing a first region;
(b) disposing a second region on the first region, which second region comprises a layer of a perovskite semiconductor without open porosity; and
(c) disposing a third region on the second region, wherein:
the first region is a p-type region comprising at least one p-type layer and the third region is an n-type region comprising at least one n-type layer, and the first region is disposed on a first electrode.

Typically, the first electrode comprises a transparent or semi-transparent material. Typically, the first electrode comprises a transparent conducting oxide, for example FTO, ITO or AZO. Preferably, the first electrode comprises FTO. The first electrode may be disposed on a glass substrate.

Each of the steps in the process for producing an inverted optoelectronic device may be as defined anywhere herein for a process according to the invention for producing an optoelectronic device. Each of the components used or present in the process may be as defined for an optoelectronic device according to the invention.

The first region, which is a p-type region, may be as defined anywhere herein for a p-type region. Often, the first region comprises a layer of PEDOT:PSS. Crosslinking may be performed to insolubilise the p-type region so that it is not partially dissolved during the disposition of the second region, if the disposition process might lead to the p-type layer being dissolved. Occasionally, therefore, the layer of PEDOT:PSS comprises crosslinked PEDOT:PSS. Crosslinking may be performed using a lewis acid, for instance a metal cation such as $Fe^{3+}$ or $Mg^{2+}$. For instance, (a) may comprise
(i) providing a first region comprising a layer of PEDOT:PSS and
(ii) treating the layer with aqueous $FeCl_3$ to produce a layer of PEDOT:PSS comprising crosslinked PEDOT:PSS.

The second region, which is an n-type region, may be as defined anywhere herein for an n-type region. Often, the n-type region comprises a compact layer of an inorganic n-type semiconductor, such as those defined herein. Typically, the n-type region comprises a compact layer of titanium dioxide. In some embodiments, the n-type region further comprises a layer of [60]PCBM.

Therefore, in some embodiments, (c) comprises
(i) disposing on the second region a layer of [60]PCBM; and
(ii) disposing on the layer of [60]PCBM a compact layer of titanium dioxide.

In an inverted device, a second electrode may be disposed on the third region which is an n-type region. Accordingly, the process may further comprise
(d) disposing a second electrode on the third region.

The second electrode may be disposed directly onto the third region, or there may be further intervening layers. Typically, the second electrode is in contact with the third region. The second electrode may be as defined anywhere herein and typically comprises a metal. For instance, the second electrode may comprise aluminium, gold, silver, nickel, palladium or platinum, and typically aluminium, silver or gold. In one embodiment, the second electrode comprises silver, gold or aluminium. For example, if the n-type region comprises a compact layer of titanium and a layer of [60]PCBM, the second electrode may comprise aluminium. The second electrode may be disposed by any technique such as those described herein, although it is typically disposed by vacuum deposition.

Accordingly, the second electrode may be disposed by vacuum deposition. Alternatively, the process of the invention for producing an optoelectronic device may be a process for producing a tandem- or multi-junction optoelectronic device which further comprises:
(d) disposing a tunnel junction on the third region;
(e) disposing a further photoactive region on the tunnel junction, which is the same as or different from the photoactive region defined hereinbefore;
(f) optionally repeating steps (d) and (e); and
(g) disposing a second electrode on the further photoactive region disposed in the preceding step.

In a process for producing a tandem or multi-junction device according to the invention, the further photoactive region may be as defined anywhere hereinbefore for tandem optoelectronic devices according to the invention. In particular, the further photoactive region may comprise a layer of crystalline silicon, or may comprises a thin film of CIGS, CIS or CZTSSe.

In a preferred embodiment of the process of the invention for producing an optoelectronic device, the entire process is performed at a temperature or temperatures not exceeding 150° C.

In the process of the invention for producing an optoelectronic device, the optoelectronic device may be as further defined hereinbefore for the optoelectronic device of the invention.

The invention further provides an optoelectronic device which is obtainable by the process of the invention for producing an optoelectronic device.

The present invention is further illustrated in the Examples which follow:

EXAMPLES

Experimental Methods for Device Preparation
Preparation of $Al_2O_3$ Paste with Polymer Binder An aluminum oxide dispersion was purchased from Sigma-Aldrich (10% wt in water) and was washed in the following manner: it was centrifuged at 7500 rpm for 6 h, and redispersed in Absolute Ethanol (Fisher Chemicals) with an ultrasonic probe; which was operated for a total sonication time of 5 minutes, cycling 2 seconds on, 2 seconds off. This process was repeated 3 times.

For every 10 g of the original dispersion (1 g total $Al_2O_3$) the following was added: 3.33 g of α-terpineol and 5 g of a 50:50 mix of ethyl-cellulose 10 cP and 46 cP purchased from Sigma Aldrich in ethanol, 10% by weight. After the addition of each component, the mix was stirred for 2 minutes and sonicated with the ultrasonic probe for 1 minute of sonication, using a 2 seconds on 2 seconds off cycle. Finally, the resulting mixture was introduced in a rotary evaporator to remove excess ethanol and achieve the required thickness when doctor blading, spin-coating or screen printing.

Preparation of $TiO_2$ Paste with Polymer Binder

A titanium dioxide dispersion containing a polymer binder (DSL 18NR-T) was purchased from Dyesol. It was diluted at a 3:1 weight ratio of absolute ethanol (Fisher Chemicals):DSL 18NR-T with an ultrasonic probe; which was operated for a total sonication time of 5 minutes, cycling 2 seconds on, 2 seconds off.

Preparation of $Al_2O_3$ Paste without Polymer Binder

An aluminum oxide dispersion was purchased from Sigma-Aldrich (20% by weight in isopropanol). This was diluted in 16 volume equivalents of isopropanol.

Preparation of $TiO_2$ Paste without Polymer Binder

An titanium dioxide powder (P25) was purchased from (Degussa) and dispersed in ethanol at 20 mg/ml. This was diluted in 16 volume equivalents of ethanol.

Preparation of Methylammonium Iodide Precursor and Perovskite Precursor Solution Methylamine ($CH_3NH_2$) solution 33 wt. % in absolute ethanol (Sigma-Aldrich) was reacted with hydroiodic acid 57 wt. % in water (Sigma-Aldrich) at 1:1 molar ratio under nitrogen atmosphere in anhydrous ethanol 200 proof (Sigma-Aldrich). Typical quantities were 24 ml methylamine, 10 ml hydroiodic acid and 100 ml ethanol. Crystallisation of methylammonium iodide ($CHNH_3I$) was achieved using a rotary evaporator. A white coloured precipitate was formed indicating successful crystallisation.

The methylamine can be substituted for other amines, such as ethylamine, n-butylamine, tert-butylamine, octylamine etc. in order to alter the subsequent perovskite properties. In addition, the hydroiodic acid can be substituted with other acids to form different perovskites, such as hydrochloric acid.

To prepare the precursor solution methylammonium iodide ($CHNH_3I$) precipitate and lead (II) chloride (Sigma-Aldrich) was dissolved in dimethylformamide ($C_3H_7NO$) (Sigma-Aldrich) at 1:1 molar ratio at 30 vol. %.

Cleaning and Etching of the Substrate and Transparent Electrode

Fluorine doped tin oxide ($F:SnO_2$/FTO) coated glass sheets (TEC 15, 15 Ω/square, Pilkington USA) were etched with zinc powder and HCl (2 M) to give the required electrode pattern. The sheets were subsequently cleaned with soap (2% Hellmanex in water), deionised water, acetone, ethanol and finally treated under oxygen plasma for 5 minutes to remove any organic residues.

Deposition of the Compact $TiO_2$ Layer

The patterned FTO sheets were then coated with a compact layer of $TiO_2$ by spincoating a mildly acidic titanium-isopropoxide (Sigma-Aldrich) sol in ethanol. The sol was prepared by mixing titanium isopropoxide:anhydrous ethanol at a weight ratio of 0.71:4 with an acidic solution of 2 M HCl:anhydrous ethanol at a weight ratio of 0.07:4. After spincoating (speed=2000 rpm, acceleration=2000 rpm/s, time=60 s), the substrates were dried at 150° C. on a hotplate for 10 minutes. Optionally, the compact layer was subsequently heated to 500° C. for 30 minutes on a hotplate in air.

Deposition of the Thin Mesoporous Metal Oxide Layer

The insulating metal oxide paste (e.g. the $Al_2O_3$ paste) was applied on top of the compact metal oxide layer via screen printing, doctor blade coating or spin-coating, through a suitable mesh, doctor blade height or spin-speed to create a film with a thickness of ~100 nm. The films were subsequently either heated to 500° C. and held there for 30 minutes in order to degrade and remove the polymer binder (high temperature sintering), or, in the absence of binder, heated to 120° C. and held there for 90 minutes (low temperature sintering). The substrates were then cooled ready for perovskite solution deposition.

Solution Deposition of the Perovskite Precursor and Formation of the Semiconducting Perovskite Thin-Film 40 μl of the perovskite precursor solution in dimethylformamide (methylammonium iodide lead (II) chloride ($CH_3NH_3PbCl_2I$)) at a volume concentration of 30% was dispensed onto each prepared mesoporous electrode film and spin-coated at 1500 rpm for 60 s in an inert nitrogen environment. The coated films were then placed on a hot plate set at 100° C. and left for 60 minutes in nitrogen, prior to cooling. During the drying procedure at 100 degrees, the coated electrode changed colour from light yellow to dark brown, indicating the formation of the desired perovskite film with the semiconducting properties.

Evaporated Deposition of the Perovskite Precursor and Formation of the Semiconducting Perovskite Thin-Film A 1:1 molar ratio of $PbI_2$ and $CH_3NH_3Cl$ was ground with a pestle and mortar for 15 minutes to form a bulk perovskite powder. This formed a powder which was desiccated in a nitrogen environment for >12 hours. A crucible of perovskite powder was transferred to an evaporation chamber which was subsequently evacuated. The crucible was slowly heated to 300° C. When the source temperature reached 100° C., a shutter was opened to commence deposition onto the substrates. The heater was periodically switched off to maintain a pressure of $10^{-4}$ mbar in the chamber. Evaporation continued until a thin film of approximately 100-300 nm had been deposited onto the substrates. Following evaporation the substrate with evaporated material was heated to 50° C. for 1 hour in a nitrogen environment.

Preparation of Perovskites Comprising a Formamidinium Cation

As an alternative to ammonium ions, formamidinium cations may be used. Formamidinium iodide (FOI) and formamidinium bromide (FOBr) were synthesised by reacting a 0.5M molar solution of formamidinium acetate in ethanol with a 3× molar excess of hydroiodic acid (for FOI) or hydrobromic acid (for FOBr). The acid was added dropwise whilst stirring at room temperature, then left stirring for another 10 minutes. Upon drying at 100° C., a yellow-white powder is formed, which is then dried overnight in a vacuum oven before use. To form $FOPbI_3$ and $FOPbBr_3$ precursor solutions, FOI and $PbI_2$ or FOBr and $PbBr_2$ were dissolved in anhydrous N,N-dimethylformamide in a 1:1 molar ratio, 0.88 millimoles of each per ml, to give 0.88M perovskite precursor solutions. To form the FOPbI$_{3z}$Br$_{3(1-z)}$ perovskite precursors, mixtures were made of the FOPbI$_3$ and FOPbBr$_3$ 0.88M solutions in the required ratios, where z ranges from 0 to 1. Films for characterisation or device fabrication were spin-coated in a nitrogen-filled glovebox, and annealed at 170° C. for 25 minutes in the nitrogen atmosphere.

Hole-Transporter Deposition and Device Assembly

The hole transporting material used was 2,2(,7,7(-tetrakis-(N,N-di-methoxyphenylamine)9,9(-spirobifluorene)) (spiro-OMeTAD, Lumtec, Taiwan), which was dissolved in chlorobenzene at a typical concentration of 180 mg/ml. Tertbutyl pyridine (tBP) was added directly to the solution with a volume to mass ratio of 1:26/mg tBP:spiro-MeOTAD. Lithium bis(trifluoromethylsulfonyl)amine salt (Li-TFSI) ionic dopant was pre-dissolved in acetonitrile at 170 mg/ml, then added to the hole-transporter solution at 1:12/mg of Li-TFSI solution:spiro-MeOTAD. A small quantity (80 l) of the spiro-OMeTAD solution was dispensed onto each perovskite coated film and spin-coated at 1500 rpm for 30 s in air. The films were then placed in a thermal evaporator where 200 nm thick silver electrodes were deposited through a shadow mask under high vacuum ($10^{-6}$ mBar).

Device Variations Investigated

A generic schematic of the device structure is shown in FIG. 1a. This device can be mounted on any solid substrate material (glass, plastic, metal foil, metal mesh etc.). In FIG. 1a at least one of the metallic electrodes must be transparent/semitransparent (for example: doped or undoped metal oxide, perovskite, polymer, thin metal, metal mesh etc.) whereas the opposite electrode can be transparent/semitransparent or reflective. The light absorbing perovskite, which can be n-type, p-type or intrinsic, is sandwiched between one n-type and one p-type semiconducting layer (organic, inorganic, amorphous-Si, perovskite, hybrid organic/inorganic etc.) for selective electron and hole extraction respectively. The structure shown can be inverted. Multijunction cells can be produced by stacking a repeat structure.

Certain embodiments of the devices of the invention have the specific structure shown in FIG. 1b. When used, the thin metal oxide layer is generally permeable to the solution-processed perovskite, to ensure direct contact of the perovskite with the electron-selective contact. Each of the preparation variations investigated here are summarised in Table 1.

TABLE 1

Summary of variations to layers investigated.

| TiO$_2$ compact layer heating conditions | Mesoporous metal oxide paste | Mesoporous oxide sintering conditions | Perovskite deposition method | Variation Label |
|---|---|---|---|---|
| 150° C. | Al$_2$O$_3$ with binder | 500° C. | Solution | HT B—Al$_2$O$_3$ |
| 150° C. | TiO$_2$ with binder | 500° C. | Solution | HT B—TiO$_2$ |
| 150° C. | Al$_2$O$_3$ without binder | 500° C. | Solution | HT Al$_2$O$_3$ |
| 150° C. | TiO$_2$ without binder | 500° C. | Solution | HT TiO$_2$ |
| 150° C. | Al$_2$O$_3$ without binder | 120° C. | Solution | LT Al$_2$O$_3$ |
| 150° C. | TiO$_2$ without binder | 120° C. | Solution | LT TiO$_2$ |
| 150° C. + 500° C. | Al$_2$O$_3$ without binder | 120° C. | Solution | HT C/LT Al$_2$O$_3$ |
| 150° C. | — | — | Solution | LT C |
| 150° C. + 500° C. | — | — | Solution | HT C |

TABLE 1-continued

Summary of variations to layers investigated.

| TiO$_2$ compact layer heating conditions | Mesoporous metal oxide paste | Mesoporous oxide sintering conditions | Perovskite deposition method | Variation Label |
|---|---|---|---|---|
| 150° C. + 500° C. | — | — | Evaporation | Evaporated |

Results and Discussion

Porosity Control of Mesoporous Al$_2$O$_3$ Sintered at Low-Temperature

The porosity of a mesoporous layer of Al$_2$O$_3$ can be controlled by mixing two solvents with different viscosities and different evaporation rates in the nanoparticle dispersion. After deposition from the dispersion and solvent removal, the refractive index of a mesoporous composite thin-film of Al$_2$O$_3$ and air depends on the volume fraction of the two components i.e. the porosity. The refractive indices of films formed by spin-coating dispersions with varying content of terpineol and t-butanol onto glass slides are presented in the Table 2 below, indicated as volume equivalents. A lower refractive index is indicative of a larger volume fraction of air i.e. a more porous film. It is found in general that adding a secondary solvent increases the porosity of the resulting mesoporous film.

TABLE 2

Summary of porosity variation with a varying quantity of added volume equivalents of a secondary solvent into the alumina dispersion as indicated by the measured refractive index of resulting film.

| 20% by wt Al$_2$O$_3$ in IPA (equiv.) | IPA added (equiv.) | Terpineol added (equiv.) | t-Butanol added (equiv.) | Refractive Index |
|---|---|---|---|---|
| 1 | 1 | 0 | 0 | 1.26 |
| 1 | 1 | 0.2 | 0 | 1.27 |
| 1 | 1 | 0.5 | 0 | 1.24 |
| 1 | 1 | 1 | 0 | 1.21 |
| 1 | 1 | 0 | 0.2 | 1.14 |
| 1 | 1 | 0 | 0.5 | 1.16 |
| 1 | 1 | 0 | 1 | 1.13 |

X-Ray Diffraction

Figure 2:
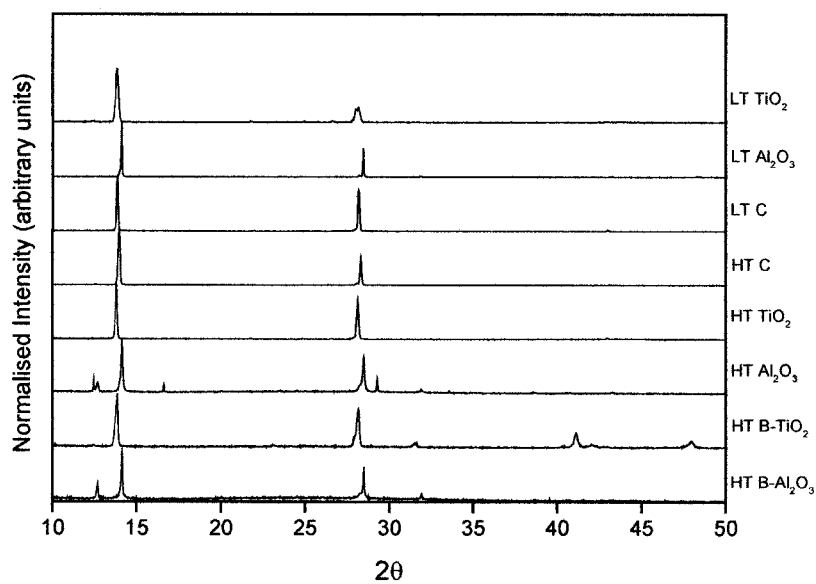
FIG. 2 shows (a) XRD spectra of perovskite films grown on each of the underlayer variations investigated in the Examples hereinbelow; and (b) an XRD spectrum of perovskite formed by evaporation.
Figure 2:
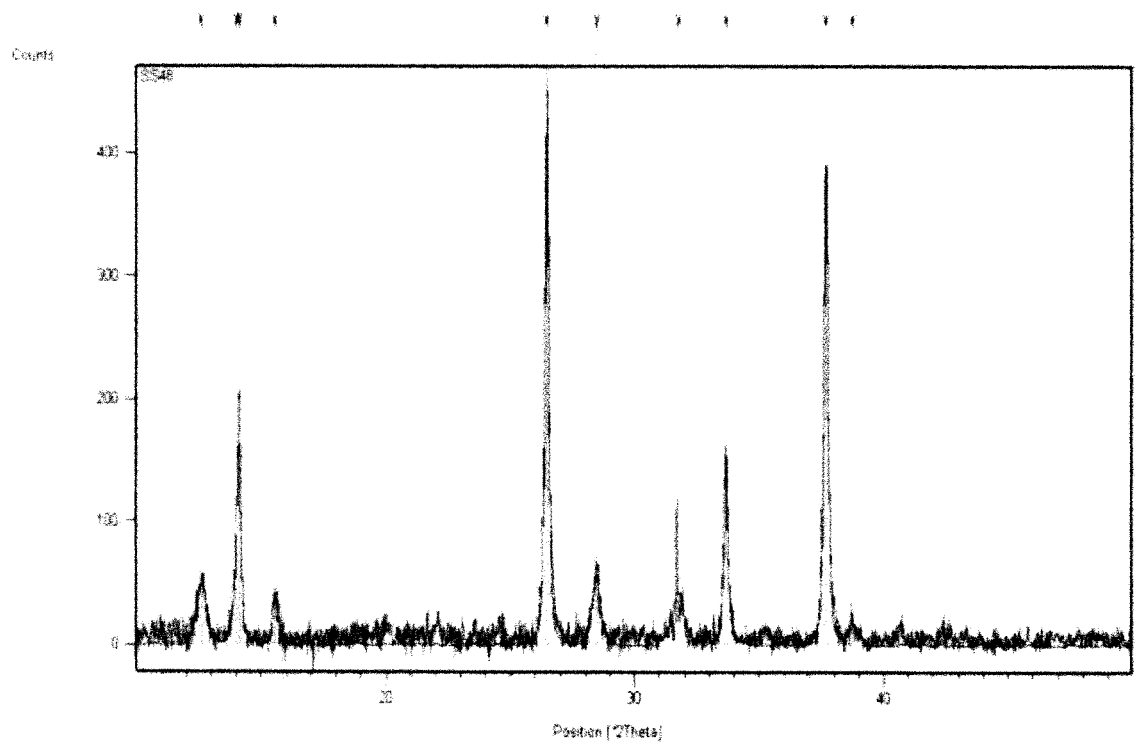

The XRD patterns of perovskite thin-films based on the different underlayer variations investigated are shown in FIG. 2a. All samples were prepared on plain glass and, where thin mesoporous oxides are specified, without compact layers. Both the 110 and 220 perovskite peaks are prominent in agreement with our previous demonstration of this perovskite [Lee et al., Science, Submitted 2012]. FIG. 2b shows the XRD pattern of the perovskite when evaporated. Peaks corresponding for the mixed halide perovskite are present in addition to those occurring from PbI$_2$.

UV-Vis Spectroscopy

Figure 3:
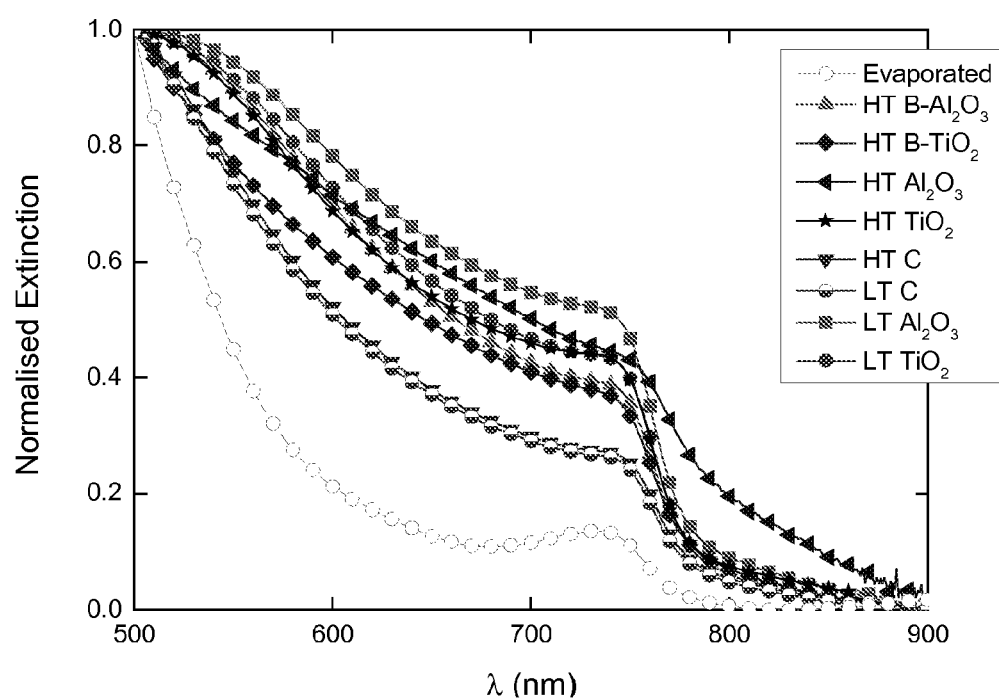
FIG. 3 shows normalised UV-vis spectra of perovskite films grown on each of the underlayer variations investigated in the Examples hereinbelow.

The UV-vis patterns for perovskite thin-films based on the different underlayer variations investigated are shown in FIG. 3. All samples were prepared on plain glass and, where thin mesoporous oxides are specified, without compact layers. The spectra show the normalised extinction ($\varepsilon = \log_{10}[I_0/I_1]$). All spectra show an absorption onset at a wavelength of ~800 nm confirming the presence of perovskite. Although XRD diffraction peaks corresponding to PbI$_2$ are observed for the evaporated perovskite, the UV-vis spectrum indicates that most of the light is absorbed by the perovskite. The shapes of the spectra are in agreement with our previous demonstration of this perovskite [M. Lee et al., Science, Submitted 2012].

Current-Voltage Characteristics

Figure 4:
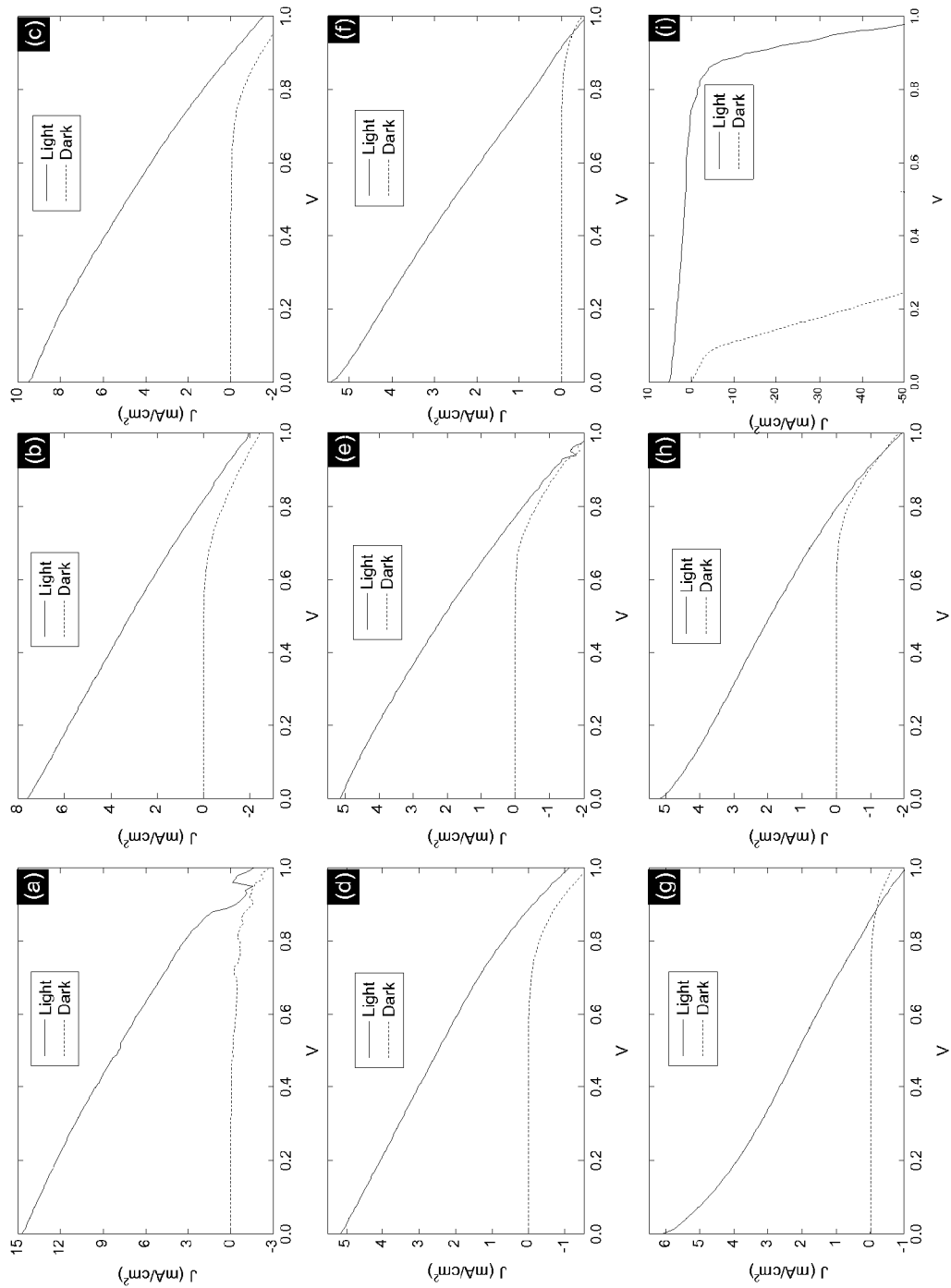
FIG. 4 shows representative J-V characteristics of devices with the following variations: (a) HT B—$Al_2O_3$, (b) HT B—$TiO_2$, (c) HT $Al_2O_3$, (d) HT $TiO_2$, (e) HT C, (f) LT $Al_2O_3$, (g) LT $TiO_2$, (h) LT C, and (i) Evaporated.

The current density-voltage (J-V) characteristics of some devices representing each variation investigated are presented in FIG. 4. A summary of the parameters extracted from these results is presented in Table 3. The thickness of the thin oxide layer ($t_{mesoporous}$) and the perovskite capping layer ($t_{perovskite\,cap}$) as measured with a surface profilometer are also shown in Table 3. For thickness measurements the samples were prepared on plain glass and, where thin mesoporous oxides are specified, without compact layers. The ratio of these thicknesses suggests that the majority of light absorption will occur in the capping layer forming a planar heterojunction with the hole transport material.

TABLE 3

Summary of parameters extracted from J-V characteristics of most efficient devices.

| Device Structure | $t_{mesoporous}$ (nm) | $t_{perovskite\,cap}$ (nm) | $J_{sc}$ (mA/cm$^2$) | $V_{oc}$ (V) | Fill Factor | PCE (%) |
|---|---|---|---|---|---|---|
| H TB-Al$_2$O$_3$ | 83 | 221 | 14.69 | 0.95 | 0.30 | 4.24 |
| HT B-TiO$_2$ | 251 | 370 | 8.76 | 0.68 | 0.32 | 1.92 |
| HT Al$_2$O$_3$ | 91 | 659 | 11.60 | 0.92 | 0.29 | 3.14 |
| HT TiO$_2$ | 105 | 298 | 5.27 | 0.88 | 0.28 | 1.29 |
| HT C | — | 303 | 6.15 | 0.78 | 0.27 | 1.28 |
| HT C/LT Al$_2$O$_3$ | 72 | 407 | 15.2 | 0.92 | 0.32 | 4.55 |
| LT Al$_2$O$_3$ | 72 | 407 | 4.91 | 0.94 | 0.36 | 1.68 |
| LT TiO$_2$ | 104 | 350 | 1.68 | 0.9 | 0.60 | 1.19 |
| LT C | — | 374 | 3.00 | 0.81 | 0.38 | 0.92 |
| Evaporated | — | 100-300 | 5.33 | 0.73 | 0.21 | 0.83 |

Scanning Electron Microscopy

SEM micrographs of solar cell cross-sections are shown in FIG. 5(a)-(f). The distinct layers shown in the cross-sections are, from right to left: glass, FTO, compact layer, mesoporous layer, perovskite capping layer, spiro-OMeTAD and Ag. Planar images of mesoporous layers are shown in FIG. 6(a)-(f) and FIGS. 7(a) and (b). Where Al$_2$O$_3$ is used, both with and without binder and sintered at both high and low temperatures, the images clearly show a mesoporous structure allowing infiltration and seeding of the perovskite. Compact layers shown in FIGS. 6(e) and 6(f) appear featureless at the resolution of the instrument. Where TiO$_2$ is used, with binder the film appears mesoporous. However, in the absence of binder the nanoparticles aggregate forming a submonolayer.

Conclusion

The Examples show that it is possible to create planar n-type/perovskite absorber/p-type structured optoelectronic devices. Growth of a perovskite light absorber was achieved on a thin scaffold or in the absence of scaffold from solution deposition. Devices incorporating a thin seed layer can be processed entirely at temperatures not exceeding 150° C. which is important for flexible and/or tandem/multijunction devices. Additionally it has been shown that the perovskite can by formed by evaporation from a bulk powder.

Inverted Heterojunction Perovskite Solar Cells

Substrate Preparation:

Fluorine doped tin oxide (FTO) coated glass sheets (7Ω/□ Pilkington) were etched with zinc powder and HCl (2 Molar) to obtain the required electrode pattern. The sheets were then washed with soap (2% Hellmanex in water), de-ionized water, acetone, methanol and finally treated under an oxygen plasma for 5 minutes to remove the last traces of organic residues.

TiOx Flat Film Precursor Solution

The TiO$_x$ flat film precursor solution consists of 0.23 M titanium isopropoxide (Sigma Aldrich, 99.999%) and 0.013 M HCl solution in ethanol (>99.9% Fisher Chemicals). To prepare this solution, titanium isopropoxide was diluted in ethanol at 0.46 M. Separately, a 2M HCl solution was diluted down with ethanol to achieve a 0.026M concentration. Finally, the acidic solution was added dropwise to the titanium precursor solution under heavy stirring.

Regular Architecture Fabrication:

The etched FTO substrates were coated with a compact layer of TiO$_2$ deposited by spin-coating the TiO$_x$ flat film precursor solution at 2000 rpm for 60 s and consequently heating at 500° C. for 30 minutes to form stoichiometric anatase titania. Then the mesostructured scaffold was deposited by spin-coating a colloidal dispersion of ~20 nm Al$_2$O$_3$ nanoparticles in isopropanol, followed by drying at 150° C. for 10 minutes. After cooling down to room temperature, the perovskite was deposited by spin-coating from a DMF solution of methylammonium iodide and PbCl$_2$ (3:1 molar ratio), which formed the perovskite after heating to 100° C. for 45 minutes. The hole-transport layer was deposited by spin-coating a 7 vol. % spiro-OMeTAD (2,2',7,7'-tetrakis-(N,N-di-p-methoxyphenylamine)9,9'-spirobifluorene) in chlorobenzene solution with added 80 mM tert-butylpyridine (tBP) and 25 mM lithium bis(trifluoromethanesulfonyl) Imide (LITFSI) at 1000 rpm for 45 s. Finally, devices were completed with evaporation in a high vacuum of Ag contact electrodes through a shadow mask.

Inverted Architecture Fabrication:

PEDOT:PSS:

The etched FTO substrates were coated with a thin film of PEDOT:PSS deposited by spincoating a 25:75 vol % solution of PEDOT:PSS (Clevios):isopropanol (>99.9%, Fisher Chemicals) at 2000 rpm for 60 s and subsequently annealed at 150° C. for 20 minutes or crosslinked by submerging the substrates for 5 min in a 0.25 M FeCl$_3$ aqueous solution, subsequently washed in 2 sequential baths of deionized water then finally dried with nitrogen.

NiO:

The spincoating precursor for the NiO thin film was prepared by dissolving nickel acetate tetrahydrate and monoethanolamine in ethanol both at a 0.1M concentration under stirring in a sealed vial in air on a hotplate at 70 C for 4 h. The solution appeared homogenous and deep green.

V2O5:

The etched FTO substrates were coated with a thin film of V$_2$O$_5$ deposited by spincoating a 1:35 vol % solution of vanadium (V) oxitriisopropoxide (Sigma Aldrich) in isopropanol and subsequently heated to 500° C. to obtain crystalline vanadium oxide layers.

Perovskite and n-Type Contact Deposition:

After cooling down/drying, the perovskite precursor solution was spincoated at 2000 rpm for 20 s and it was then heated to 100° C. for 45 minutes to form the structure. The electron selective contact was deposited by spincoating a 20 mgmL$^{-1}$ solution of [60]PCBM in chlorobenzene (Anhydrous, Sigma Aldrich) at 1000 rpm for 45 s. The TiO$_x$ flat film precursor solution was then spincoated at 3000 rpm for 60 s and the films were annealed at 130° C. for 10 minutes. Finally, devices were completed with evaporation in a high vacuum of Al contact electrodes through a shadow mask.

Results and Discussion

Perovskite-based thin film photovoltaic devices were recently reported with an architecture evolved from the solid-state dye-sensitized solar cells, where holes are collected through the metal cathode and electrons through the FTO anode (Ball, J. M.; Lee, M. M.; Hey, A.; Snaith, H. Low-Temperature Processed Mesosuperstructured to Thin-Film Perovskite Solar Cells. *Energy & Environmental Science* 2013). In this configuration, a thin film of mesoporous alumina is deposited over compact $TiO_2$ covered FTO substrates to aid the perovskite film formation, then an organic hole transporter is deposited over the formed structure to provide a hole selective contact. However, since holes are collected through the top metal cathode, this configuration has limited applications in tandem solar cells, where immediate improvements could be achieved by using the "wide bandgap" perovskites with a low band gap inorganic bottom cell, (Beiley, Z. M.; McGehee, M. D. Modeling low cost hybrid tandem photovoltaics with the potential for efficiencies exceeding 20%. *Energy & Environmental Science* 2012, 5, 9173-9179) which generally is constructed in a "substrate" configuration with electrons being collected at the top metal contacts.

Figure 9:
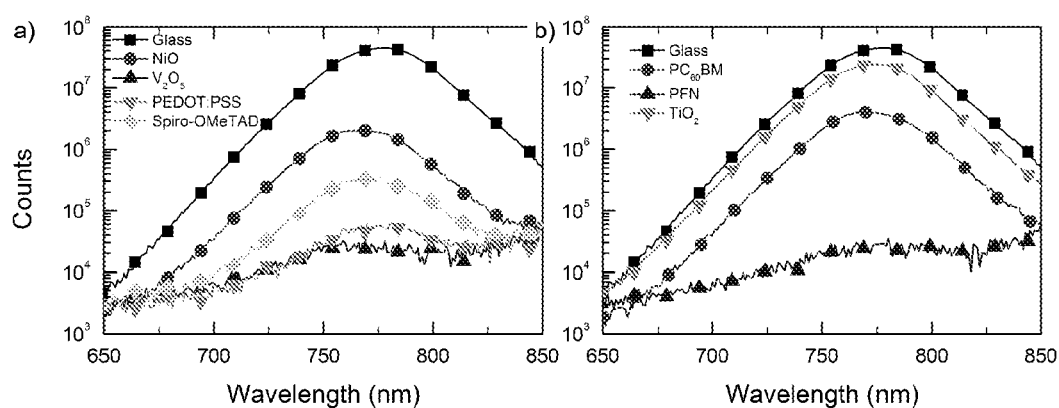
FIG. 9 shows steady state photoluminescence spectra for bi-layers of a perovskite absorber upon a) p-type layers and b) n-type layers. The emission is centred on the photoluminescence peak of the perovskite absorber $CH_3NH_3PbI_{3-x}Cl_x$.

Typical materials used in organic photovoltaics as hole selective contacts for the blends are PEDOT:PSS, $V_2O_5$ and NiO, while usually $PC_{60}BM$ and more recently poly[(9,9-bis(3'-(N,N-dimethylamino)propyl)-2,7-fluorene)-alt-2,7-(9,9-dioctylfluorene)](PFN) are used as electron acceptors. In order to determine whether these materials will work in the complete device, a good first step to check that charge transfer to these interlayers is possible is to measure the steady-state PL quenching efficiency, similarly to what has become routine in all organic solar cells. This data is presented in FIG. 9 and the results are summarized in table 4. It can clearly be seen that all the p-type layers chosen in this work quench the perovskite PL more efficiently than the model spiro-OMeTAD system, with similar values for PEDOT:PSS and $V_2O_5$ of 99.87% quenching efficiency. All the n-type layers exhibit significantly higher quenching rates than the model $TiO_2$ system, which only exhibits a 45% steady-state quenching efficiency. All the cells fabricated in this work utilize a spin-coated $PC_{60}BM$ layer as the n-type contact, since solar cells fabricated with a PFN interlayer yielded an extremely poor photovoltaic performance.

TABLE 4

Steady-state Photoluminescence quenching efficiency
for both p and n-type layers and the perovskite absorber.

| n-type layers | | p-type layers | |
|---|---|---|---|
| NiO | 95.39 | PCBM | 90.99 |
| V2O5 | 99.87 | PFN | 99.86 |
| PEDOT:PSS | 99.86 | TiO2 | 45.71 |
| Spiro-OMeTAD | 99.21 | | |

PEDOT:PSS as the p-Type Contact

Figure 10:
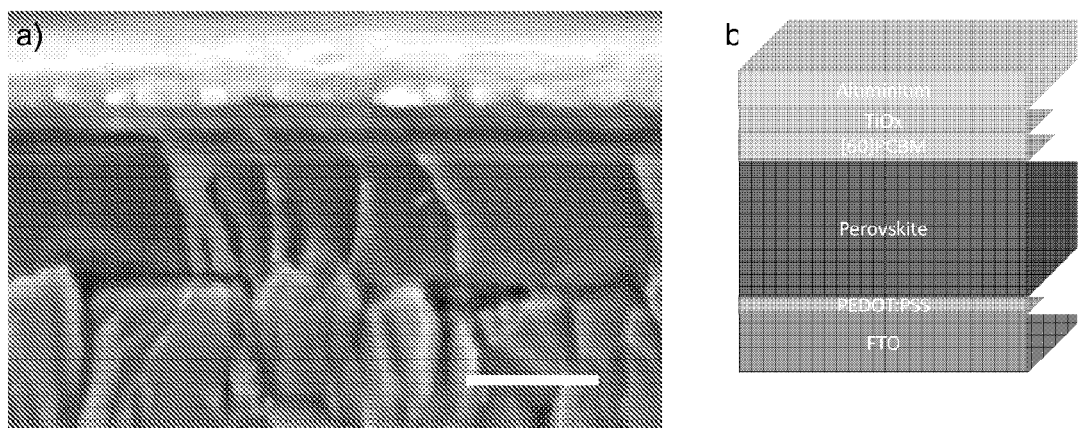
FIG. 10 shows a) SEM cross-sectional image of the optimized inverted device configuration. Scale bar represents 250 nm. The different layers have been coloured with the colour scheme of the device schematic drawing shown in b).
Figure 11:
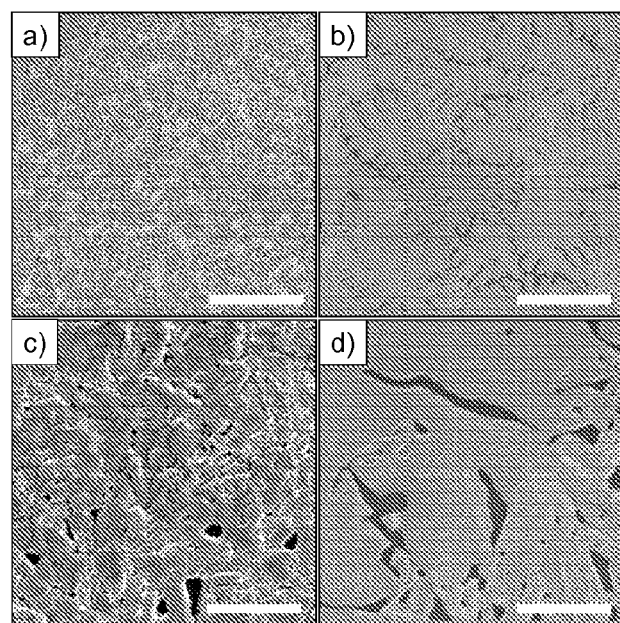
FIG. 11 shows an SEM top view of substrates after the deposition of PEDOT:PSS followed by the perovskite layer for substrates containing a) and c) PEDOT:PSS annealed at 150° C. for 20 min and b) and d) PEDOT:PSS crosslinked with a 0.25M aqueous solution of $FeCl_3$. Scale bars in a) and c) correspond to 25 μm and in b) and d) to 2.5 μm.

The first example of an inverted architecture using the perovskite as both light absorber and charge transporter utilizes a thin PEDOT:PSS layer as the p-type contact and a bi-layer of $PC_{60}BM$ and compact $TiO_x$ as the n-type contact. To be able to process these structures in air, the top interlayer of $TiO_x$ was necessary to achieve a good contact with the top Al anode. A cross-sectional SEM picture of the optimized structure is presented in FIG. 10. Uniform coverage of the perovskite structure is essential to fabricate optimal photovoltaic devices and is heavily affected by the substrate it is formed on. When assembled on annealed PEDOT:PSS underlayers, macrocrystals of over 30 µm length of perovskite are formed, as shown in FIGS. 11*b*) and 11*d*). While this might be beneficial for charge transport through the layer, rather large micron-sized gaps exist between crystals which allow the direct contact between $PC_{60}BM$ and the PEDOT:PSS underlayer, which is not beneficial for device performance. PEDOT:PSS is soluble in DMF and for this reason it has been crosslinked by submersion into a 0.25M $FeCl_3$ aqueous solution, to avoid redissolution of the layer when the perovskite precursor in DMF is deposited. When the PEDOT:PSS is crosslinked, surprisingly the resulting perovskite film coverage increases significantly while the average crystal/feature size for this material has been reduced considerably. The resulting coverage and crystal size is shown in FIGS. 11*a*) and 11*c*), which was found to be 80±1% for annealed PEDOT:PSS films and 97±1% for crosslinked films estimated directly from the SEM images.

Figure 12:
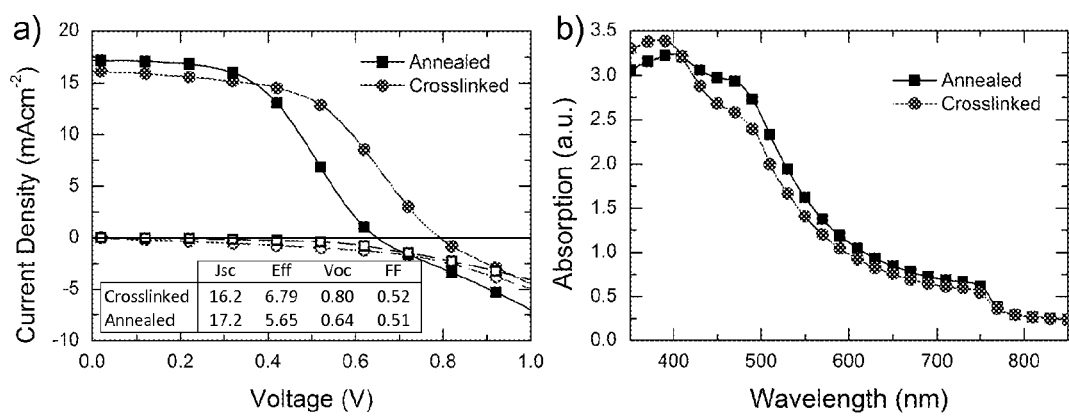
FIG. 12 shows a) JV curves and b) absorption spectrum for typical devices consisting of both crosslinked (circles) and annealed (squares) PEDOT:PSS layers. Inset shows the short circuit current density (Jsc, $mAcm^{-2}$), power conversion efficiency (Eff, %), open circuit voltage (Voc, V) and fill factor (FF) for typical devices of both architectures.

When the performance of the resulting devices is compared, as shown in FIG. 12*a*), it is found that the devices processed on crosslinked PEDOT:PSS exhibit open circuit voltages of around 0.8 V, while devices on annealed PEDOT:PSS only achieved about 0.64 V. This is consistent with a reduction of charge recombination between charges in the PCBM layer and the PEDOT:PSS layer due to the improved perovskite film coverage. Devices employing crosslinked PEDOT:PSS show a slightly reduced short circuit current of 16.2 mAcm$^{-2}$ as compared to the annealed PEDOT:PSS devices which exhibit 17.2 mAcm$^{-2}$, although the difference is small, and within the experimental variation. Finally, the power conversion efficiency of the optimum devices reached values of over 6.7%, severely outperforming annealed PEDOT:PSS devices which reached 5.6%.

$V_2O_5$ and NiO as p-Type Contacts

Figure 13:
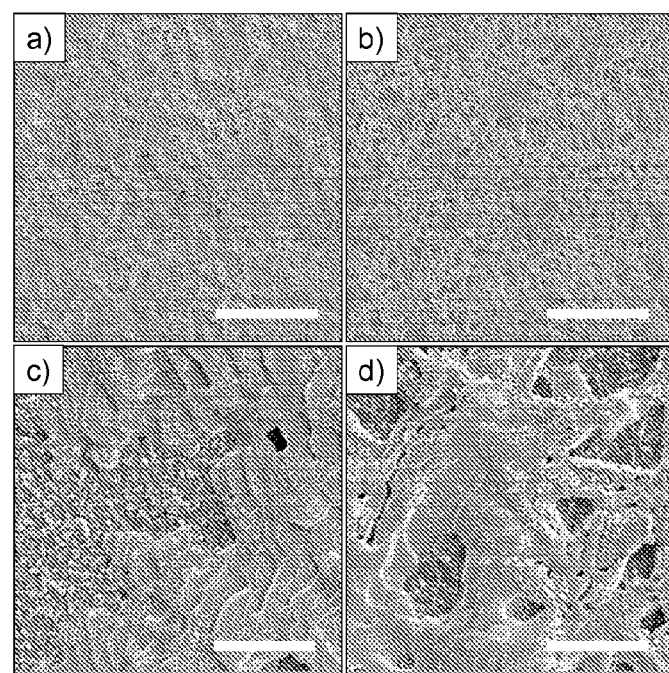
FIG. 13 shows an SEM image of the top view of substrates after the deposition of a) and c) NiO, and b) and d) $V_2O_5$ with the formed perovskite layer on top. Scale bars in a) and b) correspond to 25 μm and in c) and d) to 2.5 μm.

Both $V_2O_5$ and NiO are usual p-type materials currently in use for high efficiency and stable organic photovoltaic devices. Here, the inventors have fabricated the devices by spincoating the appropriate precursor solution on FTO with a subsequent sintering step at 500° C. to ensure a fully crystalline metal oxide layer. Surface coverage of the perovskite solution can be an issue for this materials, as can be seen in the SEM pictures of FIG. 13.

Figure 14:
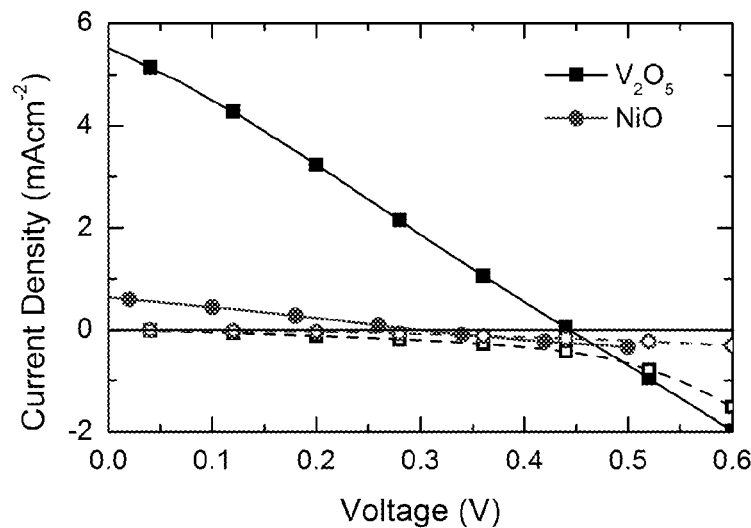
FIG. 14 shows JV curves from devices containing a vanadium oxide (squares) and a NiO (circles) p-type contact.

The photovoltaic performance of devices incorporating these layers is shown in FIG. 14.

Comparison with Regular Architectures

Figure 5:
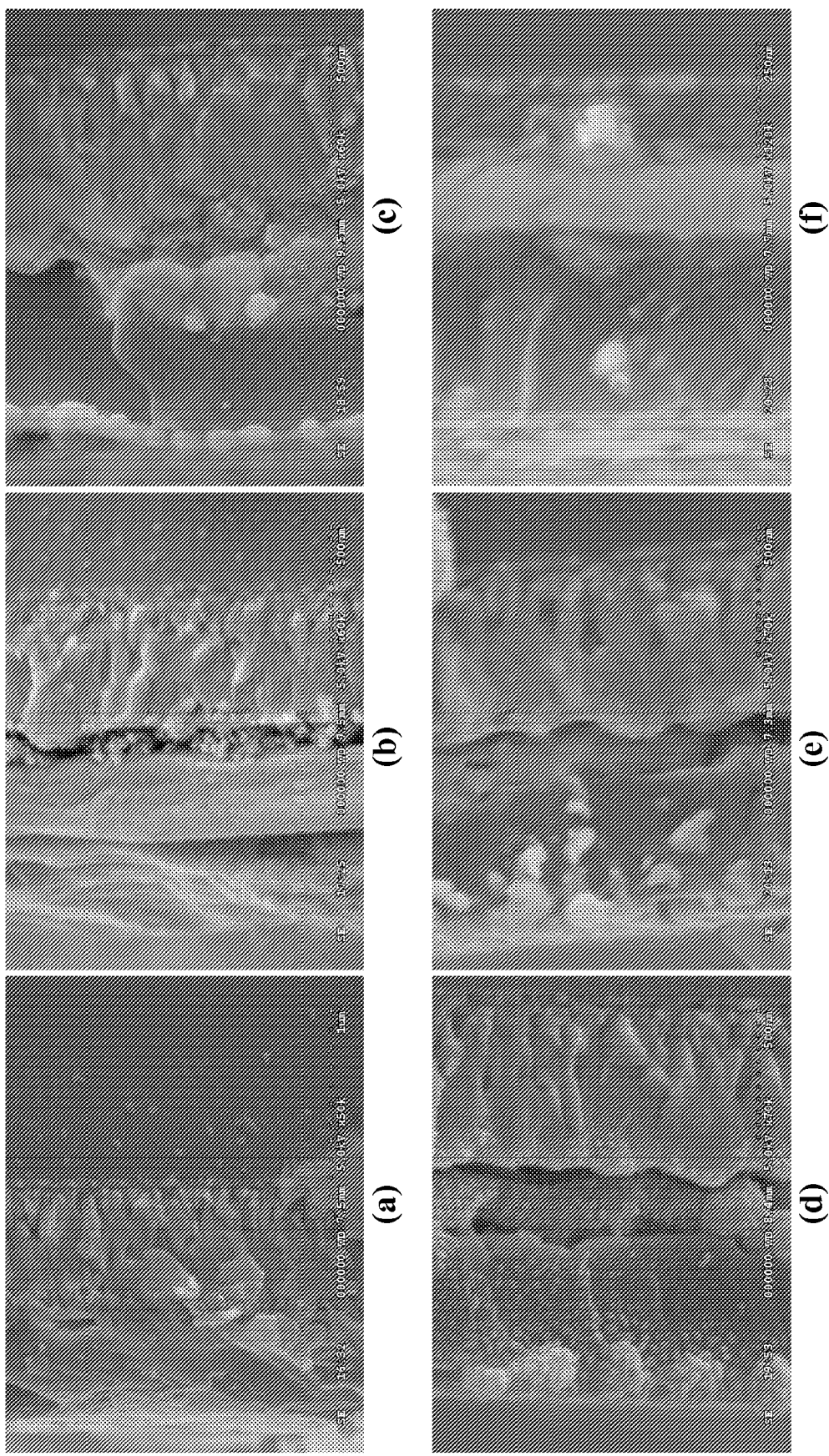
FIG. 5 shows SEM micrographs of solar cell cross-sections with the following variations: (a) HT B—$Al_2O_3$, (b) HT B—$TiO_2$, (c) HT $Al_2O_3$, (d) HT $TiO_2$, (e) HT C, and (f) LT C.
Figure 6:
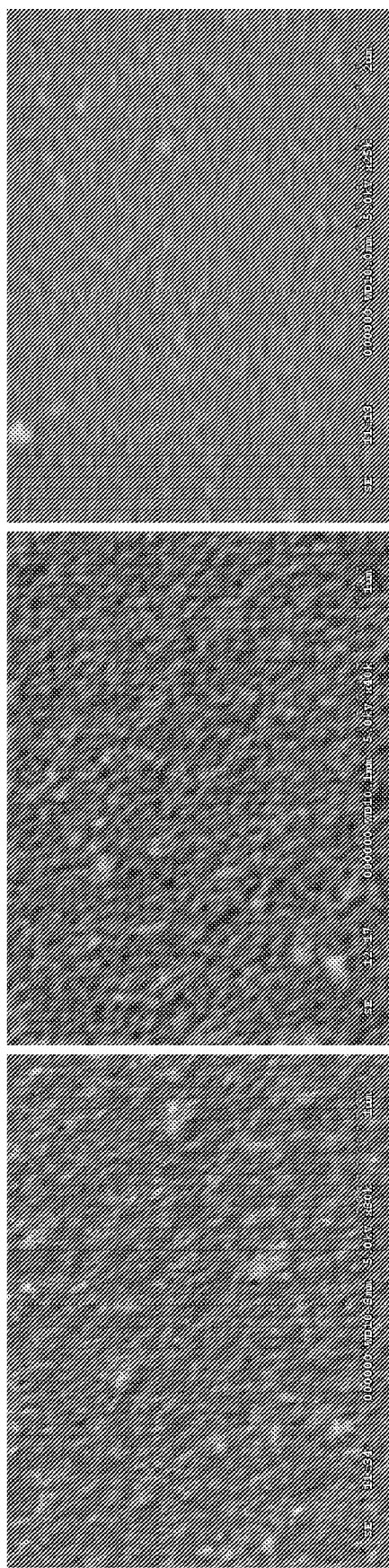
FIG. 6 shows top view planar SEM micrographs of substrate treatments with the following variations: (a) HT B—$Al_2O_3$, (b) HT B—$TiO_2$, (c) HT $Al_2O_3$, (d) HT $TiO_2$, (e) HT C, and (f) LT C.
Figure 6:
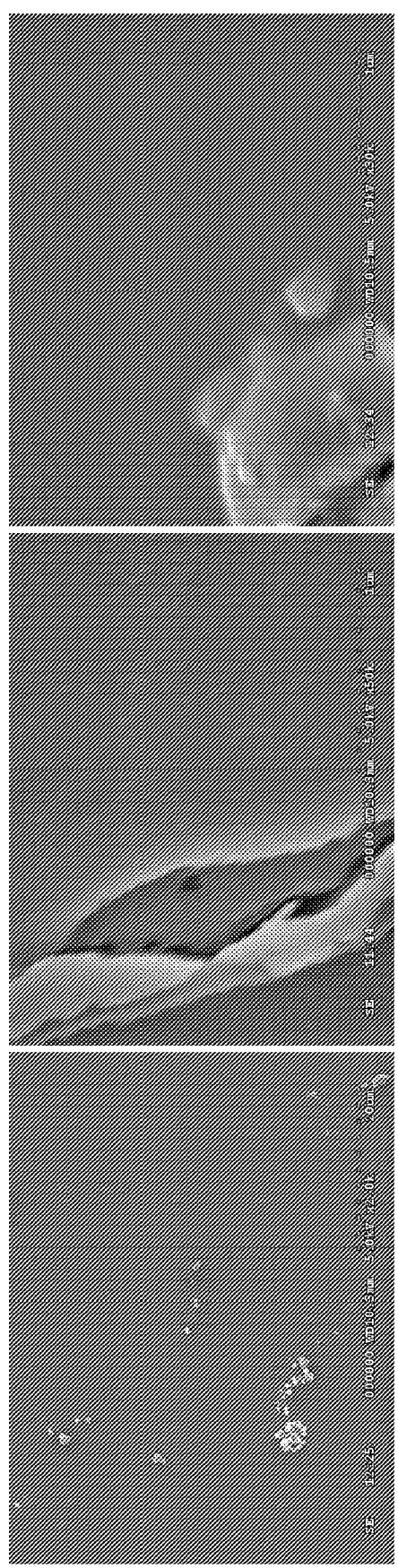
Figure 7:
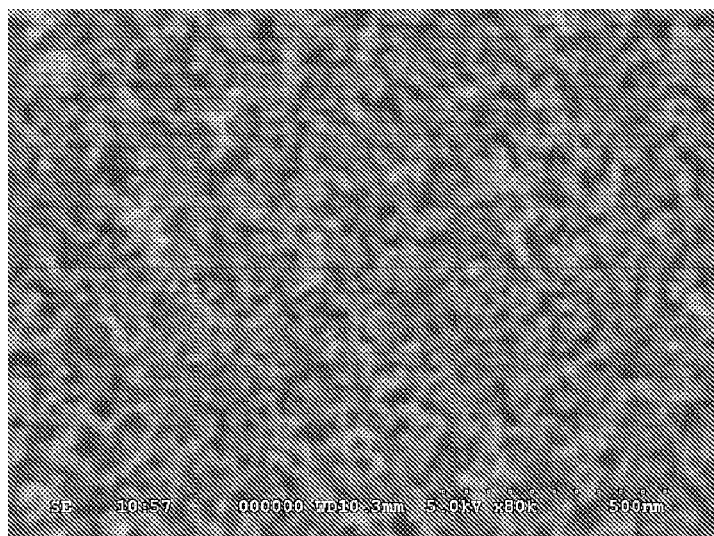
FIG. 7 shows planar SEM micrographs of substrate treatments with the following variations: (a) LT $Al_2O_3$, and (b) LT $TiO_2$.
Figure 7:
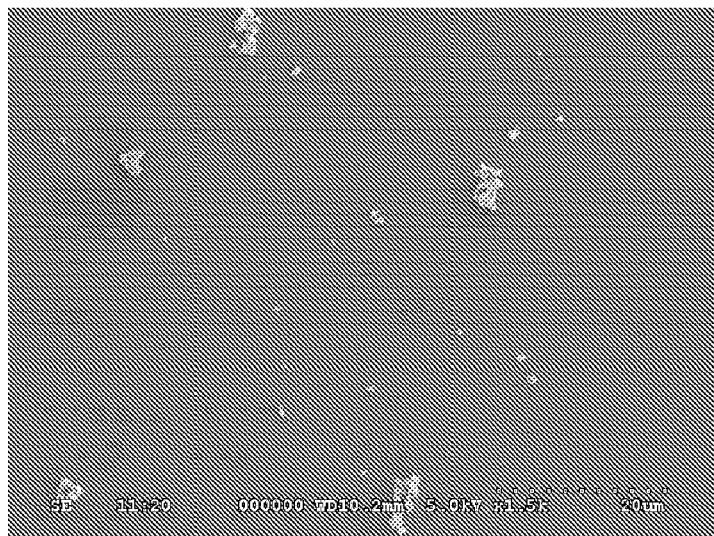
Figure 15:
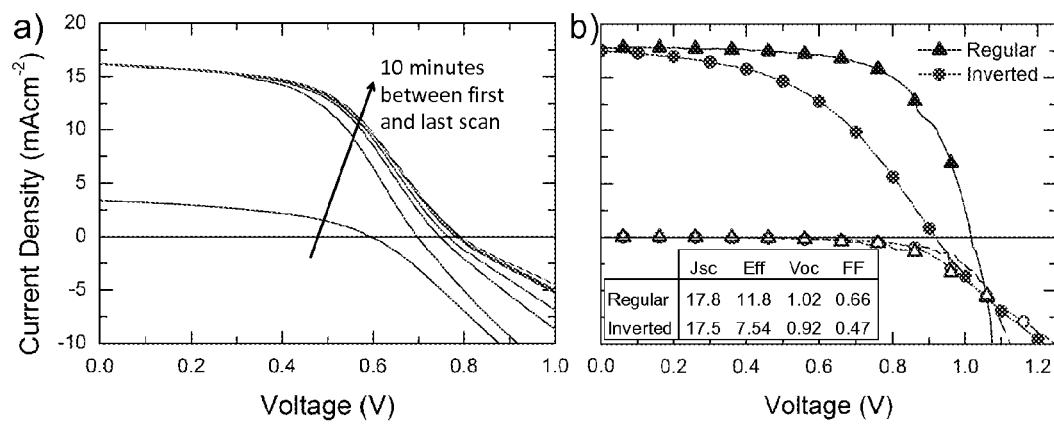
FIG. 15 shows a) temporal evolution of JV curves from the same device with illumination time. The scans are performed every minute with the first scan lowest down and the last one highest up. b) JV curves for champion devices of regular (triangles) and our inverted (circles) configuration. Inset shows the short circuit current density (Jsc, $mAcm^{-2}$), power conversion efficiency (Eff, %), open circuit voltage (Voc, V) and fill factor (FF) for both device architectures.

Finally, the champion inverted device, which is incorporates PEDOT:PSS as the hole accepting layer and $PC_{60}BM$ as the electron extraction layer, is compared against a regular architecture device composed of a $TiO_2$ electron accepting layer and spiro-OMeTAD as the hole transporting layer in FIG. 15*b*). Both systems achieve astounding short circuit currents of over 17.5 mAcm$^{-2}$, and high open circuit voltages of over 0.9 V. The main difference in power conversion efficiency of 11.8% for the regular architecture and 7.54% for the inverted devices, are the lower fill factors of the latter. This is likely due to either leakage issues between PEDOT:PSS and PCBM as shown in FIG. 5.*a*. or series resistance losses, likely due to the necessity of using a $TiO_x$ overlayer to be able to process the devices in ambient air conditions.

The devices presented disclosed offer a completely new approach to design architecture, particularly as the materials used are commonly employed and mass-produced at present for the organic photovoltaics industry and should therefore highly speed up the development of a mass-producible system.

Conclusion

Inverted devices structures, where holes are collected through the FTO, are necessary for tandem applications for use with inorganic photovoltaic bottom cells. Here is shown a low temperature, ambient air and solution-processable photovoltaic cell based on a semiconducting perovskite absorber and selective n-type and p-type contacts in the form of PEDOT:PSS and [60]PCBM. A 7.5% power conversion efficiency is achieved for these inverted structures. In one sense this demonstrates the versatility of the perovskite thin-film technology to the broad variety of possible device configurations, and equally importantly, this removes any barriers to adoption of the perovskite technology by the organic photovoltaic community.

Two Source Vapour Deposition

Substrate Preparation

The substrate preparation process was undertaken in air. Glass coated with fluorine-doped tin oxide (FTO) was patterned by etching with Zn metal powder and 2 M HCl diluted in milliQ water, and then it was cleaned with 2% solution of hellmanex diluted in milliQ water, rinsed with milliQ water, acetone and ethanol and dried with clean dry air. Oxygen plasma was subsequently treated for 10 minutes. A compact layer of $TiO_2$ was spin-coated an acidic solution of titanium isopropoxide in ethanol, and then sintered at 150° C. for 10 mins and then 500° C. for 30 minutes.

Vapour Deposition

Figure 18:
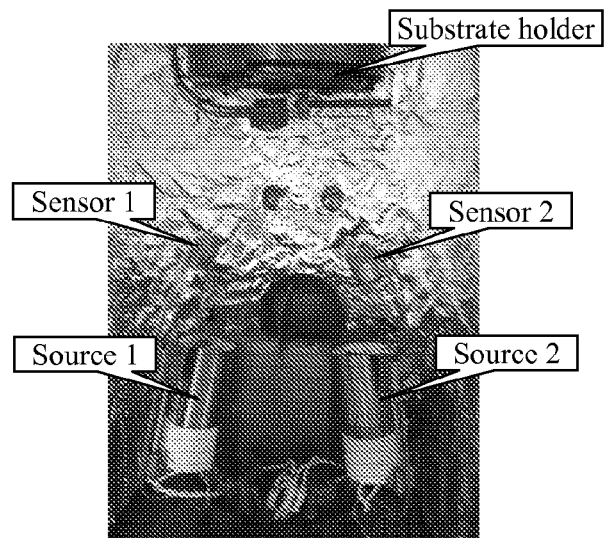
FIG. 18 shows a photograph of an evaporation chamber for dual source vapour deposition of a perovskite.
Figure 19:
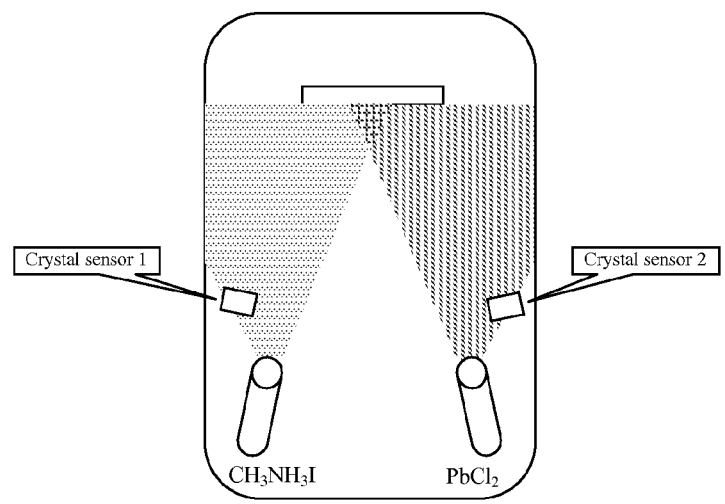
FIG. 19 shows a schematic diagram of a dual source evaporation chamber.

The system used is a dual-source evaporation to better manage the organic source and inorganic source separately. The evaporator was the Kurt J. Lesker Mini Spectros Deposition System with ceramic crucibles (OLED sources), housed in a nitrogen-filled dry glovebox (FIG. 18). Therefore, all the processes were operated in oxygen-free environment. The operation chamber is designed to work under a pressure of 5E-6 mbar where the vapour particles are able to travel directly to the substrate. The samples were held face-down in a holder above crucibles containing the source powders. Two crystal sensors monitor are located just 10 cm above the crucibles to monitor the deposition rate of each source separately without interference from each other. Their measurements are served as a feedback to adjust the heating temperature to the source chemicals. Another crystal sensor is available near to the substrate holder that can be utilised to measure the total deposited thickness.

Tooling Factor Measurement

Since the source-to-monitor distance is different to the source-to-substrate distance, the tooling factor (ratio of the materials deposited on the sensors to that on the samples) of each source was calibrated individually. The density of $CH_3NH_3I$ was assumed as 1 g/cm$^3$ due to its unavailability. The setting and results are shown in Table 5.

TABLE 5

Tooling factor measurement

| | Setup | | | Results | | |
|---|---|---|---|---|---|---|
| Source | Density | Evaporation rate | Evaporation Time | Values on sensors | Real thickness in average | Tooling factor |
| Source 1: $CH_3NH_3I$ | 1 g/cm$^3$ | 16 Å/s | 32 mins | 32 kA | 1.48 um | 2.16 |
| Source 2: $PbCl_2$ | 5.85 g/cm$^3$ | 5 Å/s | 32 mins | 10 kA | 185 nm | 5.41 |

Note that it was hard to evaporate the organic source $CH_3NH_3I$ constantly due to its instability during the evaporating process and its deposition rate had up to +/−20% derivation from the set value. The physical thickness was measured by Veeco DekTak 150 film thickness probe.

Dual Sources Perovskite Deposition

Figure 20:
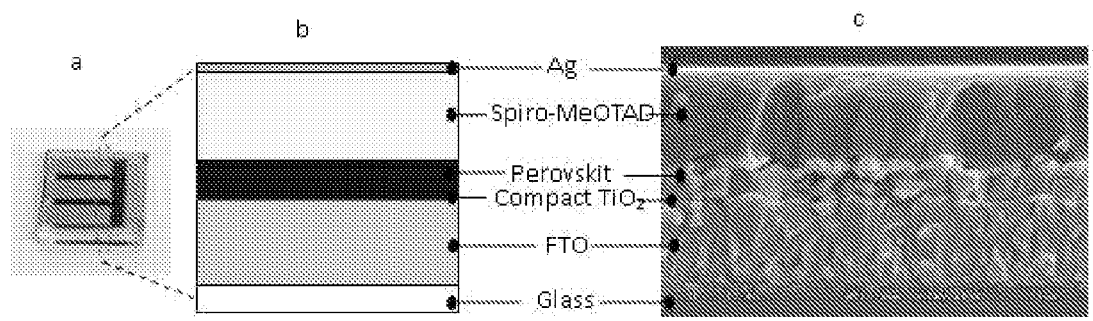
FIG. 20 shows a) completed dual source evaporated perovskite solar cell; b) illustration of the cross-section image; c) cross-section SEM image of the completed device.

The inventors aimed to investigate the 'flat-junction' perovskite solar cells by evaporation in the dual source deposition system. The evaporated perovskite can be deposited on the top of the compact layer of $TiO_2$ directly without mesoporous layer (FIGS. 20b and 20c).

The organic source $CH_3NH_3I$ and inorganic source $PbCl_2$ were weighed approximately at 200 mg and 100 mg, and loaded to the two crucibles respectively. The samples were face-down inserted into the substrate holder. Once the pressure in the chamber was evacuated to 5E-6 mbar, the shutters of the two OLED sources were opened while heating up the sources. Once the two sources achieved the set values, the shutter of the substrate was opened with rotating the holder in order to obtain a uniform thin film.

Figure 21:
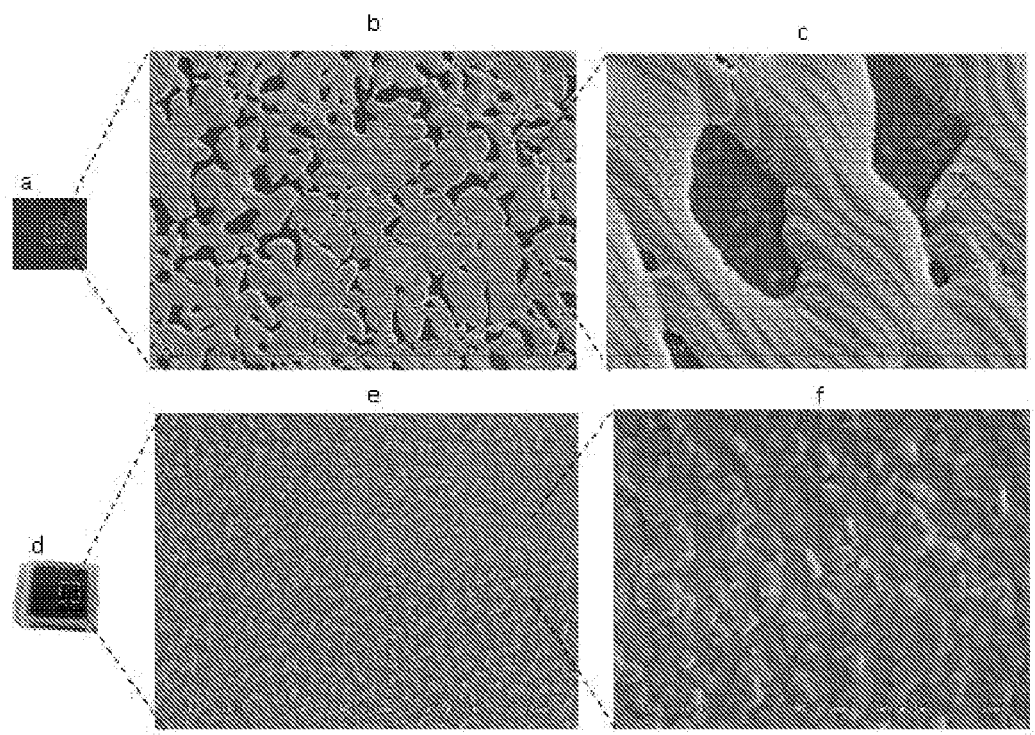
FIG. 21 shows a) sample processed on FTO coated glass with compact $TiO_2$ layer and spin-coated perovskite only; b,c) surface SEM image of the spin-coated perovskite; d) sample with FTO coated glass and compact $TiO_2$ layer and evaporated perovskite only; e,f) surface SEM image of the evaporated perovskite.

After completing the evaporation, the colour of the samples was changed corresponding to the composition of the two sources. All the samples were then placed at hotplate to dry up at 100° C. for 50 mins to crystallise perovskite crystal prior to spin-coat the hole-transporter layer. FIG. 21 shows the surface image after annealing the perovskite crystal on the hotplate. In the experiment so far, 7% spiro-OMeTAD in chlorobenzene solution with added tert-butylpyridine (tBP) and lithium bis(trifluoromethanesulfonyl)imide (Li-TFSI) was used as the hole-transporter and was spin-coated at 2000 rpm for 45 s. At the end, devices were completed with evaporation of Ag contact electrodes (FIG. 20a).

Comparing the evaporated perovskite with the conventional spin-coated perovskite, the evaporated perovskite had more uniform and flat surface with less holes (FIG. 21). The full coverage of the evaporated perovskite not only fully contacts with the compact layer of $TiO_2$, but also isolates the hole-transport layer from the compact layer. It will certainly help the photocurrent as well as the voltage throughout the system.

Device Characterisation

The experiment started with varying composition of $CH_3NH_3I$ to $PbCl_2$ from 4:1 to 16:1 in molar ratio under a constant total thickness. Once the composition had been optimised, the desired thickness under best composition was investigated.

The best performance has been achieved to 13% electrical power efficiency with setting the deposition rate to 5.3 Å/s for $CH_3NH_3I$ and 1 Å/s for $PbCl_2$ that ideally should have given 9.3:1 in molar ratio if the tooling factor is taken into consideration. However, as aforementioned, since the evaporation of the organic source $CH_3NH_3I$ always has deviation, the final thickness shown on the Sensor 1 for $CH_3NH_3I$ was 44.4 kA instead of the expected 42.4 kA. In other words, the real average deposition rate for $CH_3NH_3I$ should be 5.6 Å/s rather than the setting value 5.3 Å/s. In this case, the film was actually deposited under the molar ratio of $CH_3NH_3I$ to $PbCl_2$ 9.8:1 which gave a physical thickness of 230 nm measured by DekTak probe.

Figure 22:
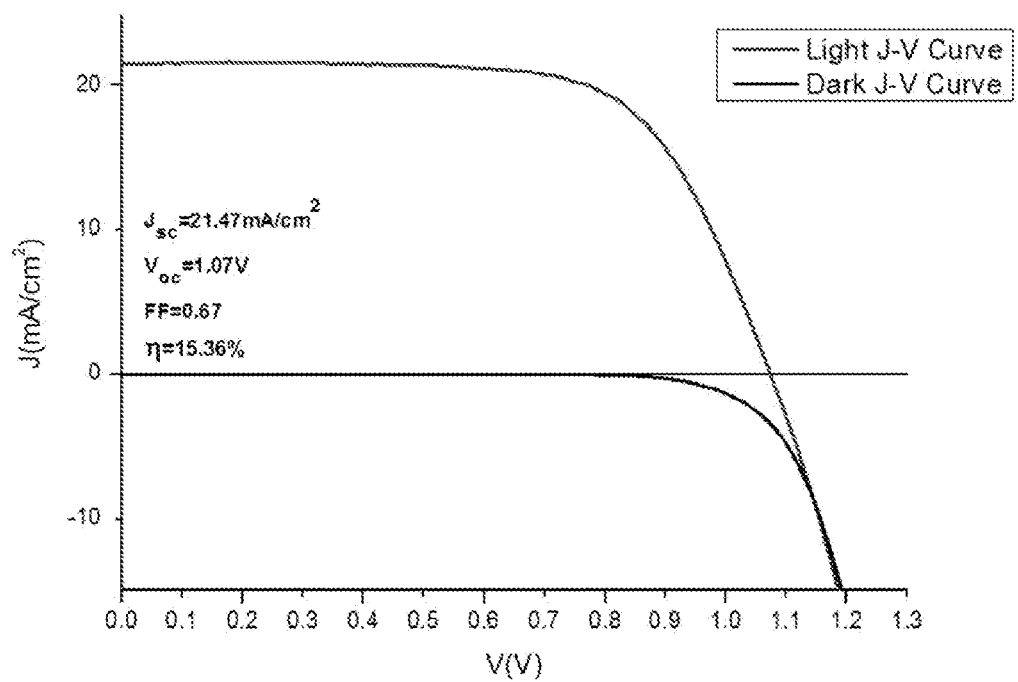
FIG. 22 shows J-V curve measured under simulated AM1.5 Sun light of 100 mWcm$^{-2}$ of the best dual source evaporated perovskite solar cell. The inset gives the solar cell performance parameters derived from this J-V curve.

The best performance gave a short circuit photocurrent $J_{sc}$ of 21.47 mA/cm$^2$, open circuit voltage $V_{oc}$ of 1.07 Volts and a fill factor (FF) of 0.67 yielding the power electrical conversion efficiency up to 15.36% as shown in FIG. 22. Current-Voltage characteristics were measured (2400 Series SourceMeter, Keithley Instruments) under simulated AM 1.5 G sunlight at 100 mW cm$^{-2}$ irradiance and the solar cells were masked with a metal aperture to define the active area which was typically 0.076 cm$^2$ and measured in a light-tight sample holder to minimise any edge effects.

Figure 23:
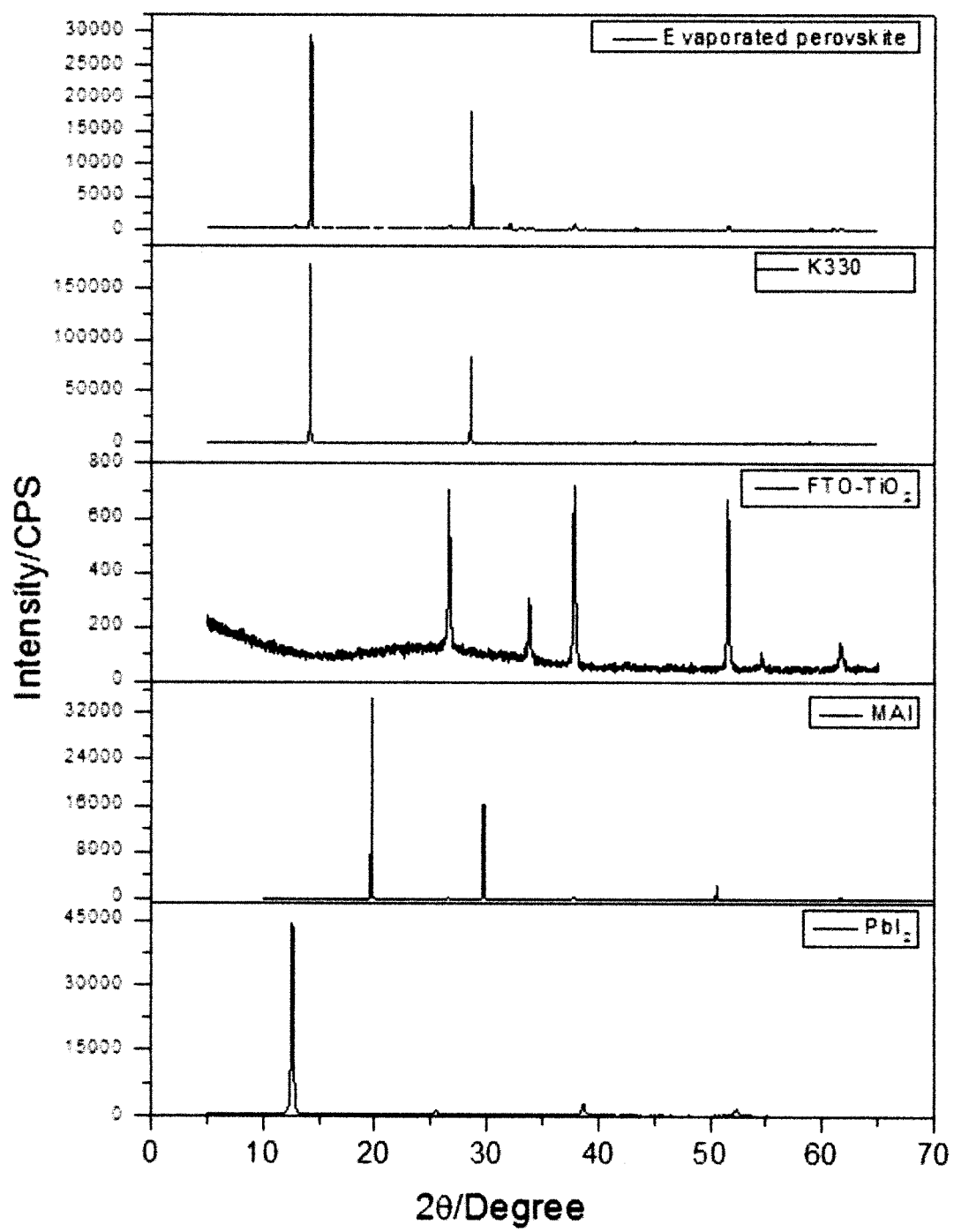
FIG. 23 shows XRD measurement of the evaporated perovskite comparing with the spin-coated perovskite (termed K330), methylammonium iodide (MAI) lead iodide ($PbI_2$) and $TiO_2$ coated FTO glass.

In order to define the contents in the evaporated film, XRD pattern of the evaporated perovskite surface was measured and then compared with the conventional XRD pattern of the spin-coated perovskite and other essential chemicals as shown in FIG. 23. According to XRD patterns, it clearly shows that the evaporated perovskite is almost identical to the solution processed perovskite film processed from $CH_3NH_3I$ and $PbCl_2$ precursors in DMF (termed K330) which indicates that the evaporated perovskite has the same crystal structure as the spin-coated perovskite.

Figure 24:
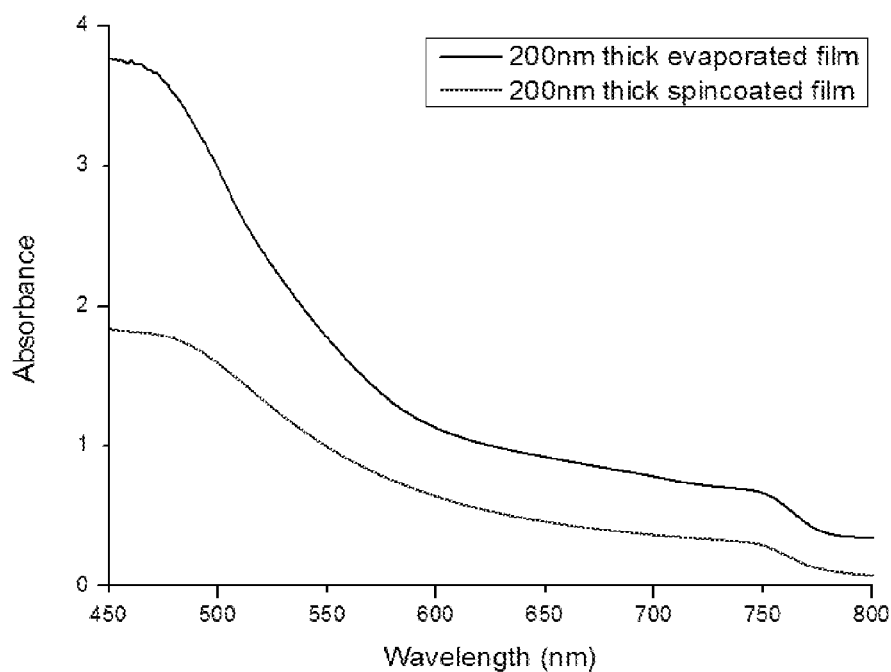
FIG. 24 shows a comparison of the absorbance for 200 nm thick films of evaporated and spin-coated perovskite.
Figure 25:
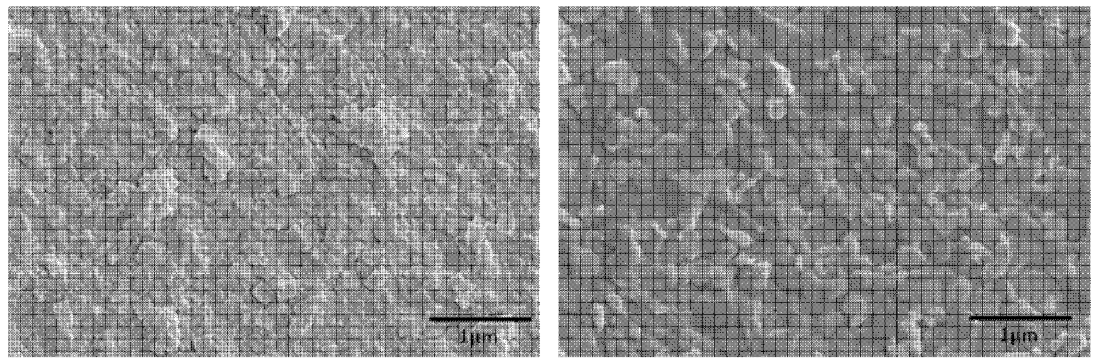
FIG. 25 shows a comparison between unannealed and annealed layers of perovskite deposited by two source vapour deposition: left: unannealed evaporated perovskite surface (as evaporated); right: annealed evaporated perovskite surface (after annealing at 100 degrees Celsius for 45 minutes in a nitrogen glove box).
Figure 26:
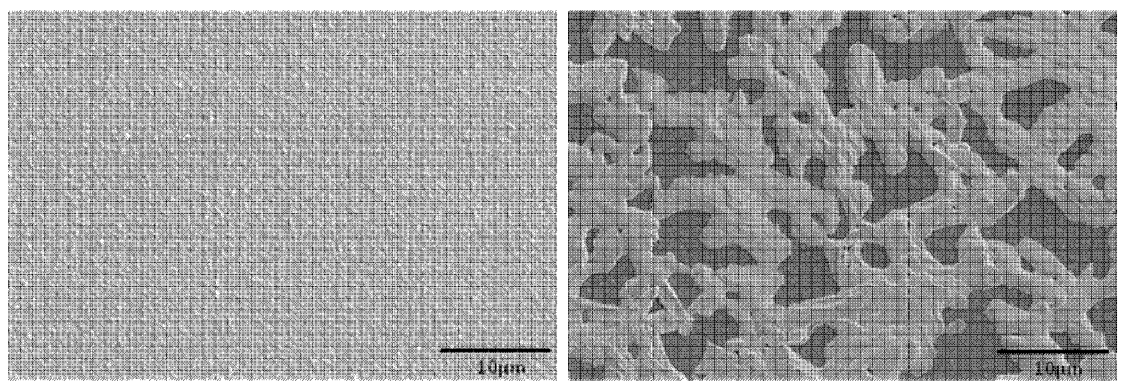
FIG. 26 shows a comparison of surface coverage by two source vapour deposition and by solution deposition: left: evaporated and annealed perovskite films; right: spin-coated and annealed perovskite film coated upon glass/FTO/compact $TiO_2$.
Figure 27:
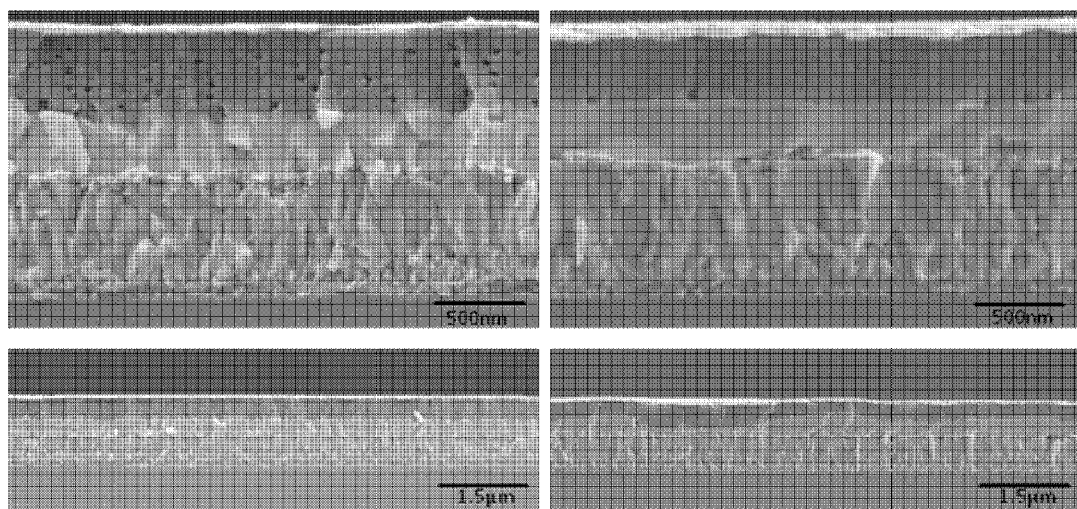
FIG. 27 shows a comparison between SEM cross-sections: left: two source evaporated flat junction device; right: spin-coated flat junction device.
Figure 28:
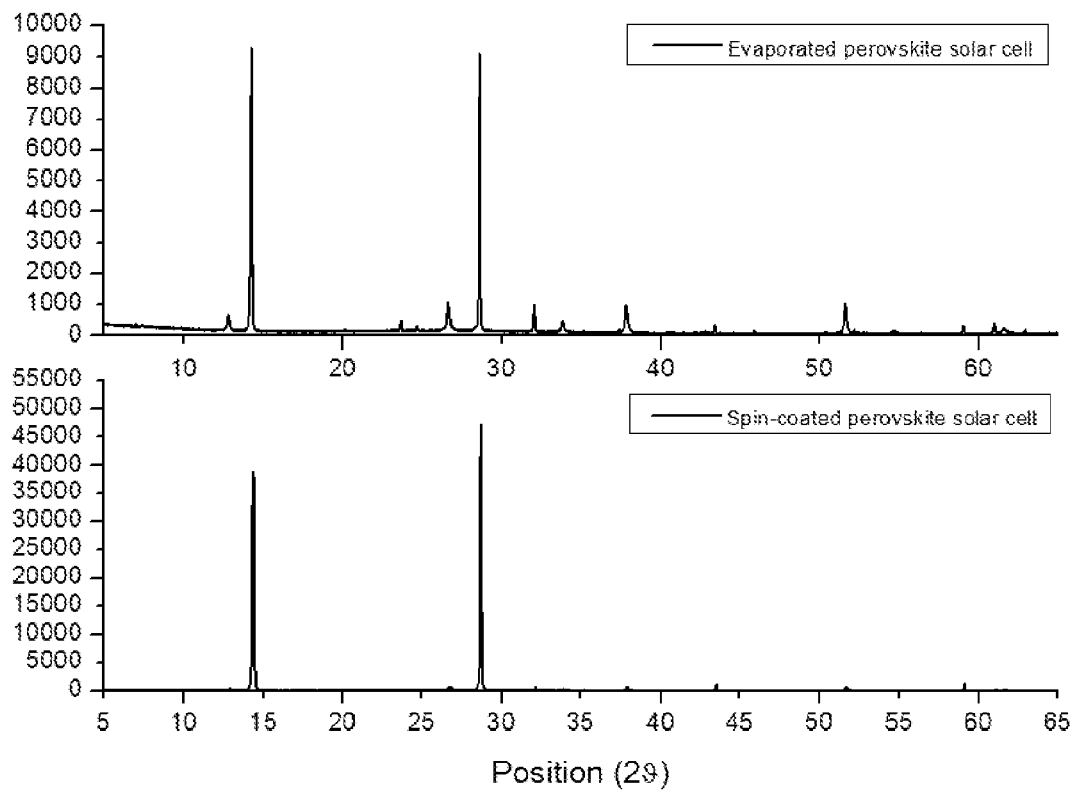
FIG. 28 shows an XRD comparison between a perovskite layer formed by two source vapour deposition and a perovskite layer formed by spin-coating a perovskite precursor solution. For both films the starting precursors were MAI and $PbCl_2$.

The last measurement in FIG. 24 was a comparison of the absorbance between 200 nm evaporated film and spin-coated film. The absorbance of the two 200 nm 'flat-junction' evaporated perovskite has the similar shape of the absorbance as the 200 nm 'flat-junction' spin-coated perovskite, but the evaporated perovskite has much larger units in absorption.

Conclusion

Here, evaporated hybrid inorganic-organic perovskite on flat-junction solar cells with over 15% electric power conversion efficiency are demonstrated by appropriately controlling the deposition rate of the $CH_3NH_3I$ and $PbCl_2$ and the deposited thickness on the substrate. The realisation of utilising the evaporation technique to produce perovskite solar cells overcomes the limits of solution process of finding a suitable solution to dissolve the chemicals and thus also helps the commercialisation of the hybrid inorganic-organic solar cells.

In general, it is considered to be advantageous to retain a 3D crystal structure in the perovskite, as opposed to creating layered perovskites which will inevitably have larger exciton binding energies (Journal of Luminescence 60&61 (1994) 269 274). It is also advantageous to be able to tune the band gap of the perovskite. The band gap can be changed by either changing the metal cations or halides, which directly influence both the electronic orbitals and the crystal structure. Alternatively, by changing the organic cation (for example from a methylammonium cation to a formamidinium cation), the crystal structure can be altered. However, in order to fit within the perovskite crystal, the following geometric condition must be met:

$$(R_A+R_X)=t\sqrt{2}(R_B+R_X)$$

wherein $R_{A,B,\&X}$ are the ionic radii of ABX ions. The inventor have unexpectedly found that formamidinium cation (FO) does indeed form the perovskite structure in a 3D crystal structure in a $FOPbBr_3$ (tetragonal crystal) or $FOPbI_3$ (cubic crystal) perovskite, and mixed halide perovskites thereof.

Two Step Perovskite Layer Production

Substrate Preparation

An electrode pattern was etched onto glass substrates coated with fluorine doped tin oxide (FTO, TEC 7 Pilkington Glass) using a mixture of Zn powder and 2M HCl. They were then sequentially cleaned in Hallmanex, de-ionised water, acetone, propan-2-ol, and 02 plasma.

Electron-Selective Layer Deposition

A thin (approximately 50 nm) layer of $TiO_2$ served as the electron-selective layer. It was deposited onto the substrate by spin coating (speed=2000 rpm, acceleration=2000 rpm/s, time=60 s) from a filtered solution (0.45 m PTFE filter) containing Ti-isopropoxide in ethanol with added HCl. These films were heated to 500° C. for 30 minutes.

Evaporation of $PbI_2$ and $PbCl_2$

Thin-films (approximately 150 nm) of $PbI_2$ or $PbCl_2$ were deposited by thermal evaporation through a shadow mask onto the substrates at a pressure of approximately $10^{-6}$ mbar at a rate of approximately 2/s. The evaporation temperatures were approximately 270° C. and 310° C. for $PbI_2$ and $PbCl_2$ respectively.

Dip Coating Perovskite Conversion

For dip coating, substrates precoated in $PbI_2$ or $PbCl_2$ were immersed into a 20 mg/ml solution of methylammonium iodide in anhydrous propan-2-ol in a nitrogen filled glovebox. The dipping time was constant for all devices at 10 minutes. After dip coating, the substrates were annealed at 120° C. in a nitrogen atmosphere for 10 minutes. Dipping times may range from 10 seconds to 2 hours, For the example given in this patent, the dipping time was 10 minutes.

Hole-Transport Material Deposition

The hole-transport material, 2,2',7,7'-tetrakis-(N,N-di-pmethoxyphenylamine)9,9'-spirobifluorene (spiro-OMeTAD), was deposited by spin coating (speed=2000 rpm, acceleration=2000 rpm/s, time=60 s) from an 80 mM chlorobenzene solution containing 80 mol % tert-butylpyridine (tBP) and 30 mol % lithium bis(trifluoromethanesulfonyl)imide (Li-TFSI) as additives in a nitrogen filled glovebox.

Top Electrode Deposition

The top silver electrode was deposited by thermal evaporation (pressure approximately 5 Torr) to a thickness of 150 nm at approximately 2/s.

Device Current-Voltage Characterisation

Figure 32:
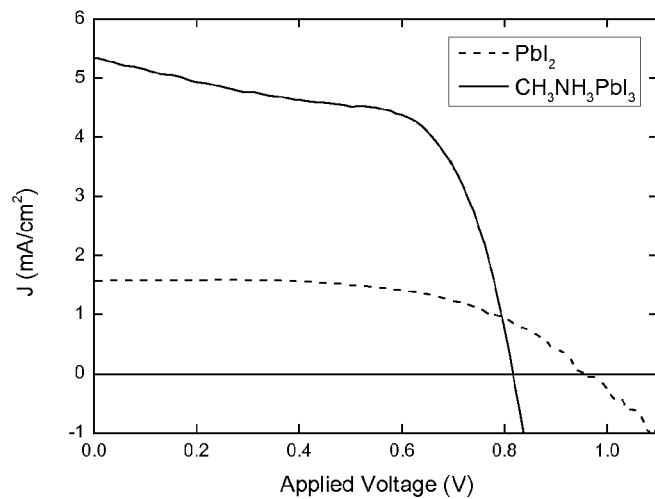
FIG. 32 shows current density-voltage characteristics of a device made using $PbI_2$ as the active layer (dashed line) and a device where the evaporated $PbI_2$ has been converted to $CH_3NH_3PbI_3$ (solid line) by dip coating in a methylammonium iodide solution in propan-2-ol. The performance parameters for the $PbI_2$ are $J_{sc}$=1.6 mA/cm$^2$, PCE=0.80%, $V_{oc}$=0.97 V, FF=0.57. The performance parameters for the $CH_3NH_3PbI_3$ are $J_{sc}$=5.3 mA/cm$^2$, PCE=2.4%, $V_{oc}$=0.82 V, FF=0.61.

For measuring the performance of the solar cells, simulated AM 1.5 sunlight was generated with a class AAB ABET solar simulator calibrated to give simulated AM 1.5, of 106.5 $mW/cm^2$ equivalent irradiance, using an NREL-calibrated KG5 filtered silicon reference cell. The mismatch factor was calculated to be 1.065 between 300 to 900 nm, which is beyond the operating range of both the KG5 filtered silicon reference cell and the perovskite test cells. The current-voltage curves were recorded with a sourcemeter (Keithley 2400, USA). The solar cells were masked with a metal aperture defining the active area (0.0625 $cm^2$) of the solar cells. The current density-voltage characteristics of the devices are shown in FIG. 32 (for $PbI_2$ as the photoactive layer (dashed line) and $CH_3NH_3PbI_3$ after dip coating as the photoactive layer (solid line)) and FIG. 33 (for $PbCl_2$ as the photoactive layer (dashed line) and $CH_3NH_3PbI_{3-x}Cl_x$ after dip coating as the photoactive layer (solid line)).

X-Ray Diffraction

Figure 31:
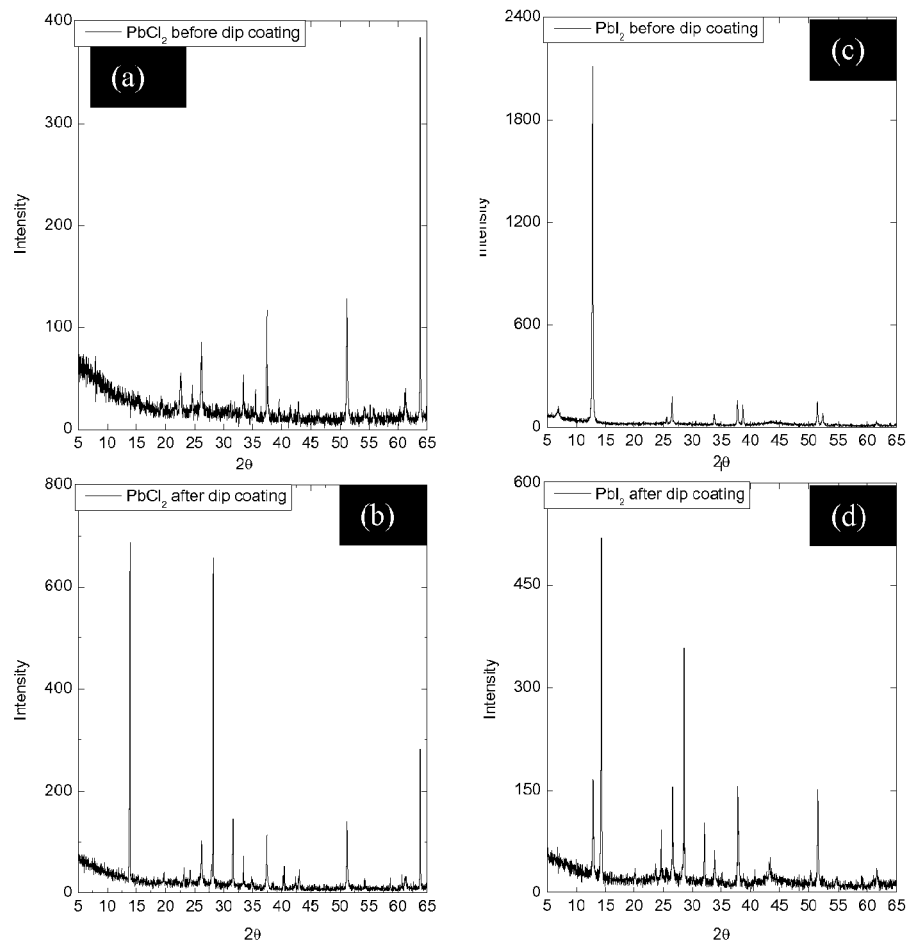
FIG. 31 shows x-ray diffraction spectra of thin-films of (a) $PbCl_2$, (b) $CH_3NH_3PbI_{3-x}Cl_x$, (c) $PbI_2$ and (d) $CH_3NH_3PbI_3$. After dip coating, films from both precursors show a relative intensity decrease of peaks corresponding to the precursor lattice and a relative increase of the perovskite lattice (absent in precursor XRD spectra) indicating predominant conversion of the precursor films into perovskite.

X-ray diffraction (XRD) spectra were obtained from devices without silver electrodes (FTO coated glass, TiO2, photoactive layer, spiro-OMeTAD) using a Panalytical X'Pert Pro x-ray diffractometer. The results are shown in FIG. 31.

Scanning Electron Microscopy

Scanning electron microscopy (SEM) images were obtained from devices without silver electrodes (FTO coated glass, $TiO_2$, photoactive layer, spiro-OMeTAD) using a Hitachi S-4300. Electron micrographs are shown in FIG. 29 (for (a) $PbCl_2$ and (b) $CH_3NH_3PbI_{3-x}Cl_x$ after dip coating) and FIG. 30 (for (a) $PbI_2$ and (b) $CH_3NH_3PbI_3$ after dip coating).

Results and Discussion

The two step method allows for the production of uniform films of perovskite using economical techniques which are already readily available in the glazing industry. After an initial deposition of a metal dihalide, uniform planar films of perovskite may be produced by infiltration of the metal dihalide with the organic halide. FIG. 31 shows X-ray diffraction spectra of thin-films of (a) $PbCl_2$, (b) $CH_3NH_3PbI_{3-x}Cl_x$, (c) $PbI_2$, and (d) $CH_3NH_3PbI_3$. After dip coating, films from both precursors show a relative intensity decrease of peaks corresponding to the precursor lattice and a relative increase of the perovskite lattice (absent in precursor xrd spectra) indicating predominant conversion of the precursor films into perovskite.

Figure 29:
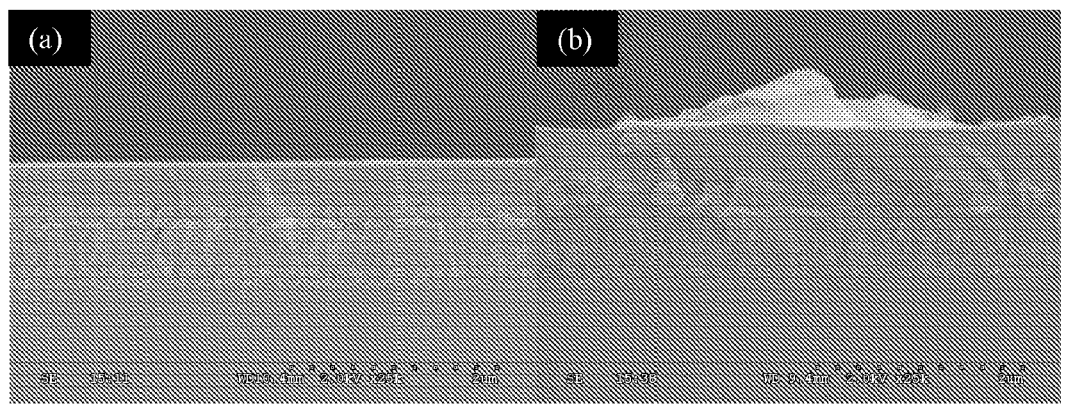
FIG. 29 shows cross-section scanning electron micrographs of devices showing (from bottom to top) the glass substrate, FTO, $TiO_2$ electron-selective layer, photoactive layer, spiro-OMeTAD. The photoactive layers are (a) $PbCl_2$ and (b) $CH_3NH_3PbI_{3-x}Cl_x$ after dip coating a $PbCl_2$ film in a propan-2-ol solution of $CH_3NH_3I$.
Figure 30:
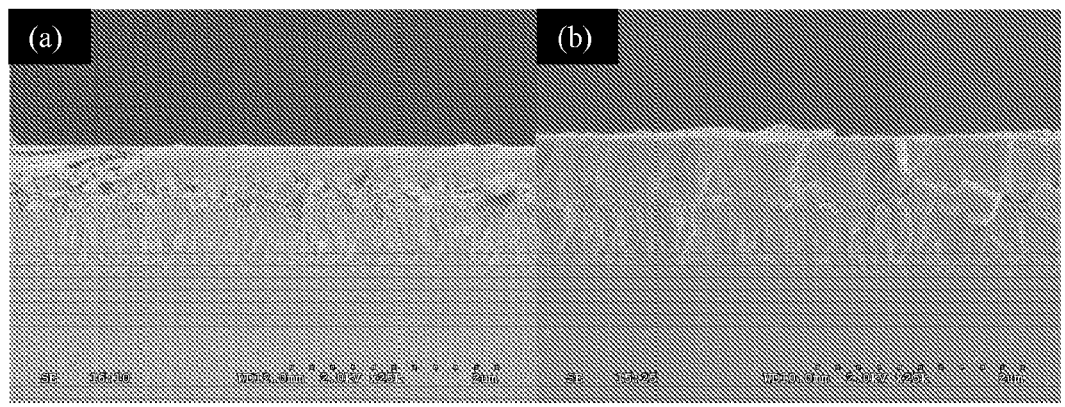
FIG. 30 shows cross-section scanning electron micrographs of devices showing, from bottom to top, the glass substrate, FTO, $TiO_2$ electron-selective layer, photoactive layer, spiro-OMeTAD. The photoactive layers are (a) $PbI_2$ and (b) $CH_3NH_3PbI_3$ after dip coating a $PbI_2$ film in a propan-2-ol solution of $CH_3NH_3I$.

FIG. 29 shows cross-section scanning electron micrographs of devices showing, from bottom to top, the glass substrate, FTO, TiO$_2$ electron-selective layer, photoactive layer, spiro-OMeTAD. The photoactive layers are (a) PbCl$_2$, and (b) CH$_3$NH$_3$PbI$_{3-x}$Cl$_x$ after dip coating. FIG. 30 shows cross-section scanning electron micrographs of devices showing, from bottom to top, the glass substrate, FTO, TiO$_2$ electron-selective layer, photoactive layer, spiro-OMeTAD. The photoactive layers are (a) PbI$_2$, and (b) CH$_3$NH$_3$PbI$_3$ after dip coating. In both instances, the perovskites produced by dip coating show relative uniformity.

Figure 33:
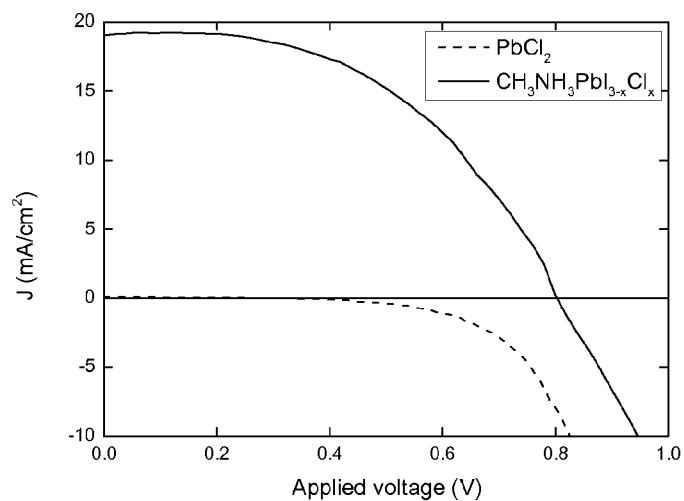
FIG. 33 shows current density-voltage characteristics of a device made using $PbCl_2$ as the active layer (dashed line) and a device where the evaporated $PbCl_2$ has been converted to $CH_3NH_3PbI_{3-x}Cl_x$ (solid line) by dip coating in a methylammonium iodide solution in propan-2-ol. The performance parameters for the $PbCl_2$ are $J_{sc}$=0.081 mA/cm$^2$, PCE=0.006%, $V_{oc}$=0.29 V, FF=0.27. The performance parameters for the $CH_3NH_3PbI_{3-x}Cl_x$ are $J_{sc}$=19.0 mA/cm$^2$, PCE=7.0%, $V_{oc}$=0.80 V, FF=0.49.

The Current density-voltage characteristics of the devices are shown in FIGS. 32 and 33. In FIG. 32, characteristics are shown for a device made using PbI$_2$ as the active layer (dashed line) and a device where the evaporated PbI$_2$ has been converted to CH$_3$NH$_3$PbI$_3$ (solid line) by dip coating in a methylammonium iodide solution in propan-2-ol. The performance parameters for the PbI$_2$ are J$_{sc}$=1.6 mA/cm$^2$, PCE=0.80%, V$_{oc}$=0.97 V, FF=0.57. The performance parameters for the CH$_3$NH$_3$PbI$_3$ are J$_{sc}$=5.3 mA/cm$^2$, PCE=2.4%, V$_{oc}$=0.82 V, FF=0.61. In FIG. 33 current density-voltage characteristics of a device made using PbCl$_2$ as the active layer (dashed line) and a device where the evaporated PbCl$_2$ has been converted to CH$_3$NH$_3$PbI$_{3-x}$Cl$_x$ (solid line) by dip coating in a methylammonium iodide solution in propan-2-ol are shown. The performance parameters for the PbCl$_2$ are J$_{sc}$=0.081 mA/cm$^2$, PCE=0.006%, V$_{oc}$=0.29 V, FF=0.27. The performance parameters for the CH$_3$NH$_3$PbI$_{3-x}$Cl$_x$ are J$_{sc}$=19.0 mA/cm$^2$, PCE=7.0%, V$_{oc}$=0.8 V, FF=0.49. In both cases, it is shown that viable devices are produced by this two step method.

Charge Carrier Diffusion Length Estimation

For a charge (either electron or hole) to be generated from light absorption and collected efficiently from a thin solid film, the lifetime of the charge species (the time it will live for before recombining with an oppositely charged species) must be longer than the time it takes to diffuse across the film and flow into the electrode. The product of the diffusion coefficient (D$_e$) and the lifetime ($\tau_e$) can be used to estimate the diffusion length (L$_D$) following L$_D$=$\sqrt{D\tau}$.

Figure 36:
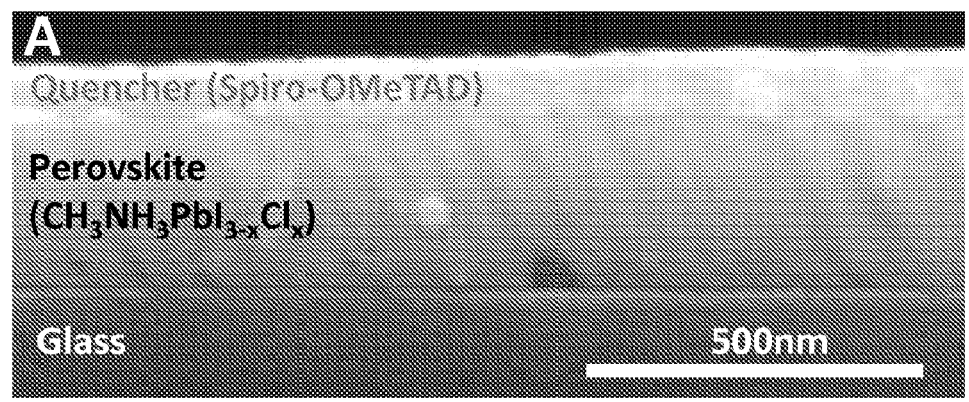
FIG. 36 shows a cross-sectional SEM image of a 270-nm thick mixed halide absorber layer with a top hole-quenching layer of Spiro-OMeTAD.

Photoluminescence (PL) quenching has been previously employed successfully with organic semiconductors, in order to determine the diffusion length of the photoexcited bound electron-hole pair (the exciton). By simply fabricating solid thin films in the presence or absence of an exciton quenching layer, and modelling the photoluminescence decay to a diffusion equation, it is possible to accurately determine the exciton lifetime, diffusion rate and diffusion length. A cross-sectional SEM image of a 270-nm thick mixed halide absorber layer with a top hole-quenching layer of Spiro-OMeTAD is shown in FIG. 36.

Figure 34:
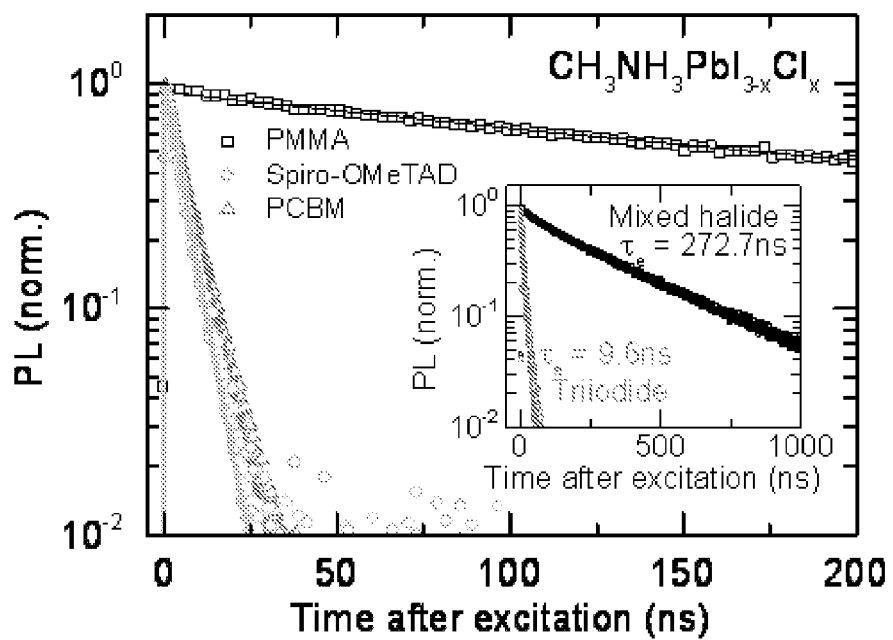
FIG. 34 shows photoluminescence measurements and fits to a diffusion model for a mixed halide organolead trihalide perovskite film $CH_3NH_3PbI_{3-x}Cl_x$ and a triiodide perovskite film $CH_3NH_3PbI_3$, in the presence of p- or n-type quenchers. Time-resolved PL measurements taken at the peak emission wavelength of the mixed halide perovskite with an electron (PCBM; triangles) or hole (Spiro-OMeTAD; circles) quencher layer, along with stretched exponential fits to the films coated with insulating PMMA data (black squares) and fits to the quenching samples using the diffusion model described in the text. A pulsed (0.3 to 10 MHz) excitation source at 507 nm with a fluence of 30 nJ/cm$^2$ impinged on the glass substrate side. Inset in FIG. 34: Comparison of the PL decay of the two perovskites (with PMMA coating) on a longer time scale, with lifetimes re quoted as the time taken to reach 1/e of the initial intensity.
Figure 35:
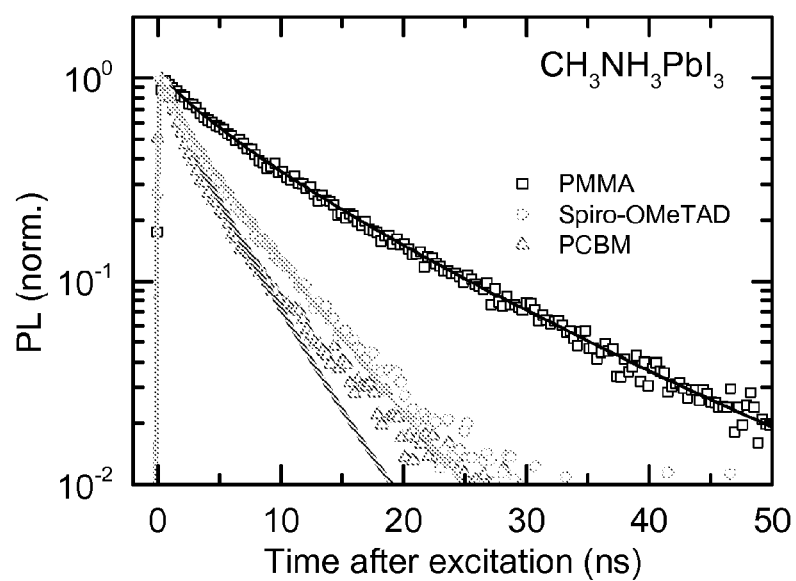
FIG. 35 shows photoluminescence measurements and fits to a diffusion model for an organolead triiodide perovskite film $CH_3NH_3PbI$, in the presence of p- or n-type quenchers. Time-resolved PL measurements taken at the peak emission wavelength of the mixed halide perovskite with an electron (PCBM; triangles) or hole (Spiro-OMeTAD; circles) quencher layer, along with stretched exponential fits to the films coated with insulating PMMA data (black squares) and fits to the quenching samples using the diffusion model described in the text. A pulsed (0.3 to 10 MHz) excitation source at 507 nm with a fluence of 30 nJ/cm$^2$ impinged on the glass substrate side.

The PL decay dynamics were modelled by calculating the number and distribution of excitations in the film n(x,t) according to the 1-D diffusion equation (eq. 1), $$\frac{\partial n(x, t)}{\partial t} = D\frac{\partial^2 n(x, t)}{\partial x^2} - k(t)n(x, t), \quad (1)$$

where D is the diffusion coefficient and k(t) is the PL decay rate in the absence of any quencher material. The total decay rate k was determined by fitting a stretched exponential decay to the PL data measured from perovskite layers coated with PMMA. The effect of the quencher-layer was included by assuming that all photogenerated carriers which reach the interface are quenched, giving the boundary condition n(L, t)=0, where x=0 at the glass/perovskite interface and L is the perovskite film thickness. As the samples were photo-excited from the glass substrate side of the samples, the initial distribution of photoexcitations was given by n(x,0)=n$_0$ exp(−αx), where α is the absorption coefficient. The diffusion length L$_D$ of the species was then determined from L$_D$=$\sqrt{D\tau}$, where τ=1/k is the recombination lifetime in the absence of a quencher. If free charges are predominantly created upon photoexcitation, the PL decay represents the depopulation of charge carriers and the diffusion coefficients for holes or electrons can be estimated depending on which quenching layer is employed. The results from the diffusion model fits are shown in FIG. 34 and FIG. 35. and the parameters summarized in Table 6 (D is the diffusion constant and L$_D$ the diffusion length).

TABLE 6

| Perovskite | Species | D (cm$^2$s$^{-1}$) | L$_D$ (nm) |
|---|---|---|---|
| CH$_3$NH$_3$PbI$_{3-x}$Cl$_x$ | Electrons | 0.042 ± 0.016 | 1094 ± 210 |
|  | Holes | 0.054 ± 0.022 | 1242 ± 250 |
| CH$_3$NH$_3$PbI$_3$ | Electrons | 0.017 ± 0.011 | 117 ± 38 |
|  | Holes | 0.011 ± 0.007 | 96 ± 29 |

Figure 37:
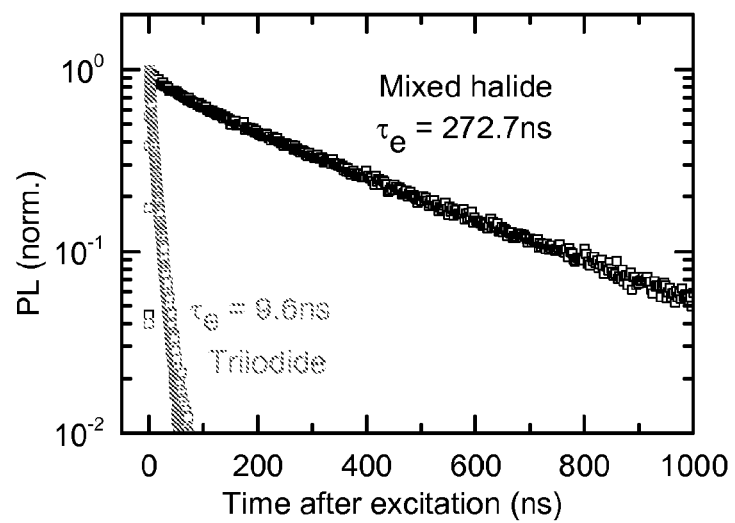
FIG. 37 shows photoluminescence decay for a mixed halide organolead trihalide perovskite film $CH_3NH_3PbI_{3-x}Cl_x$ (Black squares) and a organolead triiodide perovskite film $CH_3NH_3PbI_3$ (grey squares), coated with PMMA. lifetimes e quoted as the time taken to reach 1/e of the initial intensity.

Triiodide (CH$_3$NH$_3$PbI$_3$) and mixed halide (CH$_3$NH$_3$PbI$_{3-x}$Cl$_x$) perovskites are compared in FIG. 37 which shows photoluminescence decay for a mixed halide organolead trihalide perovskite film CH$_3$NH$_3$PbI$_{3-x}$Cl$_x$ (Black squares) and an organolead triiodide perovskite film CH$_3$NH$_3$PbI$_3$ (grey squares), coated with PMMA. Lifetimes $\tau_e$ quoted as the time taken to reach 1/e of the initial intensity.

Strikingly, the diffusion lengths for both electrons and holes in the mixed halide perovskite are greater than 1 μm, which is significantly longer than the absorption depth of 100 to 200 nm. This indicates that there should be no requirement for meso or nanostructure with this specific perovskite absorber. The triiodide perovskite CH$_3$NH$_3$PbI$_3$ films have shorter diffusion length of around 100 nm for both electrons and holes. The large diffusion lengths of the mixed halide perovskite allows photovoltaic devices with layers of perovskite with thicknesses in excess of 100 nm to be constructed which show excellent device characteristics.

Methods

Perovskite Precursor Preparation:

Methylamine iodide (MAI) was prepared by reacting methylamine, 33 wt % in ethanol (Sigma-Aldrich), with hydroiodic acid (HI) 57 wt % in water (Sigma-Aldrich), at room temperature. HI was added dropwise while stirring. Upon drying at 100° C., a white powder was formed, which was dried overnight in a vacuum oven and recrystallized from ethanol before use. To form the CH$_3$NH$_3$PbI$_{3-x}$Cl$_x$ or CH$_3$NH$_3$PbI$_3$ precursor solution, methylammonium iodide and either lead (II) chloride (Sigma-Aldrich) or lead (II) iodide (Sigma-Aldrich) were dissolved in anhydrous N,N-Dimethylformamide (DMF) at a 3:1 molar ratio of MAI to PbCl$_2$/PbI$_2$, with final concentrations 0.88M lead chloride/iodide and 2.64M methylammonium iodide.

Substrate Preparation:

Glass substrates for absorption, TA and PL measurements were cleaned sequentially in 2% hallmanex detergent, acetone, propan-2-ol and oxygen plasma. Devices were fabricated on fluorine-doped tin oxide (FTO) coated glass (Pilkington, 7Ω□$^{-1}$). Initially FTO was removed from regions under the anode contact, to prevent shunting upon contact with measurement pins, by etching the FTO with 2M HCl and zinc powder. Substrates were then cleaned and plasma-etched as above. A hole-blocking layer of compact $TiO_2$ was deposited by spin-coating a mildly acidic solution of titanium isopropoxide in ethanol, and annealed at 500° C. for 30 minutes. Spin-coating was carried out at 2000 rpm for 60 seconds.

Perovskite Deposition:

To form the perovskite layer for spectroscopy measurements, the non-stoichiometric precursor was spin-coated on the substrate at 2000 rpm in air. For $CH_3NH_3PbI_{3-x}Cl_x$, the precursor was used as is; for the $CH_3NH_3PbI_3$, the precursor was diluted in DMF at a 1:1 ratio of precursor solution to DMF. After spin-coating, the $CH_3NH_3PbI_{3-x}Cl_x$ films were annealed at 100° C. for 45 minutes, and the $CH_3NH_3PbI_3$ at 150° C. for 15 minutes. The top quenchers were then deposited in air via spin-coating chlorobenzene solutions with the following conditions: poly(methylmethacrylate) (PMMA; Sigma-Aldrich) at 10 mg/ml and phenyl-$C_{61}$-butyric acid methyl ester (PCBM; Solenne BV) at 30 mg/ml, both spin-coated at 1000 rpm, and 2,2',7,7'-tetrakis-(N,N-di-p-methoxyphenylamine)9,9'-spirobifluorene (spiro-OMeTAD; Borun Chemicals) at 0.46 M spin-coated at 2000 rpm.

Characterization:

A field emission scanning electron microscope (Hitachi S-4300) was used to acquire SEM images. Sample thicknesses were measured using a Veeco Dektak 150 surface profilometer.

Photoluminescence Measurements and Fits:

Steady-state and time-resolved PL measurements were acquired using a time-correlated single photon counting (TCSPC) setup (FluoTime 300, PicoQuant GmbH). Film samples were photoexcited using a 507 nm laser head (LDH-P-C-510, PicoQuant GmbH) pulsed at frequencies between 0.3-10 MHz, with a pulse duration of 117 ps and fluence of ~30 nJ/cm$^2$. The PL was collected using a high resolution monochromator and hybrid photomultiplier detector assembly (PMA Hybrid 40, PicoQuant GmbH).

Parameters describing the photoluminescence dynamics in the absence of any quencher are required inputs in the diffusion model. These were obtained by fitting the background-corrected PL measured from PMMA-capped perovskite films with a stretched exponential decay function of the form, $$I(t) = I_0 e^{-(t/\tau_s)^\beta}$$

Errors in the fitting parameters were determined by examining the reduced $\chi^2$ surfaces obtained by independently varying each fitting parameter. A cut-off value of $\chi_R^2(p)/\chi_R^2 = 1.2$ was used in each case to obtain limits at a confidence level of 68%. For ease of comparison of lifetimes between samples with different quenchers, $\tau_e$ is defined as the time taken after excitation for the PL intensity to drop to 1/e of its peak intensity. The error in the accuracy of this lifetime was taken to be the half of the range of points whose mean value lies within one standard deviation of the 1/e line. Results of photoluminescence dynamics are shown in FIGS. 34, 35 and 37.

Diffusion Modeling:

The PL decay dynamics was modeled by calculating the number and distribution of excitations in the film n(x,t) according to the 1-D diffusion equation, $$\frac{\partial n(x,t)}{\partial t} = D\frac{\partial^2 n(x,t)}{\partial x^2} - k(t)n(x,t)$$

where D is the diffusion coefficient and k(t) is the PL decay rate in the absence of any quencher material. The total decay rate, $k = 1/k_f + 1/k_{nr} = \beta\tau^{-\beta}t^{\beta-1}$, was determined by fitting a stretched exponential decay to the PL data measured from perovskite layers with PMMA and assumed independent of the capping material. The effect of the quenching layer was included by assuming that all excitons which reach the interface are quenched with unit efficiency (n(L,t)$_0$, where x=0 at the glass/perovskite interface and L is the perovskite film thickness). As the excitation pulse was from the glass substrate side of the samples, the initial distribution of excitons was taken to be n(x,0)=n$_0$ exp(−αx), where α=A/L (absorbance at 507 nm/perovskite layer thickness). Any deviation from this distribution due to reflection of the laser pulse at the perovskite/quencher interface was assumed to be negligible. In order to calculate the diffusion length $L_D$, the diffusion coefficient was varied to minimize the reduced chi-squared value, $$\chi_r^2 = \frac{1}{(n-p-1)}\sum\frac{(y(t)-y_c(t))^2}{y(t)}$$

where y(t) and y$_c$(t) are the measured and calculated PL intensities at time t, n is the number of data points and p is the number of fitting parameters. The equation was solved numerically using the Crank-Nicholson algorithm and the number of excitons integrated across the entire film in order to determine the total PL intensity at time t. Both the stretched exponential and 1-D diffusion models were fit to the experimental TCSPC data by iterative reconvolution with the instrument response function (IRF) which was recorded separately, such that the observed PL intensity, $$I(t) = \int g(t)f(t-t')dt'$$

is the result of the real decay curve, ƒ(t), convolved with the RF, g(t). The average diffusion length $L_D$ is given by $L_D = \sqrt{D\tau_e}$, where $\tau_e$ is the time taken for the PL to fall to 1/e of its initial intensity in the absence of any quencher.

The invention claimed is:

1. A photovoltaic device comprising a compact layer consisting of a photoactive perovskite semiconductor without open porosity wherein the perovskite comprises a halide anion, wherein the photoactive perovskite semiconductor has a three-dimensional crystal structure, wherein the thickness of the compact layer consisting of the photoactive perovskite semiconductor without open porosity is from 10 nm to 100 μm, and wherein the photovoltaic device does not comprise a perovskite semiconductor supported on a porous material.

2. A photovoltaic device according to claim 1, wherein the compact layer consisting of the photoactive perovskite semiconductor without open porosity is disposed between an n-type region and a p-type region and forms a planar heterojunction with one or both of the n-type region and the p-type region.

3. A photovoltaic device according to claim 1, wherein the device comprises:
   an n-type region comprising at least one n-type layer; and
   a p-type region comprising at least one p-type layer;
   wherein the compact layer consisting of the photoactive perovskite semiconductor without open porosity is disposed between the n-type region and the p-type region and forms a planar heterojunction with one or both of the n-type region and the p-type region.

4. A photovoltaic device according to claim 1, wherein the photoactive perovskite semiconductor is capable of absorbing light and thereby generating free charge carriers.

5. A photovoltaic device according to claim 1, wherein the photoactive perovskite semiconductor is a photosensitizing material and is capable of performing both photogeneration and charge transportation.

6. A photovoltaic device according to claim 2 wherein the n-type region comprises any of:
an n-type layer; and
an n-type layer and an n-type exciton blocking layer.

7. A photovoltaic device according to claim 2 wherein the p-type region comprises any of:
a p-type layer; and
a p-type layer and a p-type exciton blocking layer.

8. A photovoltaic device according to claim 1, wherein the perovskite is a mixed-anion perovskite comprising two or more different halide anions.

9. A photovoltaic device according to claim 1, wherein the photoactive perovskite semiconductor is a perovskite compound of formula (I):

$$[A][B][X]_3 \quad (I)$$

wherein:
[A] is at least one organic cation;
[B] is at least one metal cation; and
[X] is at least one halide anion.

10. A photovoltaic device according to claim 9, wherein [X] is two or more different halide anions.

11. A photovoltaic device according to claim 1 which is a tandem junction or multi junction photovoltaic device, wherein the device comprises a first electrode, a second electrode, and, disposed between the first and second electrodes:
a photoactive region comprising said compact layer consisting of the photoactive perovskite semiconductor without open porosity; and
at least one other photoactive region.

12. A photovoltaic device according to claim 2, wherein the p-type region comprises a p-type layer that comprises a perovskite.

13. A photovoltaic device according to claim 2, wherein the n-type region comprises an n-type layer that comprises a perovskite.

14. A multi junction photovoltaic device, comprising:
a first electrode;
a second electrode; and
disposed between the first and second electrodes:
a photoactive region comprising a compact layer consisting of a photoactive perovskite semiconductor without open porosity wherein the perovskite comprises a halide anion, wherein the photoactive perovskite semiconductor has a three-dimensional crystal structure, and wherein the thickness of the compact layer consisting of the photoactive perovskite semiconductor without open porosity is from 10 nm to 100 µm; and
at least one other photoactive region,
wherein the photovoltaic device does not comprise a perovskite semiconductor supported on a porous material.

15. A multi junction photovoltaic device according to claim 14, wherein the at least one other photoactive region comprises at least one layer of a semiconductor material.

16. A multi junction photovoltaic device according to claim 15, wherein the semiconductor material comprises a layer of crystalline silicon, copper zinc tin sulphide, copper zinc tin selenide, copper zinc tin selenide sulphide, copper indium gallium selenide, copper indium gallium diselenide or copper indium selenide.

17. A multi junction photovoltaic device according to claim 15, wherein the semiconductor material comprises a layer of crystalline silicon.

18. A multi junction photovoltaic device according to claim 17, wherein the at least one other photoactive region comprises a heterojunction between said layer of crystalline silicon and a layer of an intrinsic semiconductor.

19. A multi junction photovoltaic device according to claim 15 wherein the semiconductor material comprises a perovskite semiconductor.

20. A multi junction photovoltaic device according to claim 14 wherein the at least one other photoactive region comprises a compact layer consisting of a photoactive perovskite semiconductor without open porosity.

21. A multi junction photovoltaic device according to claim 14 which comprises:
said first electrode;
said second electrode; and
disposed between the first and second electrodes:
a plurality of photoactive regions, each of which comprises a compact layer consisting of a photoactive perovskite semiconductor without open porosity wherein the perovskite comprises a halide anion, wherein the photoactive perovskite semiconductor has a three-dimensional crystal structure, and wherein the thickness of the compact layer consisting of the photoactive perovskite semiconductor without open porosity is from 10 nm to 100 µm.

22. A multi junction photovoltaic device according to claim 20 wherein each photoactive region comprises:
an n-type region comprising at least one n-type layer;
a p-type region comprising at least one p-type layer; and,
disposed between the n-type region and the p-type region:
a compact layer consisting of a photoactive perovskite semiconductor without open porosity which forms a planar heterojunction with one or both of the n-type region and the p-type region, wherein the perovskite comprises a halide anion, wherein the photoactive perovskite semiconductor has a three-dimensional crystal structure, and wherein the thickness of the compact layer consisting of the photoactive perovskite semiconductor without open porosity is from 10 nm to 100 µm.

23. A multi junction photovoltaic device according to claim 15 wherein the semiconductor material comprises an organic semiconductor.

24. A photovoltaic device comprising an n-type region, a p-type region and, disposed between the n-type region and the p-type region:
(i) a first layer which comprises a porous material and photoactive perovskite semiconductor disposed in pores of the porous material; and
(ii) a capping layer disposed on said first layer, which capping layer is a compact layer consisting of a photoactive perovskite semiconductor without open porosity, wherein the thickness of the compact layer consisting of the photoactive perovskite semiconductor without open porosity is from 10 nm to 100 µm;
wherein the photoactive perovskite semiconductor in the capping layer is in contact with the perovskite semiconductor in the first layer,
wherein the photoactive perovskite semiconductor in the first layer contacts the p-type region, and the photoactive perovskite semiconductor in the capping layer contacts the n-type region, and wherein the compact layer consisting of the photoactive perovskite semiconductor without open porosity forms a planar heterojunction with the n-type region.

25. A photovoltaic device according to claim 24, wherein the porous material is mesoporous.

26. A photovoltaic device according to claim 24, wherein the porous material is any of:

a charge-transporting material; and a dielectric material having a band gap of equal to or greater than 4.0 eV.

* * * * *